(12) United States Patent
Gorohmaru et al.

(10) Patent No.: US 11,316,112 B2
(45) Date of Patent: Apr. 26, 2022

(54) ELECTRON-ACCEPTING COMPOUND AND COMPOSITION FOR CHARGE-TRANSPORTING FILM, AND LUMINESCENT ELEMENT USING SAME

(71) Applicant: Mitsubishi Chemical Corporation, Chiyoda-ku (JP)

(72) Inventors: Hideki Gorohmaru, Kanagawa (JP); Kazuki Okabe, Kanagawa (JP); Koichiro Iida, Kanagawa (JP); Tomokazu Umemoto, Kanagawa (JP); Yoshimasa Bando, Kanagawa (JP); Koichi Ishibashi, Kanagawa (JP); Yoshiko Kajiyama, Kanagawa (JP); Tomohiro Abe, Kanagawa (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 372 days.

(21) Appl. No.: 16/136,961

(22) Filed: Sep. 20, 2018

(65) Prior Publication Data

US 2019/0019956 A1    Jan. 17, 2019

Related U.S. Application Data

(63) Continuation of application No. PCT/JP2017/011581, filed on Mar. 23, 2017.

(30) Foreign Application Priority Data

Mar. 24, 2016 (JP) ............................. JP2016-060764

(51) Int. Cl.
*C07F 5/00* (2006.01)
*H01L 51/00* (2006.01)
(Continued)

(52) U.S. Cl.
CPC .......... *H01L 51/0051* (2013.01); *C07F 5/027* (2013.01); *C08L 65/02* (2013.01);
(Continued)

(58) Field of Classification Search
None
See application file for complete search history.

(56) References Cited

U.S. PATENT DOCUMENTS 5,853,906 A    12/1998    Hsieh
6,475,590 B1    11/2002    Kitayama et al.
(Continued)

FOREIGN PATENT DOCUMENTS

JP    10-60034    3/1998
JP    11-251067    9/1999
(Continued)

OTHER PUBLICATIONS

Türp et al. "Synthesis of Nanometer-Sized, Rigid, and Hydrophobic Anions." Angewandte Chemie 123, No. 21 (2011): 5064-5067. (Year: 2011).*
(Continued)

*Primary Examiner* — Robert S Loewe
(74) *Attorney, Agent, or Firm* — Oblon, McClelland, Maier & Neustadt, L.L.P.

(57) ABSTRACT

The present invention provides with an electron-accepting compound having a structure of the following formula (1):

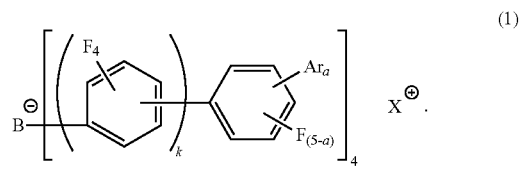

56 Claims, 2 Drawing Sheets

(51) Int. Cl.
*G09F 9/30* (2006.01)
*C07F 5/02* (2006.01)
*C08L 65/02* (2006.01)
*H01L 51/50* (2006.01)
*H01L 51/52* (2006.01)

(52) U.S. Cl.
CPC .............. *G09F 9/30* (2013.01); *H01L 51/008* (2013.01); *H01L 51/0035* (2013.01); *H01L 51/0059* (2013.01); *H01L 51/0096* (2013.01); *H01L 51/5012* (2013.01); *H01L 51/5056* (2013.01); *H01L 51/5084* (2013.01); *H01L 51/5092* (2013.01); *H01L 51/5221* (2013.01); *C08G 2261/135* (2013.01); *C08G 2261/312* (2013.01); *C08G 2261/314* (2013.01); *C08G 2261/3162* (2013.01); *C08G 2261/76* (2013.01); *C08G 2261/91* (2013.01); *C08L 2203/20* (2013.01); *C08L 2205/02* (2013.01); *C08L 2312/00* (2013.01); *H01L 51/001* (2013.01); *H01L 51/0054* (2013.01); *H01L 51/5088* (2013.01)

(56) References Cited

U.S. PATENT DOCUMENTS

| | | | |
|---|---|---|---|
| 6,597,012 | B2* | 7/2003 | Kido .................. H01L 51/0035 257/30 |
| 2001/0046611 | A1 | 11/2001 | Kido et al. |
| 2003/0006411 | A1 | 1/2003 | Kido et al. |
| 2003/0067000 | A1 | 4/2003 | Nelles et al. |
| 2007/0004819 | A1* | 1/2007 | Lu .......................... C08G 59/68 522/170 |
| 2007/0207341 | A1 | 9/2007 | Iida et al. |
| 2008/0220265 | A1* | 9/2008 | Xia ..................... H01L 51/0085 428/447 |
| 2009/0256117 | A1* | 10/2009 | Seshadri ................ H01G 9/028 252/500 |
| 2010/0045174 | A1 | 2/2010 | Okabe et al. |
| 2011/0001134 | A1 | 1/2011 | Iida et al. |
| 2011/0089411 | A1* | 4/2011 | Xia ....................... H01L 51/002 257/40 |
| 2012/0091443 | A1 | 4/2012 | Okabe et al. |
| 2013/0092887 | A1* | 4/2013 | Seshadri ................. C08F 12/22 252/519.21 |
| 2015/0079714 | A1 | 3/2015 | Okabe et al. |

FOREIGN PATENT DOCUMENTS

| | | |
|---|---|---|
| JP | 11-283750 | 10/1999 |
| JP | 2000-7684 | 1/2000 |
| JP | 2000-229931 | 8/2000 |
| JP | 2003-31365 | 1/2003 |
| JP | 2003-197942 | 7/2003 |
| JP | 2009-295974 | 12/2009 |
| JP | 2011-525918 | 9/2011 |
| KR | 10-2008-0003449 A | 1/2008 |
| KR | 2015-0127077 | 11/2015 |
| WO | WO 01/47852 A1 | 7/2001 |
| WO | WO 2005/089024 A1 | 9/2005 |
| WO | WO 2009/158069 A1 | 12/2009 |

OTHER PUBLICATIONS

Berven et al. "Self-crosslinking borate anions for the production of tough UV-cured polyelectrolyte surfaces." Journal of Polymer Science Part A: Polymer Chemistry 51, No. 3 (2013): 499-508. (Year: 2013).*

Extended European Search Report dated Feb. 12, 2019 in the corresponding European Patent Application No. 17770308.9 therein 8 pages.

Office Action dated Jan. 27, 2020 in European Patent Application No. 17 770 308.9, 4 pages.

Office Action dated Apr. 21, 2020 in corresponding Korean Patent Application No. 10-20123-7033869 (with English Translation), 11 pages.

International Search Report dated Jun. 20, 2017 in PCT/JP2017/011581, filed on Mar. 23, 2017 (with English Translation).

Written Opinion dated Jun. 20, 2017 in PCT/JP2017/011581, filed on Mar. 23, 2017.

Office Action (Notification of Reasons for Refusal) issued in 2017-568464 dated Mar. 6, 2018 (with English Translation).

Korean Office Action dated Feb. 10, 2021 in Korean Patent Appiication No. 10-2018-7033869 (with unedited computer generated English translation), 12 pages.

Mpoukouvalas, K., et al., "Dissociation and Charge Transport in Salts of Dendronized Ions in Solvents of Low Polarity", The Journal of Physical Chemistry, vol. 115, 2011, pp. 5801-5806.

Extended European Search Report dated Feb. 26, 2021 in European Patent Application No. 20216799.5, 8 pages.

Office Action as received in the corresponding KR patent application No. 10-2018-7033869 dated Dec. 24, 2021 w/Computer Generated English Translation, 15 pages.

* cited by examiner

ELECTRON-ACCEPTING COMPOUND AND COMPOSITION FOR CHARGE-TRANSPORTING FILM, AND LUMINESCENT ELEMENT USING SAME

TECHNICAL FIELD

The present invention relates to an electron-accepting compound and a composition for a charge-transporting film, and a charge-transporting film and an organic electroluminescent element using the same. Specifically, it relates to an excellent composition for a charge-transporting film and an electron-accepting compound, which can afford an organic electroluminescent element having excellent heat resistance and capable of operating at low voltage and also relates to a charge-transporting film using the same and a method for manufacturing the same. Further, it relates to an organic electroluminescent element using the same.

BACKGROUND ART

In recent years, as electroluminescent (electroluminescence: EL) elements, electroluminescent elements employing organic materials (organic electroluminescent elements) in place of inorganic materials such as ZnS. In the organic electroluminescent element, high luminescent efficiency thereof is one important factor but the luminescent efficiency has been remarkably improved by an organic electroluminescent element provided with a hole-transporting layer containing an aromatic amine compound and a luminescent layer composed of an aluminum complex of 8-hydroxyquinoline.

However, though the luminescent efficiency is improved, a big problem for expanding the demand for the organic electroluminescent element is a decrease in operating voltage. For example, in the display element of a portable device, operation at low voltage from the battery is requested. Also, in general uses other than the portable uses, the cost of operating IC (Integrated Circuit) depends on the operating voltage and lower operating voltage results in a lower cost. Moreover, a gradual increase in the operating voltage at continuous operation is also a big problem for maintaining stable display properties of the display element.

For solving these problems, it is attempted to mix various electron-accepting compounds with a hole-transporting compound. When an electron-accepting compound is mixed with a hole-transporting compound, electrons transfer from the hole-transporting compound to the electron-accepting compound to form a charge-transporting ion compound composed of a cation radical of the hole-transporting compound and a counter anion derived from the electron-accepting compound.

For example, Patent Document 1 discloses that an organic electroluminescent element capable of operation at low voltage is obtained by mixing tris(4-bromophenyl) aminiumhexachloroanitmonate) (TBPAH) with a hole-transporting polymer compound. Specifically, in the case where TBPAH described in Patent Document 1 is used as an electron-accepting compound, the counter anion is $SbCl_6^-$.

Moreover, Patent Document 2 discloses that iron(III) chloride ($FeCl_3$) is mixed as an electron-accepting compound with a hole-transporting compound by a vacuum deposition method and is used. In the case where $FeCl_3$ described in Patent Document 2 is used as an electron-accepting compound, the counter anion is $Cl^-$ (or $FeCl_4^-$).

Furthermore, Patent Document 3 discloses that tris(pentafluorophenyl)borane (PPB) is mixed an electron-accepting compound with a hole-transporting polymer compound by a wet film formation method to form a hole injection layer. In the case where PPB described in Patent Document 3 is used as an electron-accepting compound, the counter anion is an anion radical represented by the following formula (I).

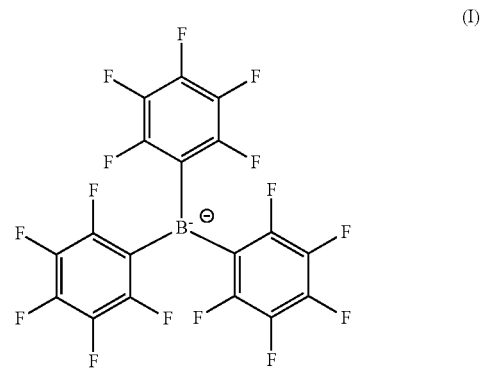 [SMILES: Fc1c(F)c(F)c([B-2](c2c(F)c(F)c(F)c(F)c2F)c2c(F)c(F)c(F)c(F)c2F)c(F)c1F]

(I)

Incidentally, the anion radical is a chemical species having an unpaired electron and negative charge. Moreover, the negative charge is considered to be spread all over the molecule but, in the above formula, there is shown a resonance structure that is considered to be the most contributing one.

Moreover, Patent Document 4 discloses to use an ion compound composed of an aluminum cation radical and $SbF_6^-$ or $BF_4^-$ as a component of a charge-transporting film of a photovoltanic apparatus (organic solar battery).

Furthermore, Patent Document 5 discloses to use an ion compound composed of an aluminum cation radical and a counter anion. As the counter anion, there are exemplified a halide ion such as $I^-$, a polyhalide ion such as $Br_3^-$, an oxo acid ion such as $ClO_4^-$ or $PO_3^-$, an ion composed of a center element and a halogen, such as $BF_4^-$, $FeCl_4^-$, $SiF_6^{2-}$, or $RuCl_6^{2-}$, a carboxylic acid ion such as $CF_3COO^-$, a sulfonic acid ion such as $CF_3SO_2O^-$, an ate complex derived from a sulfonic acid ion, such as $(CF_3SO_3)_4Al^-$, $C_{60}^-$, $C_{60}^{2-}$, or $B_{12}H_{12}^{2-}$.

In addition, since an ion compound composed of an aluminum cation radical and a counter anion has absorption in a near-infrared region, Patent Document 6 discloses to use it in infrared-ray cut filter uses, and a tetraphenylboric acid ion is exemplified as a counter anion.

PRIOR ART DOCUMENTS

Patent Documents

Patent Document 1: JP-A-11-283750
Patent Document 2: JP-A-11-251067
Patent Document 3: JP-A-2003-31365
Patent Document 4: JP-A-2003-197942
Patent Document 5: U.S. Pat. No. 5,853,906
Patent Document 6: JP-A-2000-229931

SUMMARY OF THE INVENTION

Problems that the Invention is to Solve

However, as a result of investigation of the present inventors, it has been found that the following problems are present in the aforementioned documents. Since TBPAH described in Patent Document 1 has low thermal stability and is thermally decomposed at the time of vapor deposition, it is unsuitable for the formation of the hole injection layer. Therefore, it is usually mixed with a hole-transporting compound by a wet film formation method but, owing to low solubility, it has a problem that it is also not suitable for the wet film formation method. Further, since TBPAH has small electron-accepting properties, even when it is mixed with the hole-transporting compound and used, there is a limitation in the decrease of the operating voltage. Also, since TBPAH contains an antimony atom, it has strong toxicity and thus is not preferred.

Moreover, $FeCl_3$ described in Patent Document 2 has corrosiveness and damages a vacuum deposition apparatus, so that it is not preferred. ITO (indium-tin oxide) that is generally used as the anode of an organic electroluminescent element has a surface roughness (Ra) of about 10 nm and also frequently has local protrusions, so that there is a problem that short-circuit defect is prone to occur. Therefore, it is preferred to form a hole injection layer to be formed on the anode by a wet film formation method but $FeCl_3$ has extremely low solubility in a solvent and is also not suitable for the wet film formation method.

Furthermore, in the case where aforementioned TBPAH or $FeCl_3$ is used as an electron-accepting compound, since the counter anion of the ion compound to be formed is $SbCl_6^-$ or $Cl^-$ (or $FeCl_4^-$) and the negative charge is localized, it strongly interacts with the radical cation of the hole-transporting compound and the positive charge is less prone to transfer, so that the operating voltage does not sufficiently decrease.

In addition, also in the case where the ion compound composed of an aluminum cation radical and a counter anion in which the counter anion is any of a halide ion such as $I^-$, a polyhalide ion such as $Br_3^-$, an oxo acid ion such as $ClO_4^-$ or $PO_3^-$, an ion composed of a center element and a halogen, such as $BF_4^-$, $FeCl_4^-$, $SiF_6^{2-}$, or $RuCl_6^{2-}$, a carboxylic acid ion such as $CF_3COO^-$, a sulfonic acid ion such as $CF_3SO_2O^-$, as described in Patent Document 4 or 5, is used as an ingredient of the hole injection layer of an organic electroluminescent element, since the negative charge is localized, it is considered that it strongly interacts with the aluminum cation radical, the positive charge is less prone to transfer, and thus the operating voltage does not sufficiently decrease.

Moreover, PPB described in Patent Document 3 has low thermal stability and thus the organic electroluminescent element containing PPB exhibits low thermal stability and does not satisfy practical characteristics. Further, since PPB shows very high sublimating properties, at the time of the formation of a hole injection layer containing PPB by a wet film formation method, for example, the compound is vaporized when heated and dried at a high temperature of 120° C. or higher, so that there is a problem that the operating voltage of the organic electroluminescent element to be obtained is increased, as compared with the case of heating and drying at lower than 120° C., for example. Particularly, in the manufacture of the organic electroluminescent element, from the standpoints of easiness of the manufacturing process and the stability of the element properties, a hole injection layer durable to heating and drying at higher temperature, for example, at 200° C. or higher is desired but PPB is not preferred also in this point. Also, owing to the very high sublimating properties of PPB, concentration control at co-deposition is difficult and thus it is unsuitable for the formation of the hole injection layer by co-deposition with a hole-transporting compound.

Furthermore, in the case where PPB described in Patent Document 3 is used as an electron-accepting compound, since the counter anion of the hole-transporting ion compound to be formed is the aforementioned anion radical, it does not satisfies the Octet rule and is thermodynamically and electrochemically unstable and thus there is a problem in the stability of the coating solution (composition) and element properties including heat resistance.

Moreover, also in the case where the ion compound in which the counter anion is any of a carboxylic acid ion such as $CF_3COO^-$, a sulfonic acid ion such as $CF_3SO_2O^-$, an ate complex derived from a sulfonic acid ion, such as $(CF_3SO_3)_4Al^-$, $C_{60}^-$, $C_{60}^{2-}$, or $B_{12}H_{12}^{2-}$ and an aluminum cation radical is a cation, as described in Patent Document 5, is used as a component of the hole injection layer of the organic electroluminescent element, owing to the structure of the counter anion, it is considered that the compound is poor in thermodynamic and/or electrochemical stability and the stability of the coating solution (composition) and element properties including heat resistance is not sufficient.

Accordingly, the present invention is devised in consideration of the aforementioned problems and an object thereof is to provide excellent electron-accepting compound and composition for a charge-transporting film, which are capable of affording an organic electroluminescent element that is excellent in heat resistance and also has high hole injection/transporting ability, can be operated at low voltage and at high efficiency, and is excellent in operation stability including heat resistance. Also, it is an object to provide an organic electroluminescent element that can be operated at low voltage and at high efficiency and is excellent in operation stability including heat resistance.

Means for Solving the Problems

As a result of extensive studies, the present inventors have found that a composition for a charge-transporting film that is excellent in heat resistance and also has high hole injection/transporting ability can be obtained by using an ion compound having a specific structure as an electron-accepting compound as a mixture with a charge-transporting compound and further, by using the composition, it becomes possible to obtain an organic electroluminescent element that can be operated at low voltage and at high efficiency, thus being able to solve the above problems efficiently.

Moreover, as a result of extensive studies, the present inventors have found that a composition for a charge-transporting film that is excellent in heat resistance and also has high hole injection/transporting ability can be obtained by using an electron-accepting compound having a cross-linkable group as a mixture with a charge-transporting compound and further, by using the composition, it becomes possible to obtain an organic electroluminescent element that can be operated at low voltage and at high efficiency, thus being able to solve the above problems efficiently. Accordingly, they have accomplished the present invention.

The gist of the present invention is as follows.

[1] An electron-accepting compound having a structure of the following formula (1):

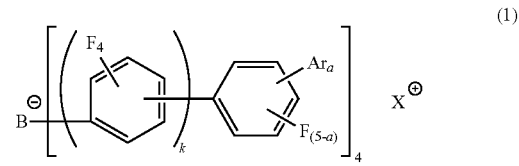

wherein
Ar is each independently an aromatic ring group which may have a substituent or a fluorine-substituted alkyl group,
$F_4$ represents a substitution with four fluorine atoms,
$F_{(5-a)}$ represents a substitution with (5-a) fluorine atom(s),
k each independently represents an integer of 0 to 5,
a each independently represents an integer of 0 to 5,
k+a is 1 or more, and
$X^+$ represents a counter cation having a structure of the following formula (2):

(2)

wherein $Ar^5$ and $Ar^6$ are each independently an aromatic ring group which may have a substituent.

[2] The electron-accepting compound according to claim 1, wherein the above k is 0, the above a is 1, and the above Ar is each independently an aromatic ring group which may have a substituent.

[3] The electron-accepting compound according to claim 2, wherein Ar of the above formula (1) has four or more fluorine atoms as substituents.

[4] The electron-accepting compound according to any one of claims 1 to 3, wherein Ar of the above formula (1) is represented by the following formula (3):

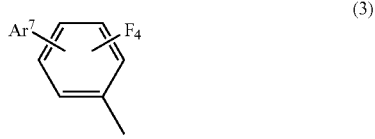

(3)

wherein $Ar^7$ is a substituent and $F_4$ represents a substitution with four fluorine atoms.

[5] The electron-accepting compound according to claim 4, wherein $Ar^7$ of the above formula (3) is represented by the following formula (4).

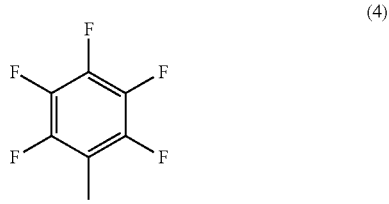

(4)

[6] The electron-accepting compound according to any one of claims 1 to 5, wherein the above formula (2) is represented by the following formula (5):

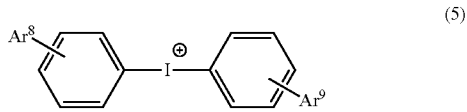

(5)

wherein $Ar^8$ and $Ar^9$ represent a substituent.

[7] The electron-accepting compound according to any one of claims 1 to 6, wherein at least one Ar of the above formula (1) has a crosslinkable group.

[8] A composition for a charge-transporting film, comprising the electron-accepting compound according to any one of claims 1 to 7 and a hole-transporting compound.

[9] The composition for a charge-transporting film according to claim 8, wherein the hole-transporting compound is an aromatic tertiary amine compound.

[10] The composition for a charge-transporting film according to claim 8 or 9, which further comprises a solvent.

[11] The composition for a charge-transporting film according to claim 10, wherein the solvent contains at least one solvent selected from the group consisting of ether-based solvents and ester-based solvents.

[12] The composition for a charge-transporting film according to any one of claims 8 to 11, which is used for a hole injection layer of an organic electroluminescent element.

[13] An organic electroluminescent element comprising a hole injection layer and a luminescent layer between an anode and a cathode and emitting light by electric energy, wherein the hole injection layer is a layer formed by applying and drying the composition for a charge-transporting film according to any one of claims 8 to 12 to form a film.

[14] A display using the organic electroluminescent element according to claim 13.

[15] A lighting device using the organic electroluminescent element according to claim 13.

[16] A light-emitting device using the organic electroluminescent element according to claim 13.

[17] An electron-accepting compound having a crosslinkable group, wherein the electron-accepting compound is an ion compound and a counter anion of the ion compound has a crosslinkable group.

[18] A composition for a charge-transporting film, comprising an electron-accepting compound and a charge-transporting compound, wherein the electron-accepting compound is an ion compound and a counter anion of the ion compound has a crosslinkable group.

[19] A composition for a charge-transporting film, comprising a charge-transporting ion compound containing a counter anion of an electron-accepting compound that is an ion compound and a cation radical of a charge-transporting compound, wherein the counter anion of the electron-accepting compound has a crosslinkable group.

Advantage of the Invention

The composition for a charge-transporting film of the present invention contains the electron-accepting compound of the invention together with a charge-transporting compound. Thereby, the formed charge-transporting film exhibits excellent thermal stability and high hole injection/transporting ability.

Moreover, the organic electroluminescent element of the invention contains the aforementioned electron-accepting compound in a layer present between the anode and the cathode or the luminescent layer. Thereby, the element exhibits excellent thermal stability and also it can be operated at low voltage and at high efficiency and is excellent in operation stability.

The charge-transporting ion compound according to the invention is composed of a cation radical of the charge-transporting compound and a counter anion of the electron-accepting compound of the invention. Since the counter anion of the electron-accepting compound of the invention is thermodynamically and electrochemically stable, the charge-transporting ion compound of the invention is excellent in thermal stability and electrochemical durability.

Moreover, with regard to the counter anion of the electron-accepting compound of the invention, since the negative charge is delocalized, the interaction with the cation is small and thus the charge transport is hardly inhibited.

The composition for a charge-transporting film of the invention contains the aforementioned charge-transporting ion compound. Thereby, the formed charge-transporting film exhibits excellent heat resistance and electrochemical durability and high hole injection/transporting ability.

In the organic electroluminescent element of the invention, there is provided a layer containing at least the aforementioned charge-transporting ion compound. Thereby, the element exhibits excellent heat resistance, also can be operated at low voltage and at high efficiency, and it is excellent in operation stability, so that it can be suitably used in a display, a lighting device, a light-emitting device, and the like.

MODES FOR CARRYING OUT THE INVENTION

Figure 1A:
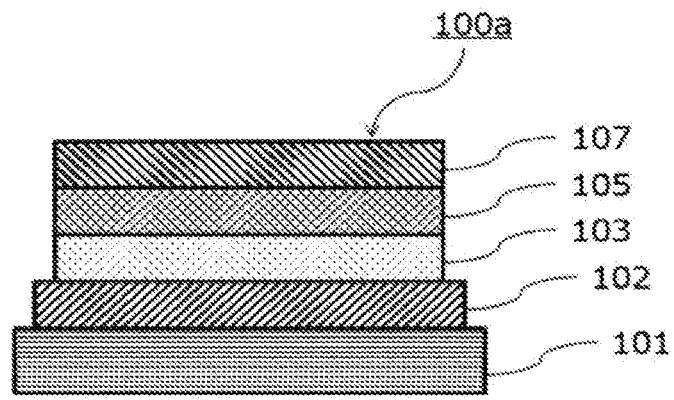
FIGS. 1A to 1C are cross-sectional views schematically showing examples of configuration of the organic electroluminescent element according to one embodiment of the present invention.

The following will explain modes for carrying out the present invention in detail but the explanation of the compositional requirements to be described below is an example (representative example) of the embodiments of the invention and the invention is not specified to these contents unless it exceeds the gist thereof.

In the invention, "mass" has the same meaning as "weight".

Moreover, the plus (+) sign surrounded by a circle in formulae represents positive charge and is represented by "+" in the Description. Similarly, the minus (−) sign surrounded by a circle in formulae represents negative charge and is represented by "−" in the Description.

[1. Electron-Accepting Compound]

An electron-accepting compound means a compound which extracts an electron from a certain compound to oxidize the compound and itself is reduced. The electron-accepting compound of the invention is an ion compound and specifically, is an ion compound composed of a counter anion that is a non-coordinative anion and a counter cation, represented by the following general formula (1):

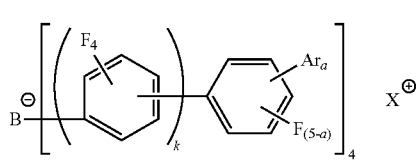

wherein

Ar is each independently an aromatic ring group which may have a substituent or a fluorine-substituted alkyl group, $F_4$ represents substitution with four fluorine atoms, $F_{(5-a)}$ represents substitution with (5-a) fluorine atom(s), k each independently represents an integer of 0 to 5, a each independently represents an integer of 0 to 5, k+a is 1 or more, and $X^+$ represents a counter cation having a structure of the following formula (2):

wherein $Ar^5$ and $Ar^6$ are each independently an aromatic ring group which may have a substituent.

Moreover, the electron-accepting compound of the invention is preferably an electron-accepting compound having a crosslinkable group and is more preferably at least one Ar has a crosslinkable group.

Furthermore, the electron-accepting compound having a crosslinkable group of the invention is preferably an ion compound having a crosslinkable group.

The crosslinkable group in the case where the electron-accepting compound of the invention is an electron-accepting compound having a crosslinkable group is not particularly limited but is preferably the formula (7) or (8) to be mentioned below.

The structure of the counter anion of the ion compound represented by the formula (1) is described in the formula (6).

[I-1. Counter Anion]

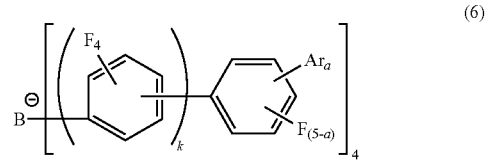

wherein the definitions of Ar, $F_4$, $F_{(5-a)}$, k, and a are the same as in the formula (1).

The aromatic ring group in Ar represents an aromatic hydrocarbon ring group, an aromatic heterocyclic group, or a substituent obtained by linking the aromatic hydrocarbon ring group(s) and/or the aromatic heterocyclic group(s). The aromatic ring group has preferably 30 or less carbon atoms since voltage and life become satisfactory.

The above aromatic ring group is preferably a monocycle, a condensed ring of 2 to 6 rings, or a group in which two or more of the aromatic groups are linked. Specifically, preferred is a monovalent group derived from a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, or fluorene ring, a biphenyl group, a terphenyl group, a quaterphenyl group, or a monovalent group derived from a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, perimidine ring, quinazoline ring, quinazolinone ring, or azulene ring. Of these, since the negative charge is efficiently delocalized and stability and heat resistance are excellent, more preferred is a monovalent group derived from a benzene ring, naphthalene ring, fluorene ring, pyridine ring, or carbazole ring or a biphenyl group. Particularly preferred is a benzene ring or a biphenyl group.

Ar may be substituted with another substituent unless it departs from the purpose of the invention. The substituent that Ar may have is a hydrogen atom, a halogen atom, a cyano group, an aromatic ring group composed of 1 to 5 aromatic rings, a hydrocarbon ring group, an alkyl group, an alkenyl group, an alkynyl group, an aralkyl group, an alkyloxy group, an aryloxy group, an alkylthio group, an arylthio group, an alkyl ketone group, or an aryl ketone group.

Examples of the halogen atom include a fluorine atom, a chlorine atom, a bromine atom, an iodine atom, and the like and a fluorine atom is preferred in view of stability. From the standpoint of the stability of the compound, Ar is particularly preferably substituted with 4 or more fluorine atoms.

As the aromatic ring group composed of 1 to 5 aromatic rings, there may be mentioned a phenyl group, a biphenyl group, a terphenyl group, a quaterphenyl group, a naphthyl group, a phenanthrenyl group, a triphenylene group, a naphthylphenyl group, and the like, and a phenyl group, biphenyl group, terphenyl group, or quaterphenyl group is preferred in view of the stability of the compound.

Examples of the hydrocarbon ring group include a cyclopropyl group, a cyclobutyl group, a cyclopentyl group, a cyclohexyl group, and the like.

Examples of the alkyl group include a methyl group, an ethyl group, a branched or linear propyl group, a butyl group, a hexyl group, an octyl group, a decyl group, and the like.

Examples of the alkenyl group include a vinyl group, a propenyl group, a butenyl group, and the like.

Examples of the alkynyl group include an ethynyl group, a propynyl group, a butynyl group, and the like.

Examples of the aralkyl group include a benzyl group, a phenylethyl group, a phenylhexyl group, and the like.

Examples of the aryloxy group include a phenoxy group, a naphthyloxy group, and the like.

Examples of the alkylthio group include a methylthio group, an ethylthio group, a butylthio group, a hexylthio group, and the like.

Examples of the arylthio group include a phenylthio group, a naphthylthio group, and the like.

Examples of the alkyl ketone group include an acetyl group, an ethylcarbonyl group, a butylcarbonyl group, an octylcarbonyl group, and the like.

Examples of the aryl ketone group include a benzoyl group, a naphthylcarbonyl group, and the like.

Examples of the alkyloxy group include a methoxy group, an ethoxy group, a butyloxy group, a hexyloxy group, an octyloxy group, and the like.

In addition, adjacent substituents may be combined with each other to form a ring.

Examples of the ring formation include a cyclobutene ring, a cyclopentene ring, and the like.

Moreover, these substituents may be further substituted with a substituent and examples of the substituent include a halogen atom, an alkyl group, and an aryl group.

Of these substituents, a halogen atom or an aryl group is preferred in view of the stability of the compound. Most preferred is a halogen atom.

The fluorine-substituted alkyl group in Ar is preferably a linear or branched alkyl group having 1 to 12 carbon atoms, which is substituted with a fluorine atom, further preferably a perfluoroalkyl group, more preferably a linear or branched perfluoroalkyl group having 1 to 5 carbon atoms, particularly preferably a linear or branched perfluoroalkyl group having 1 to 3 carbon atoms, most preferably a perfluoromethyl group. The reason is that a coated film using the compound of the invention and a coated film to be superposed on an upper layer thereof become stable.

In the invention, Ar of the formula (1) is preferably substituted with 4 or more fluorine atoms from the standpoint of the stability of the compound.

A more preferred structure of the counter anion is represented by the following formula (9).

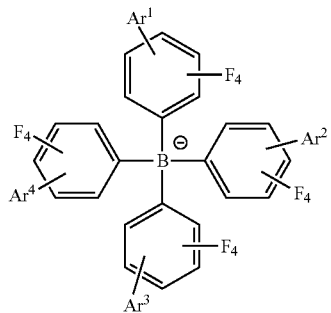

(9)

In the formula (9), $Ar^1$ to $Ar^4$ are each independently an aromatic ring group that may have a substituent and is the same as Ar of the formula (6). The following descriptions on Ar are similarly applicable to $Ar^1$ to $Ar^4$. $Ar^1$ to $Ar^4$ are preferably aromatic ring groups having 30 or less carbon atoms. The formula (9) represents a case where k=0 and a=1 in the formula (6).

Moreover, it is also preferred that at least one Ar is represented by the following formula (3):

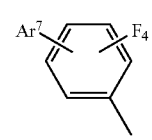

(3)

wherein $Ar^7$ is a substituent and $F_4$ represents substitution with four fluorine atoms.

$Ar^7$ is the same as the group preferred as a substituent that the aforementioned Ar may have. Moreover, $F_4$ represents substitution with four fluorine atoms.

Of these, $Ar^7$ is more preferably represented by the following formula (4).

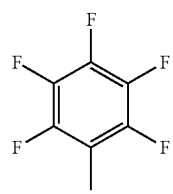

(4)

Moreover, it is preferred that at least one Ar is represented by a substituent containing the following formula (7) or (8):

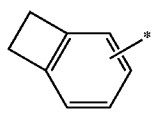
(7)

wherein the asterisk (*) represents a bonding hand,

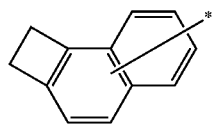
(8)

wherein the asterisk (*) represents a bonding hand.

These formulae (7) and (8) may have a substituent and examples of the substituent is the same as the substituent that Ar may have.

These formulae (7) and (8) have crosslinkability and, since it is anticipated that an electron-accepting compound or a decomposition product thereof do not diffuse into the other layers, an improvement in element efficiency is expected.

The molecular weight of the counter anion of the ion compound of the invention is in the range of usually 700 or more, preferably 900 or more, further preferably 1,100 or more and usually 6,000 or less, preferably 4,000 or less, further preferably 3,000 or less. When the molecular weight of the counter anion is too small, delocalization of the negative charge is insufficient and hence the interaction with the cation is strong and there is a concern of a decrease in the charge-transporting ability. When the molecular weight of the counter anion is too large, there is a case where the counter anion itself prevents the charge transportation.

Incidentally, in the invention, the term "one may have a substituent" means that one may have at least one substituent.

The following will mention specific examples of the counter anion that is an anion of the charge-transporting ion compound of the invention but the invention is not limited thereto.

(A-1)

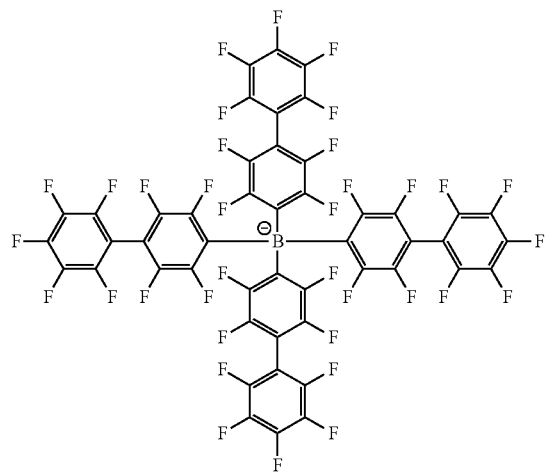

(A-2)

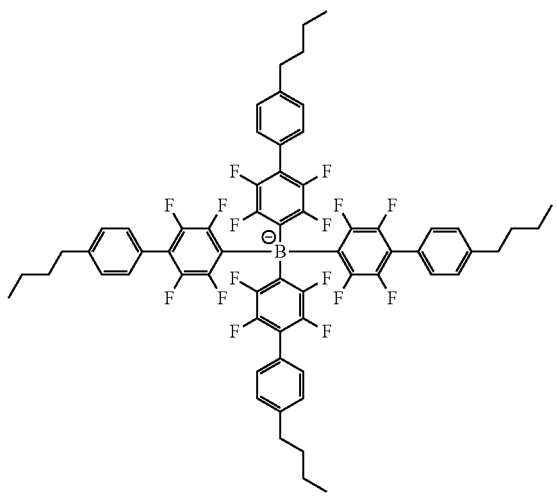

(A-3)

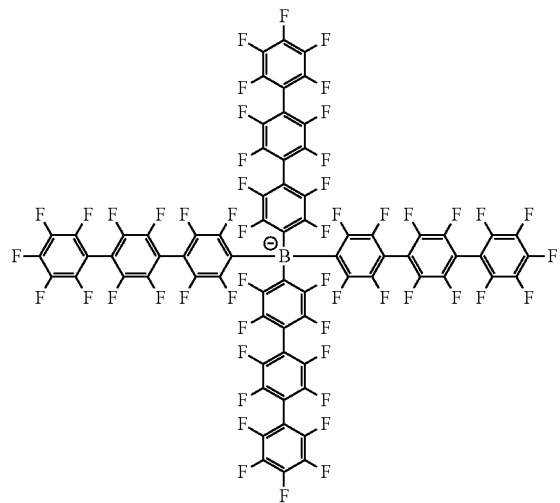

(A-4)

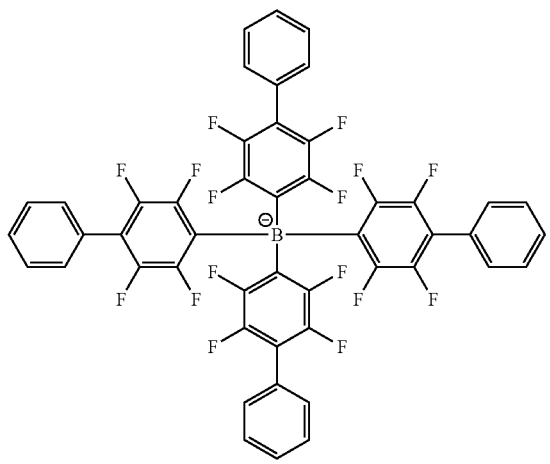

(A-5)
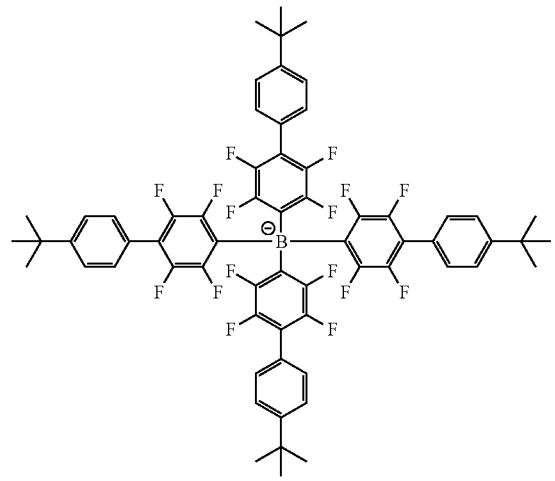
(A-6)
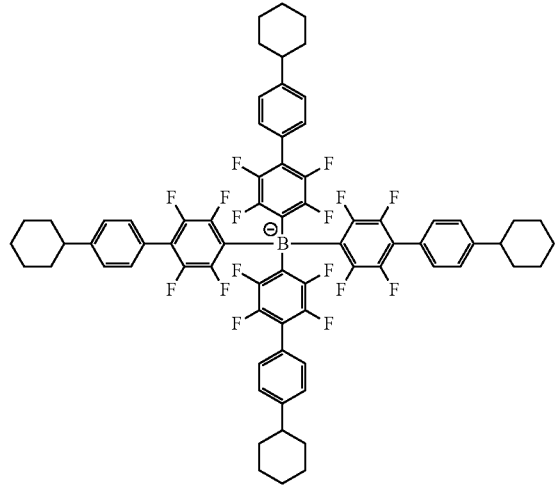
(A-7)
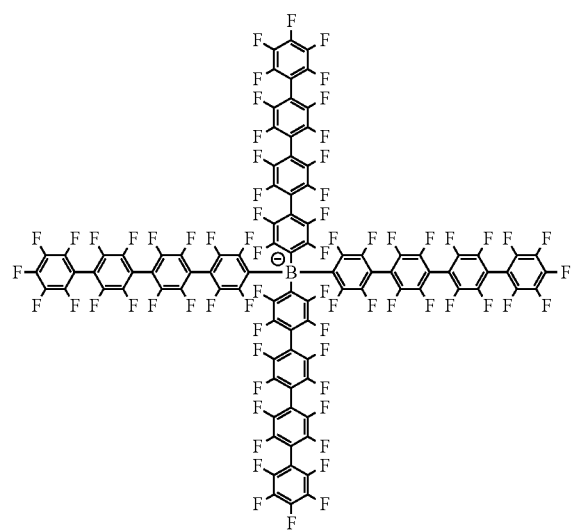
(A-8)
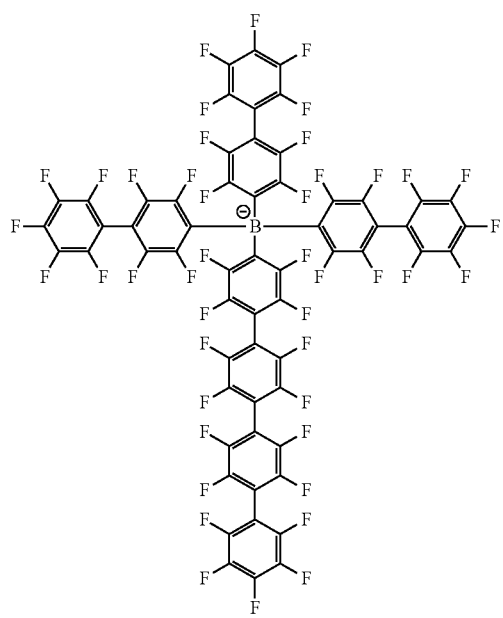

(A-9)
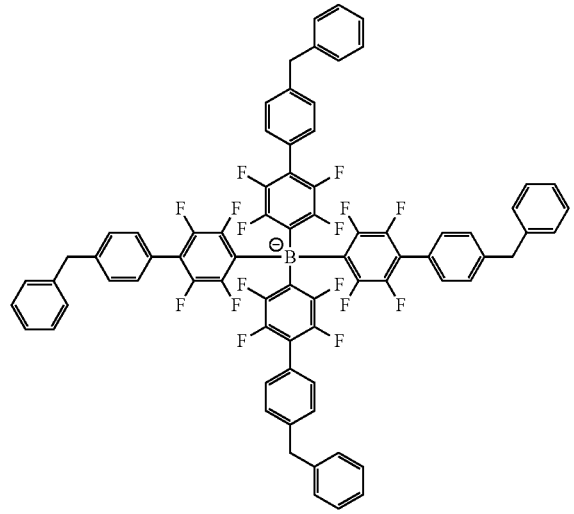
(A-10)
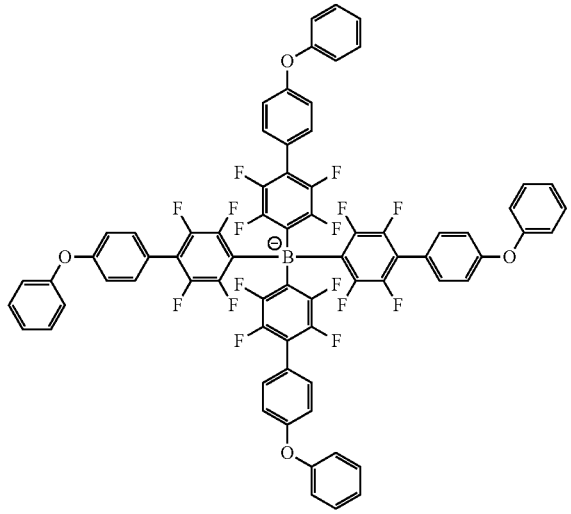
(A-11)
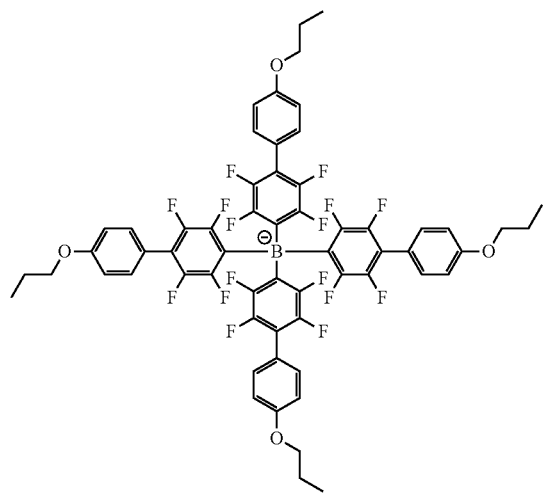
(A-12)
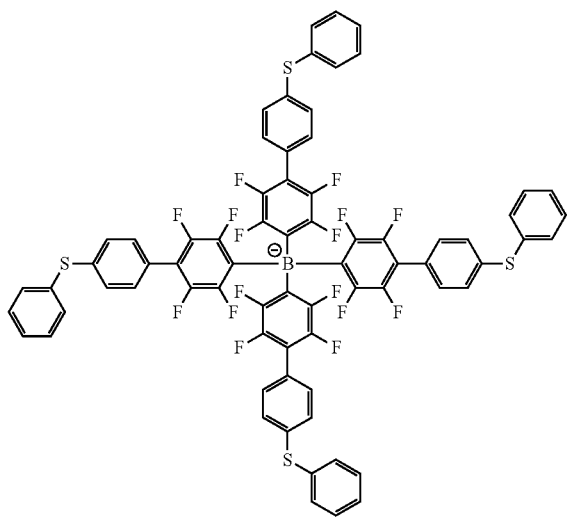
(A-13)
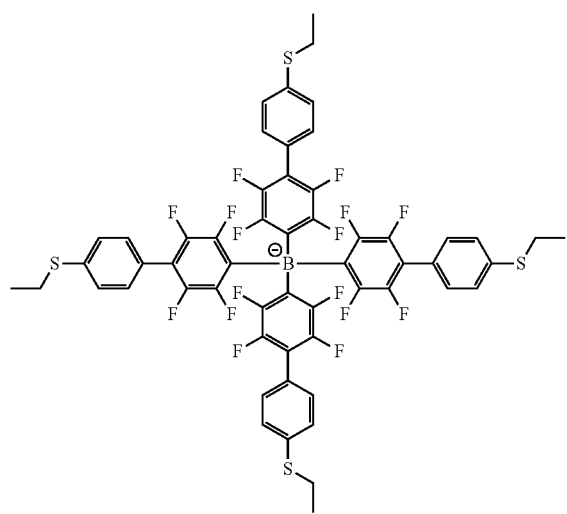
(A-14)
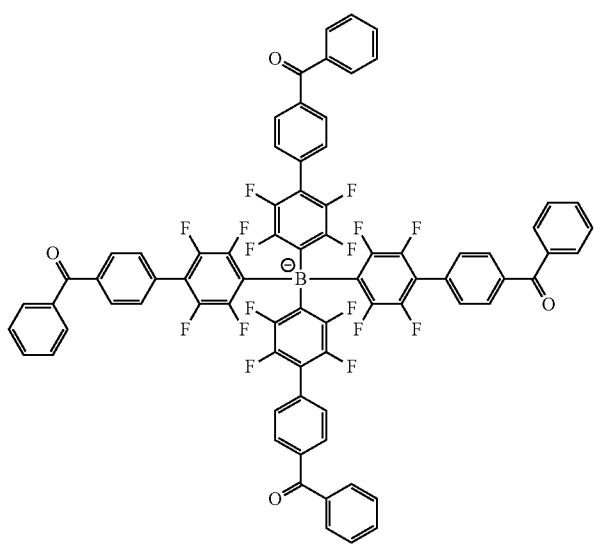

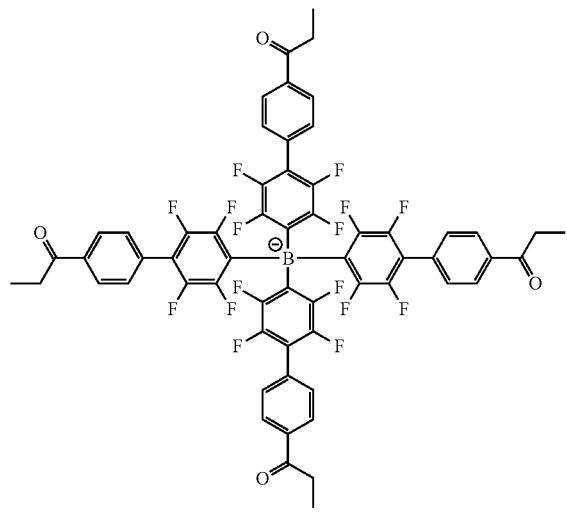
(A-15)
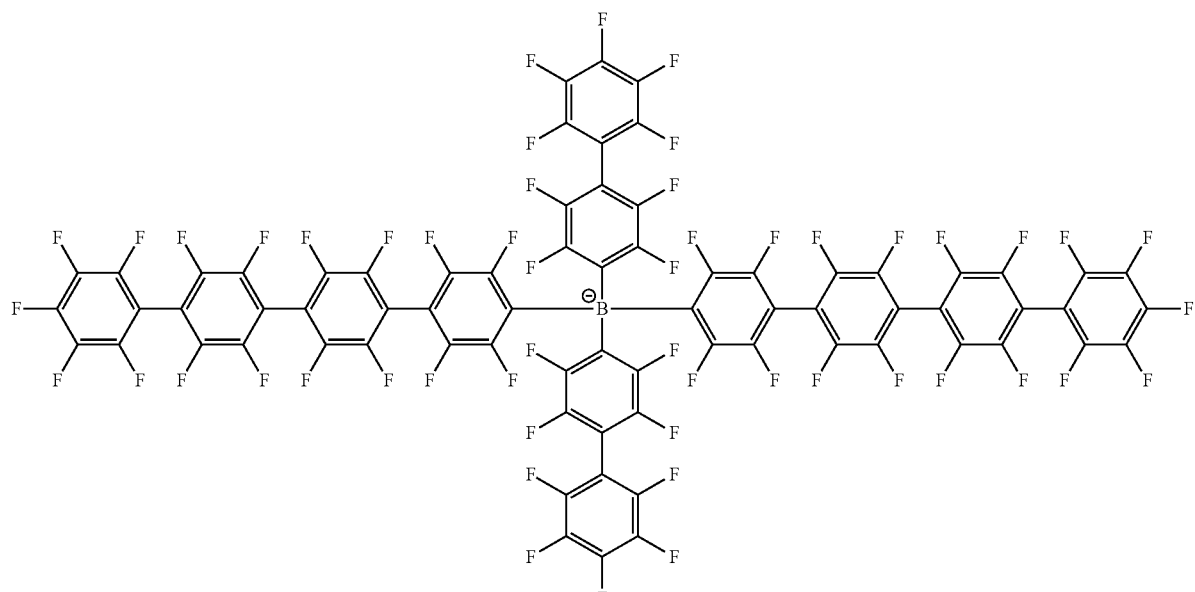
(A-16)
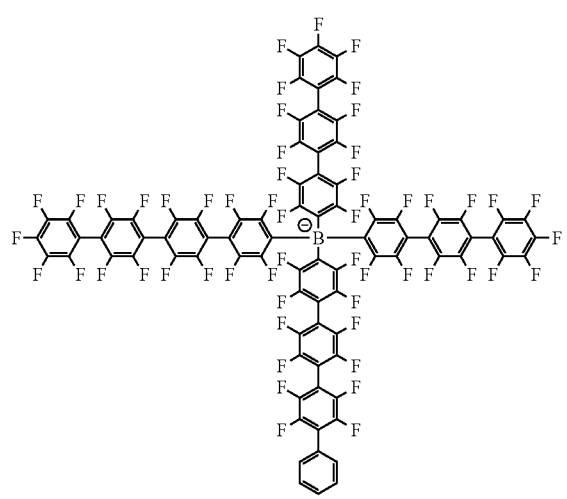
(A-17)
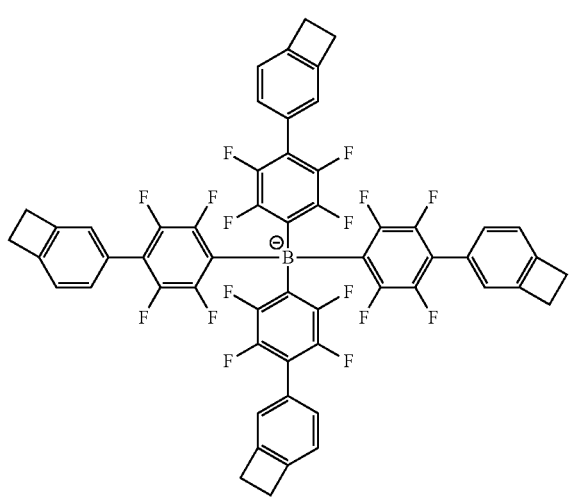
(A-18)

-continued
(A-19)
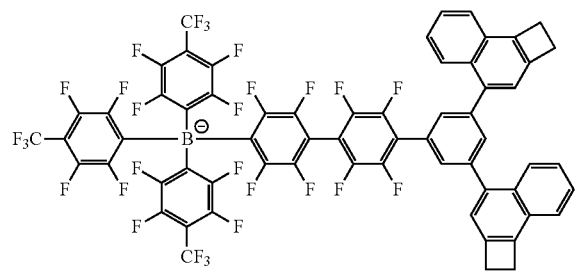
(A-20)
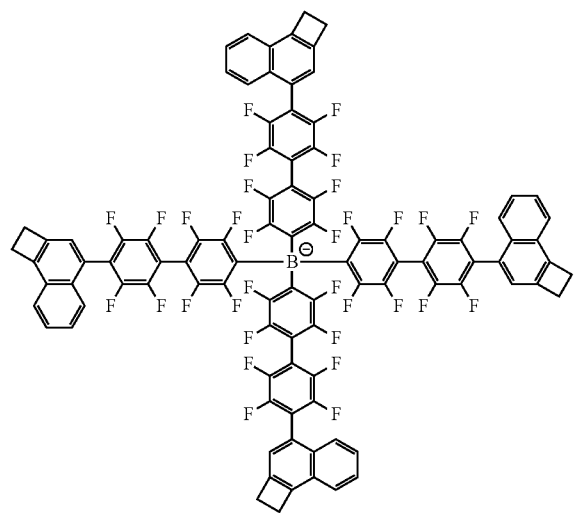
(A-21)
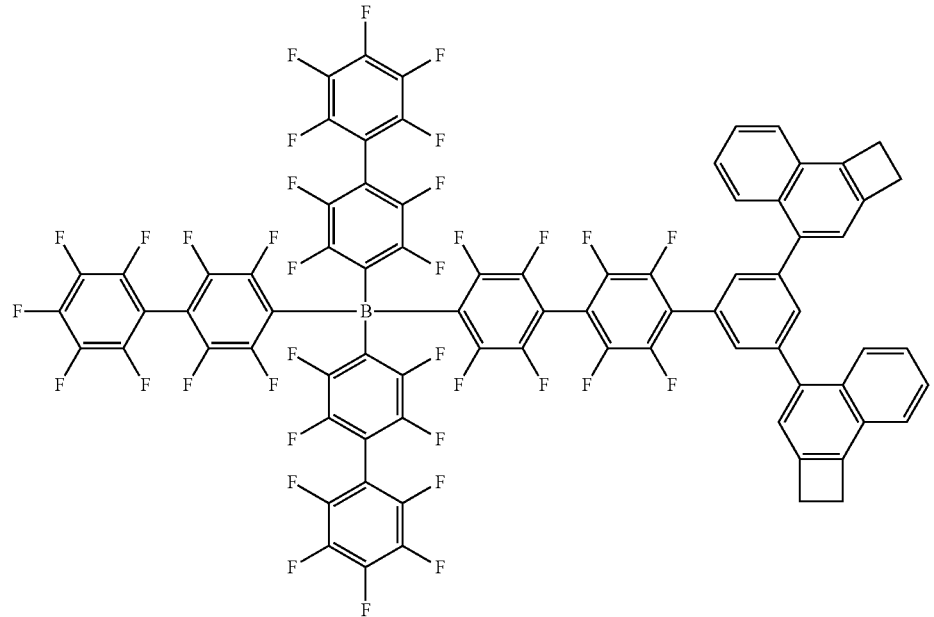
(A-22)
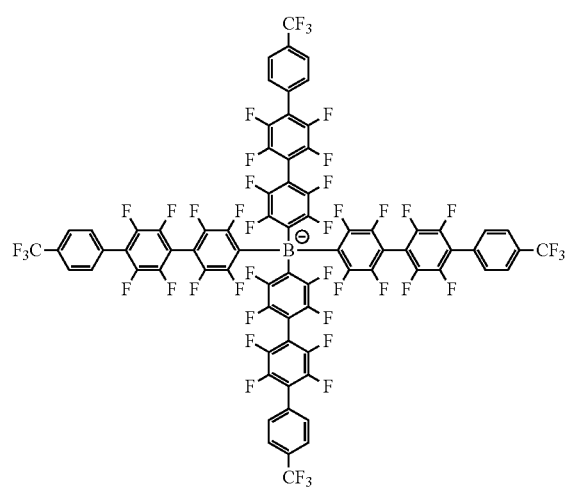
(A-23)
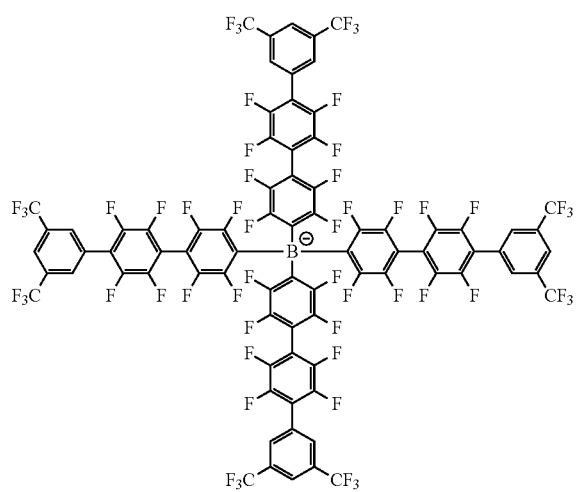

-continued

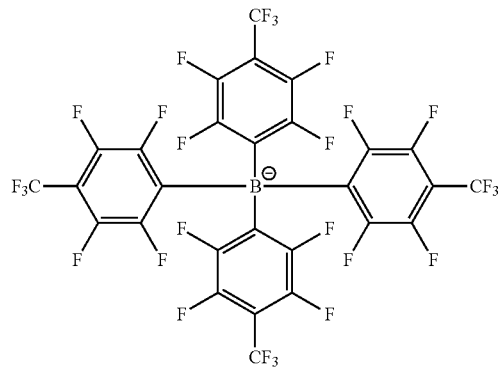
(A-24)

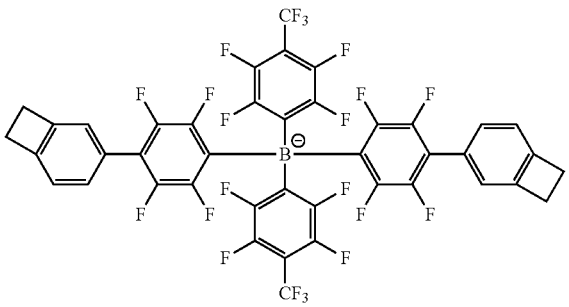
(A-25)

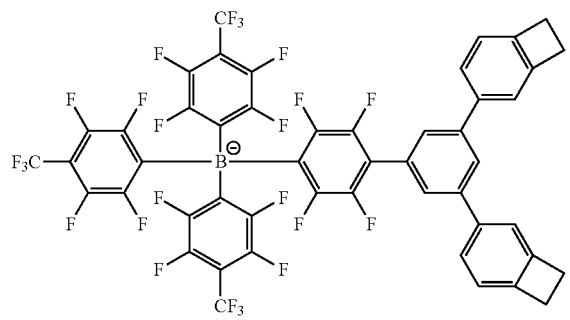
(A-26)

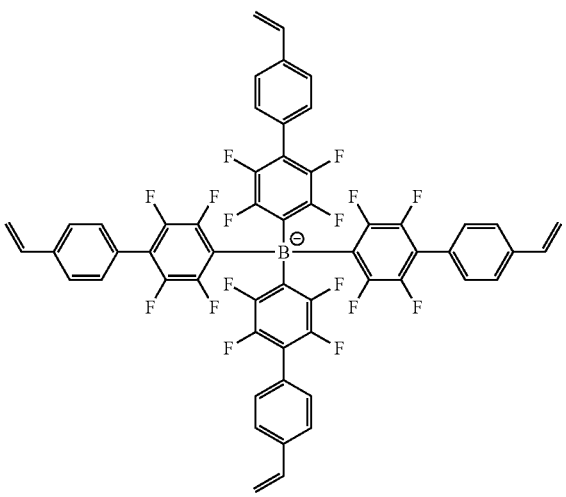
(A-27)

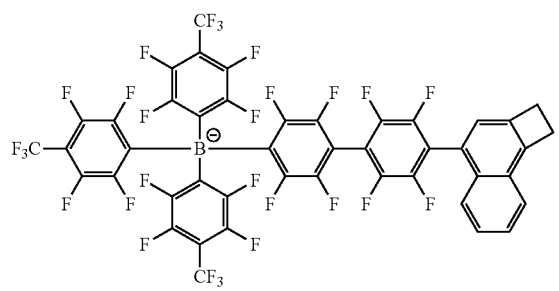
(A-28)

Of the above specific examples, in view of electron-accepting properties, heat resistance, and solubility, preferred are compounds of (A-1) and (A-2). Furthermore, in view of having a crosslinkable group, (A-18), (A-19), (A-20), (A-21), (A-25), (A-26), (A-27), and (A-28) are preferred, (A-18), (A-19), (A-20), (A-21), (A-25), (A-26), and (A-28) are more preferred because of high stability as the composition for a charge-transporting film and, from the viewpoint of the stability of the organic electroluminescent element, (A-19), (A-21), (A-25), (A-26), and (A-28) are particularly preferred.

[I-2. Counter Cation]

In the formula (1), X$^+$ is a counter cation of the ion compound and is represented by the following formula (2).

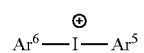
(2)

In the formula (2), Ar$^5$ and Ar$^6$ each independently represent an aromatic ring group which may have a substituent.

The aromatic ring group is the same as the aromatic ring group in Ar of the aforementioned formula (6). As the aromatic ring group, there may be preferably mentioned a phenyl group, a biphenyl group, a terphenyl group, a quaterphenyl group, a naphthyl group, a phenanthrenyl group, a triphenylene group, a naphthylphenyl group, and the like, and a phenyl group is most preferred from the standpoint of the stability of the compound.

The aromatic ring group exemplified as Ar$^5$ and Ar$^6$ may be further substituted with another substituent unless it departs from the purpose of the invention. The kind of the substituent is not particularly limited, and any substituents are applicable.

Preferred groups as the substituent that $Ar^5$ and $Ar^6$ may have are a hydrogen atom, a halogen atom, an aromatic ring group composed of 1 to 5 aromatic rings, a hydrocarbon ring group, an alkyl group, an aralkyl group, an alkyloxy group, an aryloxy group, and a hydroxy group. Of these, an alkyl group is particularly preferred for improving the solubility in a solvent.

Examples of the halogen atom include a fluorine atom, a chlorine atom, a bromine atom, an iodine atom, and the like.

Examples of the aromatic ring group composed of 1 to 5 aromatic rings include a phenyl group, a biphenyl group, a terphenyl group, a quaterphenyl group, a naphthyl group, a phenanthrenyl group, a triphenylene group, a naphthylphenyl group, and the like, and a phenyl group is preferred in view of the stability of the compound.

Examples of the hydrocarbon ring group include a cyclopropyl group, a cyclobutyl group, a cyclopentyl group, a cyclohexyl group, and the like.

Examples of the alkyl group include a methyl group, an ethyl group, a branched or linear propyl group, a butyl group, a hexyl group, an octyl group, a decyl group, and the like.

Examples of the aralkyl group include a benzyl group, a phenylethyl group, a phenylhexyl group, and the like.

Examples of the alkyloxy group include a methoxy group, an ethoxy group, a butyloxy group, a hexyloxy group, an octyloxy group, and the like.

Examples of the aryloxy group include a phenoxy group, a naphthyloxy group, and the like.

Moreover, these substituents may be further substituted with a substituent and examples of the substituent include a halogen atom, an alkyl group, and an aryl group.

Of these substituents, an alkyl group is preferred in view of the film stability.

Furthermore, the counter cation represented by the above formula (2) is preferably represented by the following formula (5).

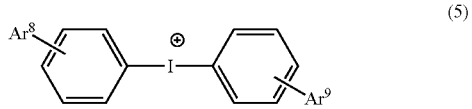

(5)

In the above formula (5), $Ar^8$ and $Ar^9$ are the same as the substituent that $Ar^5$ and $Ar^6$ may have in the aforementioned formula (2).

The molecular weight of the electron-accepting compound to be used in the invention is in the range of usually 900 or more, preferably 1,000 or more, further preferably 1,200 or more and usually 10,000 or less, preferably 5,000 or less, further preferably 3,000 or less. When the molecular weight of the electron-accepting compound is too small, delocalization of the positive charge and the negative charge is insufficient and hence there is a concern of lowering the electron-accepting ability. When the molecular weight of the electron-accepting compound is too large, there is a concern that the electron-accepting compound itself prevents the charge transportation.

[I-3. Electron-Accepting Compound Having Crosslinkable Group]

Moreover, the electron-accepting compound of the invention is an electron-accepting compound having a crosslinkable group.

The mother skeleton of the electron-accepting compound is not particularly limited but is preferably an ion compound, more preferably an ion compound having a counter anion represented by the aforementioned general formula (6), particularly preferably an ionic compound composed of a non-coordinating anion and a cation represented by the aforementioned general formula (1).

In the case where the electron-accepting compound having a crosslinkable group is an ion compound, the counter cation is an iodonium cation, a sulfonium cation, a carbocation, an oxonium cation, an ammonium cation, a phosphonium cation, a cycloheptyltrienyl cation, or a ferrocenium cation having a transition metal and is more preferably an iodonium cation, a sulfonium cation, a carbcation, or an ammonium cation, particularly preferably an iodonium cation.

Preferred as the iodonium cation is a structure represented by the aforementioned general formula (2) and further preferable structure is the same.

Specifically, preferred as the iodonium cation are a diphenyliodonium cation, a bis(4-t-butylphenyl)iodonium cation, a 4-t-butoxyphenylphenyliodonium cation, a 4-methoxyphenylphenyliodonium cation, a 4-isopropylphenyl-4-methylphenyliodonium cation, and the like.

Specifically, preferred as the sulfonium cation are a triphenylsulfonium cation, a 4-hydroxyphenyldiphenylsulfonium cation, a 4-cyclohexylphenyldiphenylsulfonium cation, a 4-methanesulfonylphenyldiphenylsulfonium cation, a (4-t-butoxyphenyl)diphenylsulfonium cation, a bis(4-t-butoxyphenyl)phenylsulfonium cation, a 4-cyclohexylsulfonylphenyldiphenylsulfonium cation, and the like.

Specifically, preferred as the carbocation are tri-substituted carbonium cations such as a triphenylcarbonium cation, a tri(methylphenyl)carbonium cation, and a tri(dimethylphenyl)carbonium cation.

Specifically, preferred as the ammonium cation are trialkylammonium cations such as a trimethylammonium cation, a triethylammonium cation, a tripropylammonium cation, a tributylammonium cation, and a tri(n-butyl)ammonium cation; N,N-dialkylanilinium cations such as an N,N-diethylanilinium cation and an N,N-2,4,6-pentamethylanilinium cation; dialkylammonium cations such as a di(isopropyl) ammonium cation and a dicyclohexylammonium cation; and the like.

Specifically, preferred as the phosphonium cation are tetraarylphosphonium cations such as a tetraphenylphosphonium cation, a tetrakis(methylphenyl)phosphonium cation, and a tetrakis(dimethylphenyl)phosphonium cation; tetraalkylphosphonium cations such as a tetrabutylphosphonium cation and a tetrapropylphosphonium cation; and the like.

Of these, in view of film stability of the compound, the iodonium cations, carbocations, and sulfonium cations are preferred and iodonium cations are more preferable.

The crosslinkable group that Ar of the above general formula (1) may have and the crosslinkable group that the ion compound having a crosslinkable group of the invention has are preferably selected from the following group Z of crosslinkable groups. Since these crosslinkable group crosslink at a temperature sufficiently higher than room temperature, stability as the composition for a charge-transporting film is high and the crosslinking bond has high stability against oxidation and reduction, so that the stability as the organic electroluminescent element is considered to be also high.

[Group Z of Crosslinkable Groups]

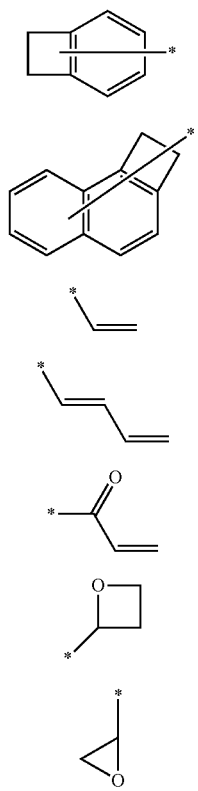

The asterisk (*) in the formulae (Z-1) to (Z-7) represents a bonding hand. They may further have arbitrary substituents. As preferable substituents, there may be mentioned cyclic/non-cyclic aliphatic group-derived groups having 30 or less carbon atoms, aryl groups having 30 or less carbon atoms, alkyloxy groups having 30 or less carbon atoms, aralkyl groups having 30 or less carbon atoms, and the like.

The substituents of the crosslinkable group represented by the formula (Z-1) or the formula (Z-2) may be bonded to each other to form a ring.

The crosslinkable groups represented by the formulae (Z-3) to (Z-7) preferably have no substituent.

Among the above crosslinkable groups, in view of high stability after crosslinking and an improvement in element working life, (Z-1) to (Z-4) are preferred and the crosslinkable groups represented by (Z-1) or (Z-2) are particularly preferred.

The crosslinkable group represented by (Z-1) further preferably has the structure represented by the above formula (7) and preferable substituents that may be present are cyclic/non-cyclic aliphatic group-derived groups having 30 or less carbon atoms and aryl groups having 30 or less carbon atoms but it is further preferred to have no substituent.

The crosslinkable group represented by (Z-2) further preferably has the structure represented by the above formula (8) and preferable substituents that may be present are cyclic/non-cyclic aliphatic group-derived groups having 30 or less carbon atoms and aryl groups having 30 or less carbon atoms but it is further preferred to have no substituent.

The electron-accepting compound having a crosslinkable group of the invention is an ion compound and preferably has the crosslinkable group in the counter anion of the ion compound. The counter anion is preferably a chemical species represented by the aforementioned formula (6).

The reason why the crosslinkable group is preferably bonded to the counter anion of the ion compound is as follows. In the case where the electron-accepting compound is an ion compound, when the electron-accepting compound and the hole-transporting compound to be mentioned later are co-present in the composition, the electron-accepting compound extracts an electron from the hole-transporting compound. As a result, a counter anion of the electron-accepting compound and a cation radical of the hole-transporting compound are formed and the counter anion of the electron-accepting compound and the cation radical of the hole-transporting compound form an ion pair. This corresponds to the charge-transporting ion compound to be mentioned later. In the case where the electron-accepting compound having a crosslinkable group of the invention is an ion compound, the counter anion is further bonded to the hole-transporting compound having a crosslinkable group by the crosslinkable group and thereby, it is considered that the charge-transporting ion compound is stabilized, durability is improved, and the working life of the organic electroluminescent element is improved. Further, since the counter anion of the electron-accepting compound which is bonded to the hole-transporting compound is not freed, it is considered that the diffusion of the counter anion of the electron-accepting compound into the luminescent layer is suppressed and thus the luminescent efficiency is improved. Moreover, even in the case where the counter anions of the electron-accepting compound are crosslinked and bonded to each other, the molecular weight thereof is increased by the bonding and the compounds are less prone to diffuse, so that the case is preferred. Furthermore, even in the case where the counter anions of a plurality of the electron-accepting compounds are crosslinked and bonded to each other, the probability of crosslinking and bonding to the hole-transporting compound at one site is high and, by crosslinking the cluster, which is obtained by crosslinking and bonding the counter anions of a plurality of the electron-accepting compounds, with the hole-transporting compound, the compounds do not diffuse, so that the case is preferred.

The number of the crosslinkable groups of the electron-accepting compound having a crosslinkable group of the invention is preferably 4 or less groups in one molecule. This is because, in this range, the number of the remaining crosslinkable groups without causing the crosslinking reaction is small and the organic electroluminescent element produced using the electron-accepting compound having a crosslinkable group of the invention is stabilized. Since the number of the remaining crosslinkable groups without causing the crosslinking reaction is further smaller, the number of the crosslinkable groups is more preferably 3 or less groups in one molecule.

[I-4. Specific Examples of Electron-Accepting Compound]

The following will mention specific examples of the electron-accepting compound to be used in the invention but the invention is not limited thereto.

(B-1)
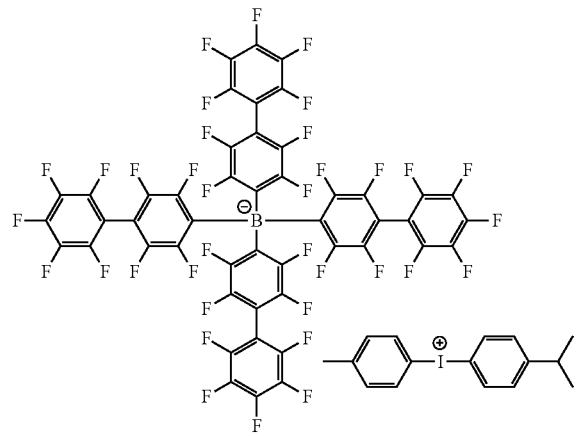
(B-2)
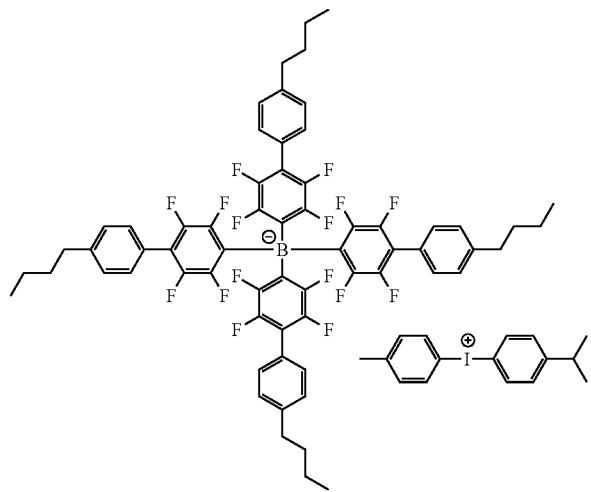
(B-3)
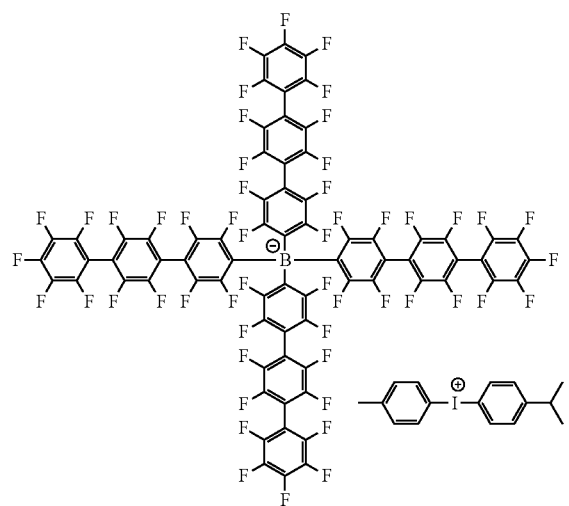
(B-4)
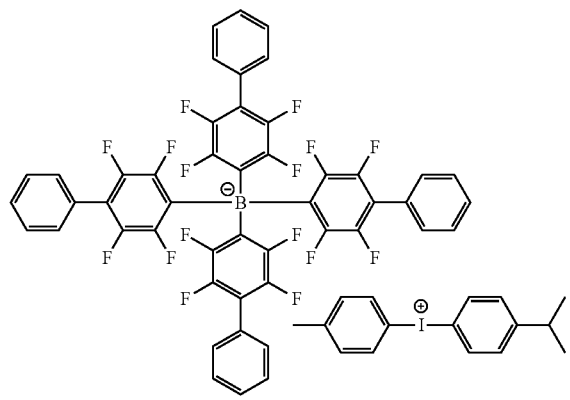
(B-5)
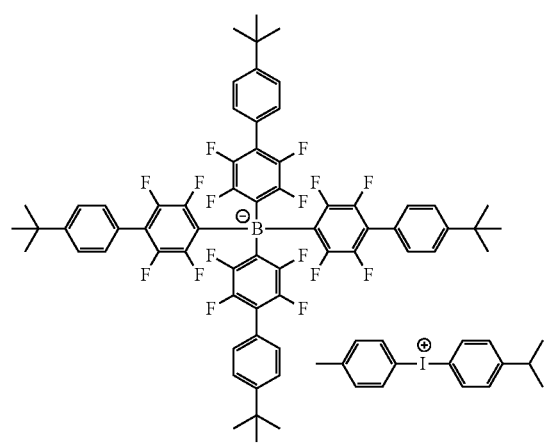
(B-6)
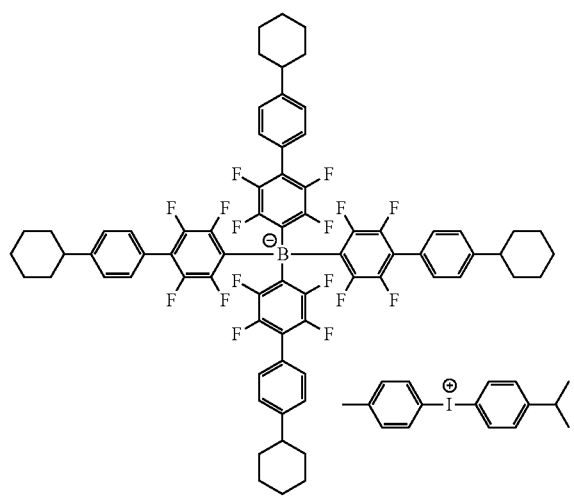

-continued
(B-7)
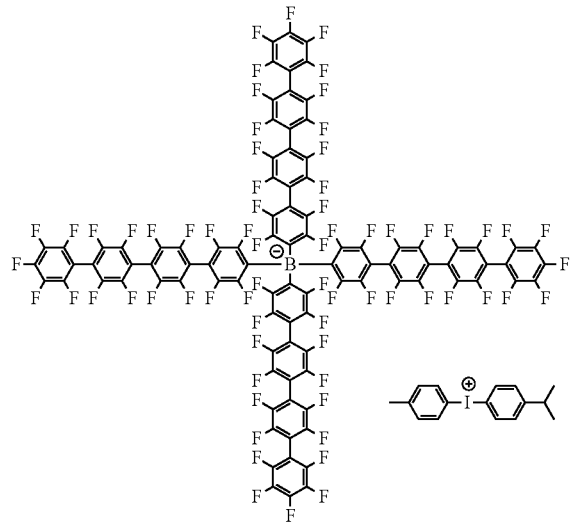
(B-8)
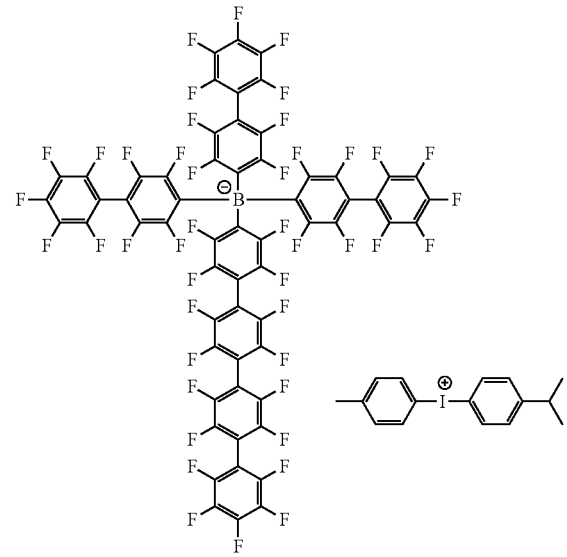
(B-9)
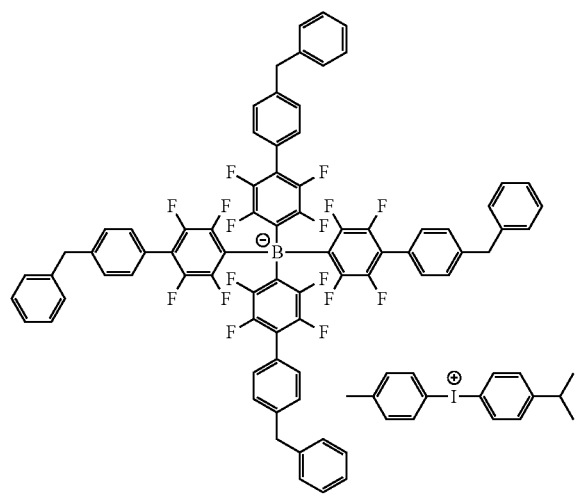
(B-10)
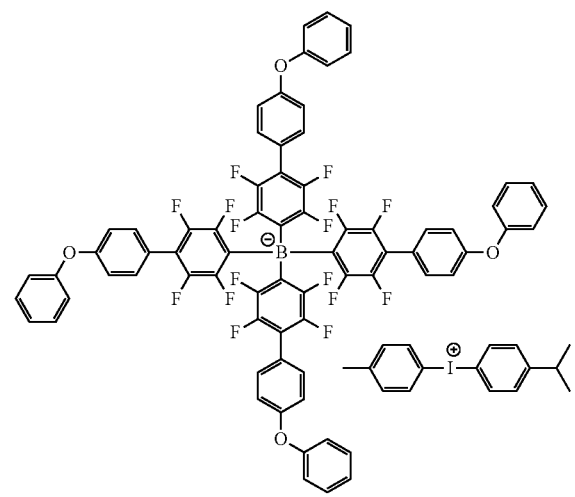
(B-11)
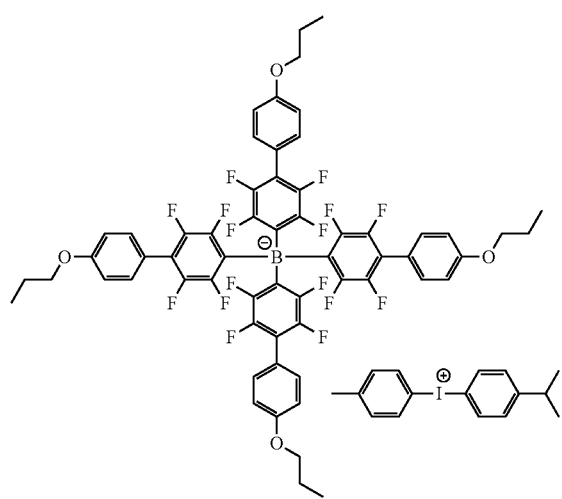
(B-12)
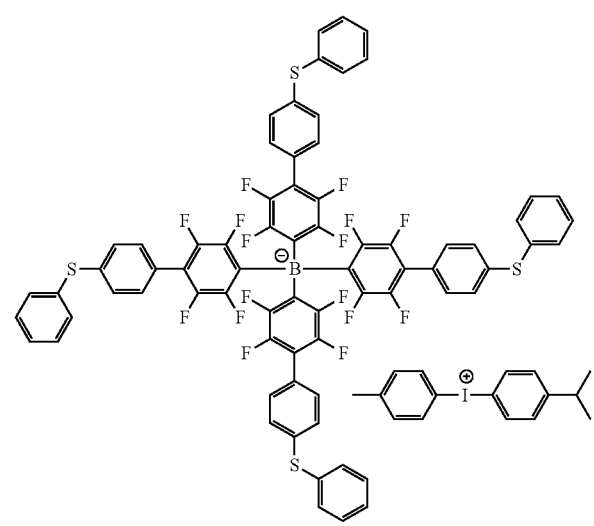

(B-13)
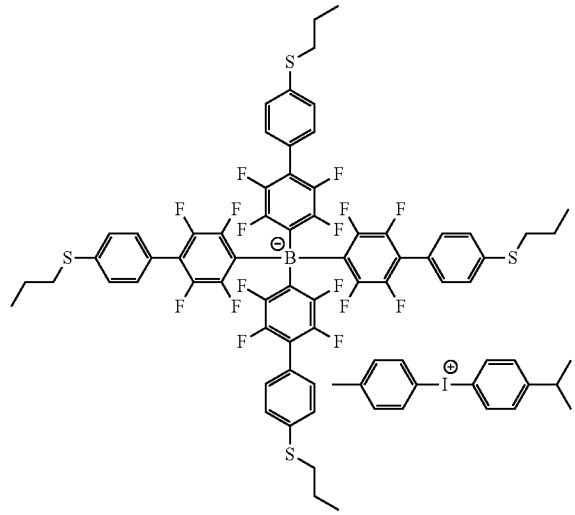
(B-14)
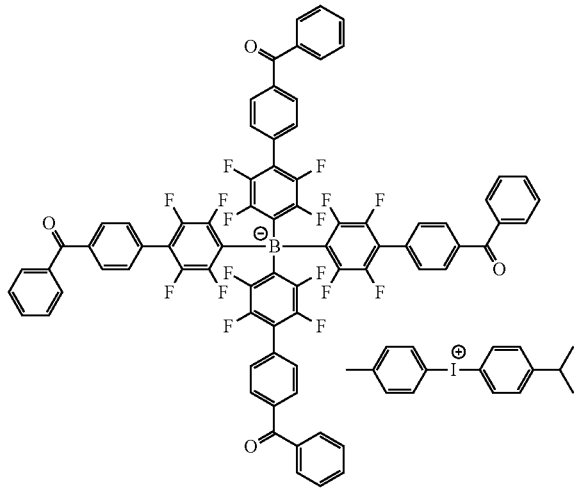
(B-15)
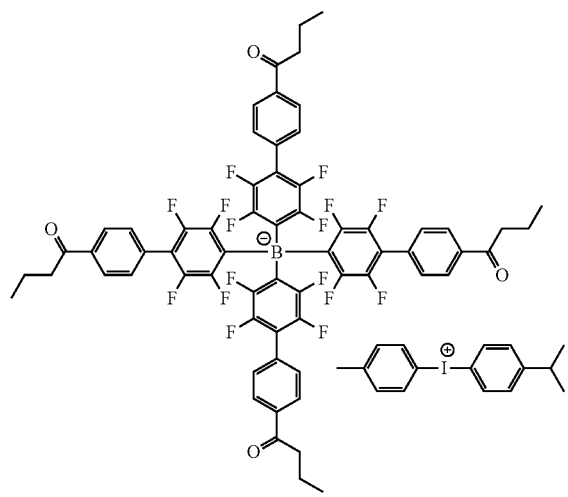
(B-16)
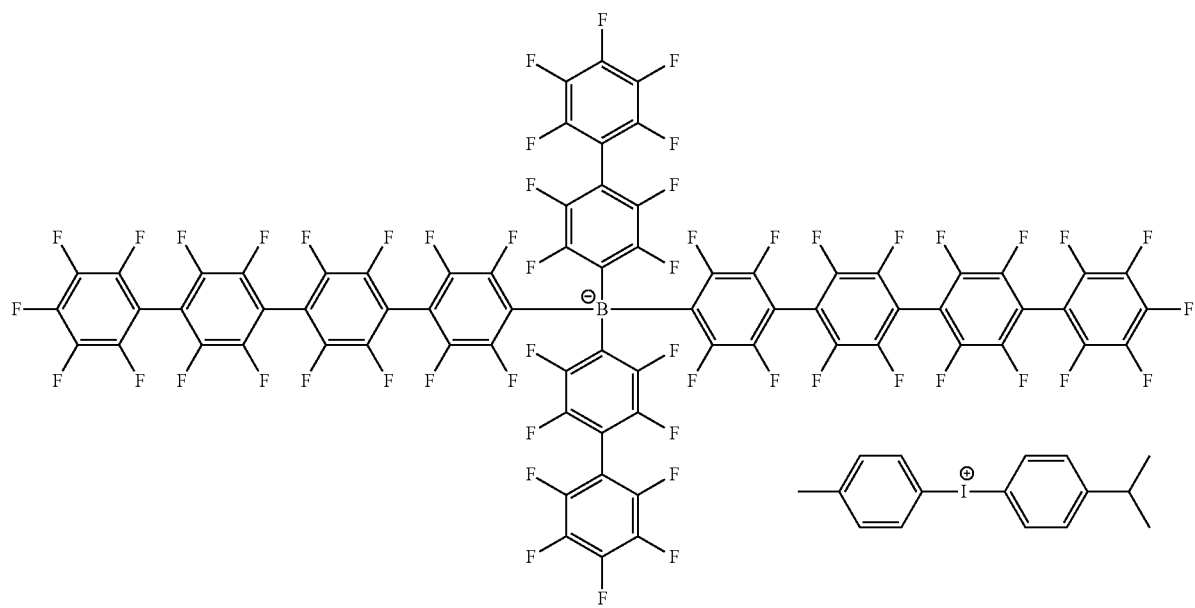

(B-17)
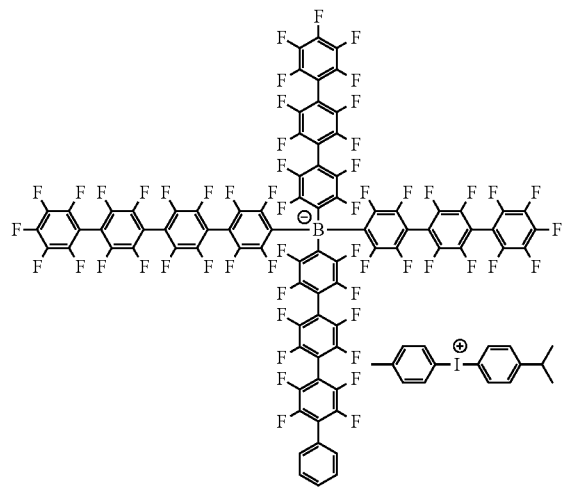
(B-18)
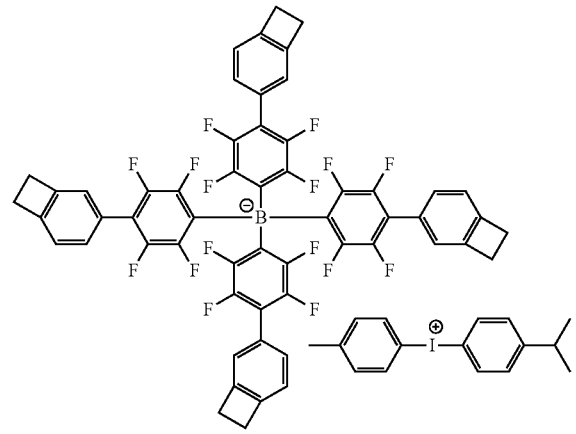
(B-19)
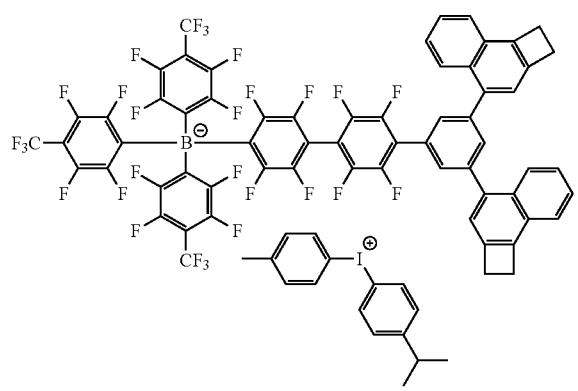
(B-20)
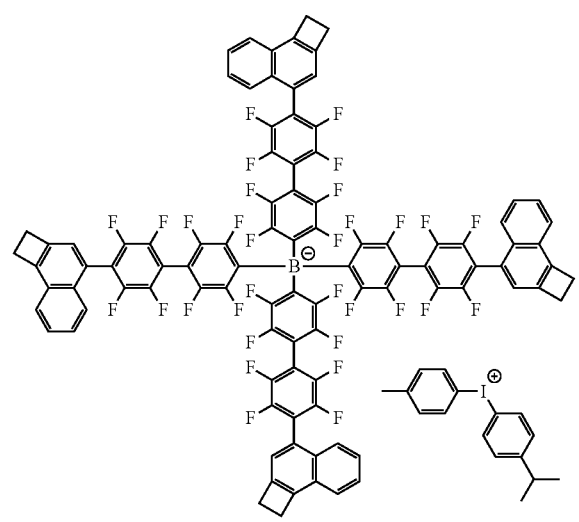

(B-21)
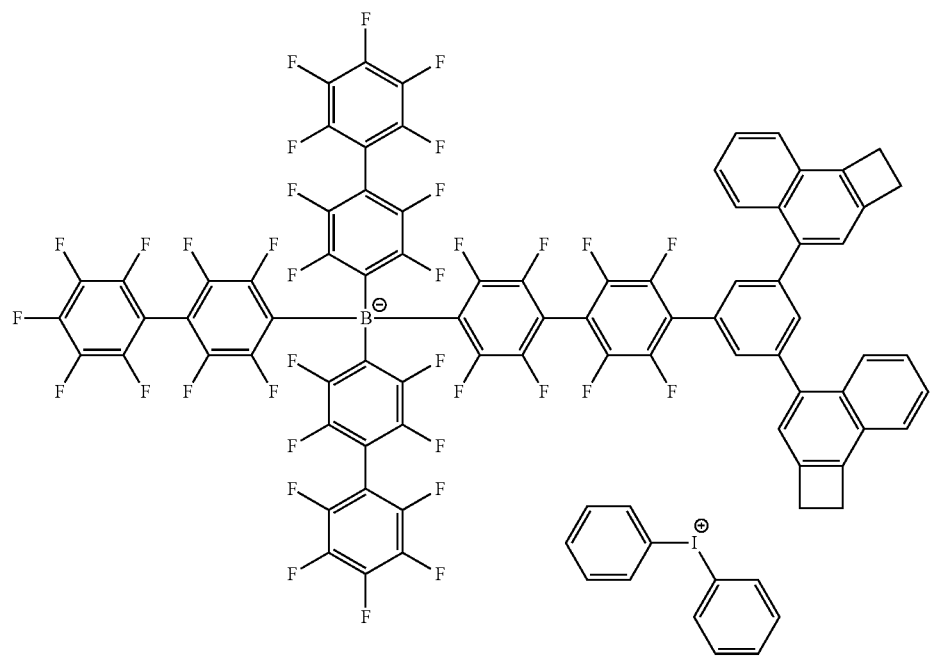
(B-22)
(B-23)
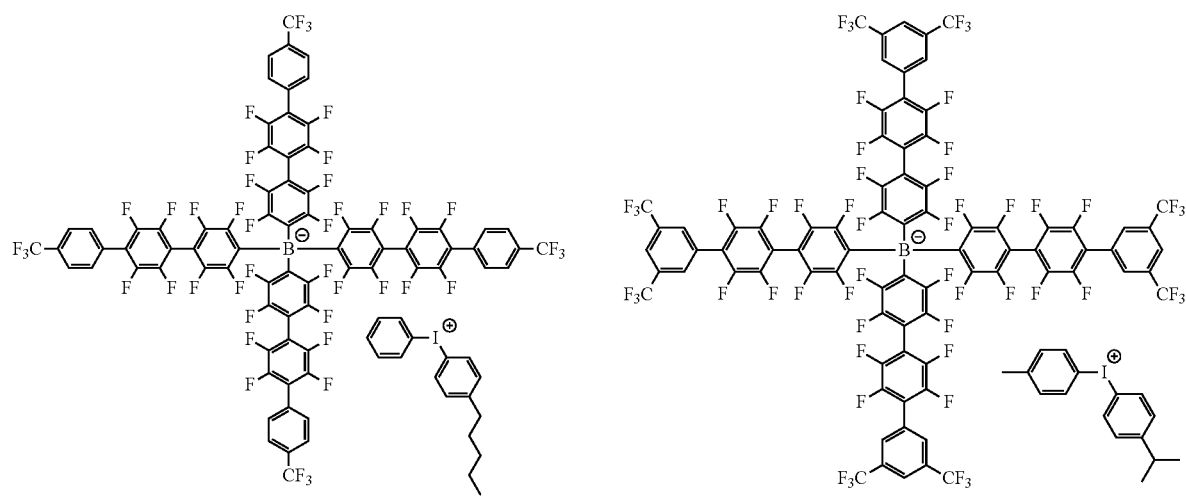
(B-24)
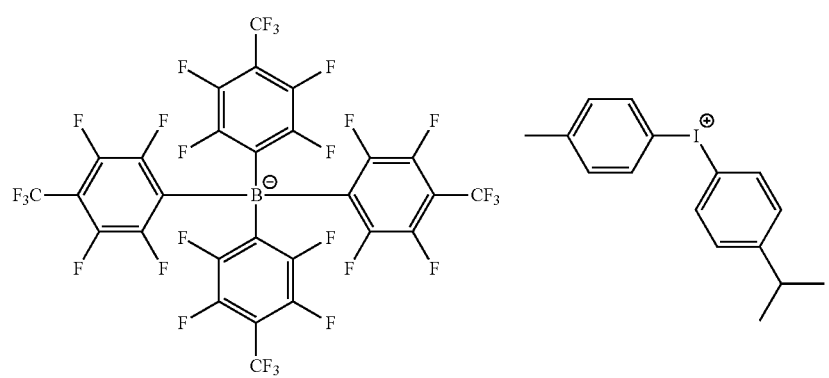

(B-25)
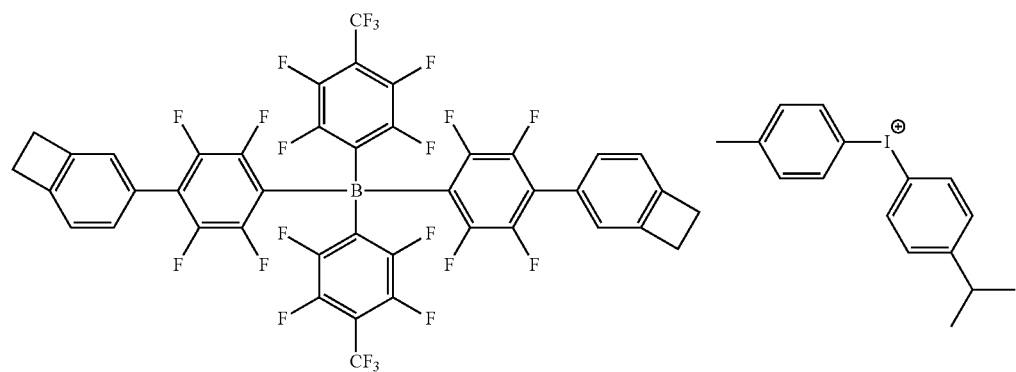
(B-26)
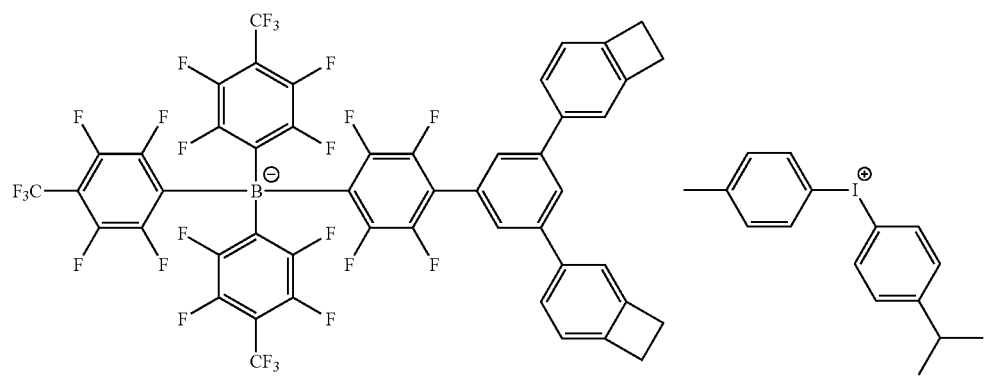
(B-27)
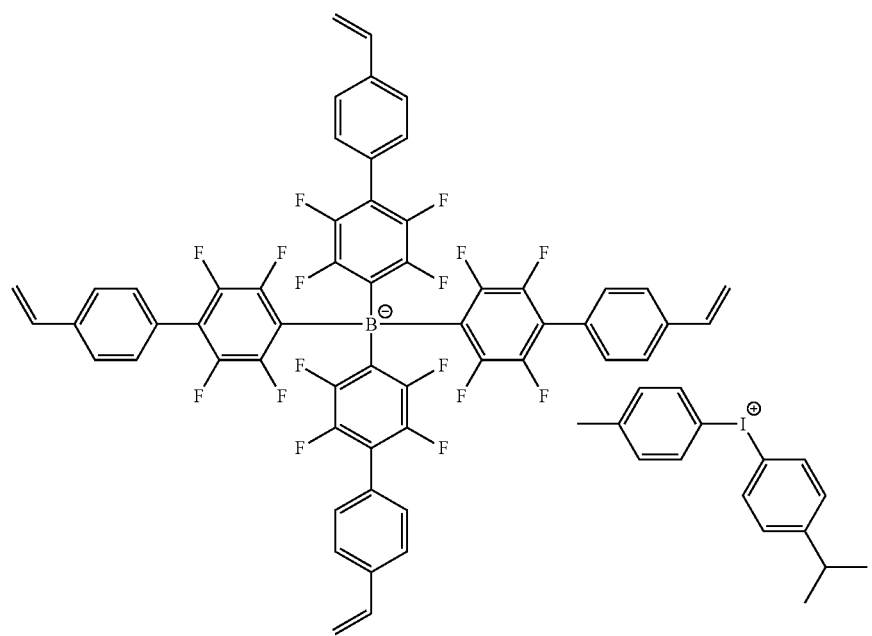

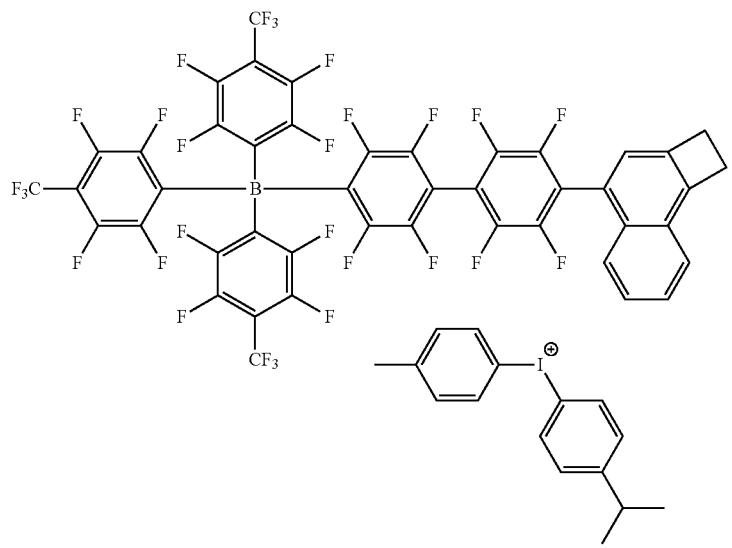

(B-28)

Of the above specific examples, in view of electron-accepting properties, heat resistance, and solubility, preferred are compounds of (B-1) and (B-2). Further, in view of having a crosslinkable group, (B-18), (B-19), (B-20), (B-21), (B-25), (B-26), (B-27), and (B-28) are preferred. Owing to high stability as a composition for a charge-transporting film, (B-18), (B-19), (B-20), (B-21), (B-25), (B-26), and (B-28) are more preferred and, owing to the stability of the organic electroluminescent element, (B-19), (B-21), (B-25), (B-26), and (B-28) are particularly preferred.

The method for manufacturing the above-explained electron-accepting compound is not particularly limited and it can be manufactured by using various methods. Examples thereof include methods described in Chem. Rev. vol. 66, 243 page (1966) and J. Org. Chem., vol. 53, 5571 page (1988), and the like.

[II. Composition for Charge-Transporting Film]

The composition for a charge-transporting film of the invention is a composition containing the aforementioned electron-accepting compound of the invention and the charge-transporting compound to be mentioned later (hereinafter optionally referred to as "composition (A) for a charge-transporting film of the invention" or a composition containing a charge-transporting ion compound composed of a cation radical of the charge-transporting compound to be mentioned later and a counter anion that is a part of the aforementioned electron-accepting compound of the invention (hereinafter optionally referred to as "composition (B) for a charge-transporting film of the invention". For convenience, the composition (A) for a charge-transporting film and the composition (B) for a charge-transporting film are separately explained but the composition for a charge-transporting film of the invention also includes a composition containing the electron-accepting compound of the invention, the charge-transporting compound to be mentioned later, and the charge-transporting ion compound composed of a cation radical of the charge-transporting compound to be mentioned later and a counter anion that is a part of the aforementioned electron-accepting compound of the invention.

Incidentally, the compositions (A) and (B) for a charge-transporting film of the invention are compositions capable of being widely used in the uses of a charge-transporting material (compositions for a charge-transporting material). However, since the composition is usually formed into a film and used as a charge-transporting material film, i.e., a "charge-transporting film", particularly in the present Description, it is called as a "composition for a charge-transporting film".

Moreover, in the invention, the charge-transporting compound is usually also a hole-transporting compound. Accordingly, in the present Description, the hole-transporting compound should be able to be read as the charge-transporting compound unless otherwise stated.

[II-1. Composition (A) for Charge-Transporting Film]
[II-1-1. Hole-Transporting Compound]

Next, there will be explained the hole-transporting compound as the charge-transporting compound to be contained in the composition for a charge-transporting film of the invention (hereinafter optionally abbreviated as a "hole-transporting compound of the invention").

The hole-transporting compound of the invention preferably has a crosslinkable group. This is because, after film formation, the film can be made insoluble by crosslinking the hole-transporting compound and it becomes possible to further apply another layer to form a film on the film.

As the hole-transporting compound of the invention, a compound having an ionization potential of 4.5 eV to 5.5 eV is preferred in view of hole-transporting ability. Examples thereof include aromatic amine compounds, phthalocyanine derivatives or porphyrine derivatives, oligothiophene derivatives, and the like. Of these, from the standpoints of amorphousness, solubility in a solvent, and visible light transmittance, aromatic amine compounds are preferred.

Among the aromatic amine compounds, in the invention, aromatic tertiary amine compounds are especially preferred. Herein, aromatic tertiary amine compounds are compounds having an aromatic tertiary amine structure, and also include compounds having a group derived from an aromatic tertiary amine.

The aromatic tertiary amine compounds are not particularly limited in the kind thereof. However, from the standpoint of a surface-smoothing effect, aromatic tertiary amine polymer compounds that are polymer compounds having a weight-average molecular weight of 1,000 or more and 1,000,000 or less are more preferred.

Preferred examples of the aromatic tertiary amine polymer compounds include polymer compounds having a repeating unit represented by the following formula (11).

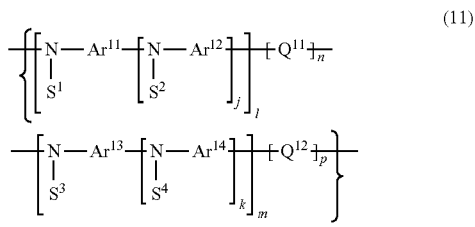

(11)

In the above formula (11), j, k, l, m, n, and p each independently represent an integer of 0 or more, provided that 1+m≤1.

In the above formula (11), $Ar^{11}$, $Ar^{12}$, and $Ar^{14}$ each independently represent a divalent aromatic ring group having 30 or less carbon atoms which may have a substituent, and these groups may have a substituent. $Ar^{13}$ represents a divalent aromatic ring group having 30 or less carbon atoms which may have a substituent or a divalent group represented by the following formula (12), $Q^{11}$ and $Q^{12}$ each independently represent an oxygen atom, a sulfur atom, or a hydrocarbon chain having 6 or less carbon atoms which may have a substituent, and $S^1$ to $S^4$ each independently represent a group shown by the following formula (13).

As examples of the aromatic ring groups of $Ar^{11}$, $Ar^{12}$, and $Ar^{14}$, there may be mentioned a monocycle, a condensed ring of 2 to 6 rings, and a group in which two or more of the aromatic groups are linked. Specific examples thereof include a divalent group derived from a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, fluorene ring, a biphenyl group, a terphenyl group, a quaterphenyl group, a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, or azulene ring. Of these, since the negative charge is efficiently delocalized and stability and heat resistance are excellent, preferred is a divalent group derived from a benzene ring, a naphthalene ring, a fluorene ring, a pyridine ring, or a carbazole ring or a biphenyl group.

Examples of the aromatic ring group of $Ar^{13}$ are the same as in the case of $Ar^{11}$, $Ar^{12}$, and $Ar^{14}$.

$Ar^{13}$ is also preferably a divalent group represented by the following formula (12).

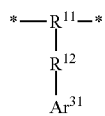

(12)

In the above formula (12), $R^{11}$ represents a trivalent group derived from an alkyl group, an aromatic ring group, or an alkyl group having 40 or less carbon atoms and an aromatic ring group, and they may have a substituent. $R^{12}$ represents a divalent group derived from an alkyl group, an aromatic ring group, or an alkyl group having 40 or less carbon atoms and an aromatic ring group, and they may have a substituent. $Ar^{31}$ represents a monovalent aromatic ring group or a monovalent crosslinkable group, and these groups may have a substituent. The asterisk (*) represents a bonding hand with the nitrogen atom of the formula (11).

Specific examples of the aromatic ring group of $R^{11}$ include trivalent groups derived from a phenyl ring, a naphthalene ring, a carbazole ring, a dibenzofuran ring, a dibenzothiophene ring, and a linked ring having 30 or less carbon atoms resulting from the linkage of these rings.

Specific examples of the alkyl group of $R^{11}$ include trivalent groups derived from methane, ethane, propane, isopropane, butane, isobutene, and pentane and the like.

Specific examples of the aromatic ring group of $R^{12}$ include divalent groups derived from a phenyl ring, a naphthalene ring, a carbazole ring, a dibenzofuran ring, a dibenzothiophene ring, and a linked ring having 30 or less carbon atoms resulting from the linkage of these rings.

Specific examples of the alkyl group of $R^{12}$ include divalent groups derived from methane, ethane, propane, isopropane, butane, isobutene, and pentane, and the like.

Specific examples of the aromatic ring group of $Ar^{31}$ include monovalent groups derived from a phenyl ring, a naphthalene ring, a carbazole ring, a dibenzofuran ring, a dibenzothiophene ring, and a linked ring having 30 or less carbon atoms resulting from the linkage of these rings.

Examples of the crosslinkable group of $Ar^{31}$ include a group derived from a benzocyclobutene ring, a naphthocyclobutene ring, or an oxetane ring, a vinyl group, an acryl group, and the like. Preferred are crosslinkable groups described in the aforementioned group Z of crosslinkable groups and more preferred crosslinkable groups are also the same. From the standpoint of the stability of the compound, a group derived from a benzocyclobutene ring or a naphthocyclobutene ring is preferred. These are crosslinkable groups represented by the above formula (7) or the above formula (8).

$S^1$ to $S^4$ are each independently a group represented by the following formula (13).

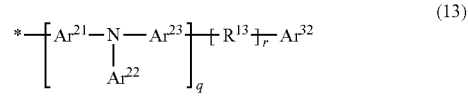

(13)

In the above formula (13), q and r represent each an integer of 0 or more.

$Ar^{21}$ and $Ar^{22}$ each independently represent a divalent aromatic ring group and these groups may have a substituent. $Ar^{22}$ represents a monovalent aromatic ring group which may have a substituent, and $R^{13}$ represents a divalent group derived from an alkyl group, an aromatic ring group, or an alkylgroup and an aromatic ring group, and these groups may have a substituent. $Ar^{32}$ represents a monovalent aromatic ring group or a monovalent crosslinkable group, and these groups may have a substituent. The asterisk (*) represents a bonding hand with the nitrogen atom of the general formula (11).

Examples of the aromatic ring groups of $Ar^{21}$ and $Ar^{23}$ are the same as in the case of $Ar^{11}$, $Ar^{12}$, and $Ar^{14}$.

As examples of the aromatic ring groups of $Ar^{22}$ and $Ar^{32}$, there may be mentioned a monocycle, a condensed ring of 2 to 6 rings, and a group in which two or more of the aromatic groups are linked. Specific examples thereof include a monovalent group derived from a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, or fluorene ring, a biphenyl group, a terphenyl group, a quaterphenyl group, or a monovalent group derived from a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, or azulene ring. Of these, since the negative charge is efficiently delocalized and stability and heat resistance are excellent, preferred is a monovalent group derived from a benzene ring, a naphthalene ring, a fluorene ring, a pyridine ring, or a carbazole ring or a biphenyl group.

Examples of the alkyl group or the aromatic ring group of $R^{13}$ are the same as in the case of $R^{12}$.

Examples of the crosslinkable group of $Ar^{32}$ is not particularly limited but, preferable examples thereof include a group derived from a benzocyclobutene ring, a naphthocyclobutene ring, or an oxetane ring, a vinyl group, an acryl group, and the like.

Any of the above $Ar^{11}$ to $Ar^{14}$, $R^{11}$, $R^{12}$, $Ar^{21}$ to $Ar^{23}$, $Ar^{31}$ to $Ar^{32}$, $Q^{11}$, and $Q^{12}$ may have a substituent unless it departs from the purpose of the invention. The molecular weight of the substituent is usually 400 or less, especially preferably about 250 or less. The kind of the substituent is not particularly limited but, as examples thereof, one or two or more selected from the following group W of substituents.

[Group W of Substituents]

Alkyl groups having usually 1 or more and usually 10 or less, preferably 8 or less carbon atoms, such as a methyl group and an ethyl group; alkenyl groups having usually 2 or more and usually 11 or less, preferably 5 or less carbon atoms, such as a vinyl group; alkynyl groups having usually 2 or more and usually 11 or less, preferably 5 or less carbon atoms, such as an ethynyl group; alkoxy groups having usually 1 or more and usually 10 or less, preferably 6 or less carbon atoms, such as a methoxy group and an ethoxy group; aryloxy groups having usually 4 or more, preferably 5 or more and usually 25 or less, preferably 14 or less carbon atoms, such as a phenoxy group, a naphthoxy group, and a pyridyloxy group; alkoxycarbonyl groups having usually 2 or more and usually 11 or less, preferably 7 or less carbon atoms, such as a methoxycarbonyl group and an ethoxycarbonyl group; dialkylamino groups having usually 2 or more and usually 20 or less, preferably 12 or less carbon atoms, such as a dimethylamino group and a diethylamino group; diarylamino groups having usually 10 or more, preferably 12 or more and usually 30 or less, preferably 22 or less carbon atoms, such as a diphenylamino group, a ditolylamino group, and an N-carbazolyl group; arylalkylamino groups having usually 6 or more, preferably 7 or more and usually 25 or less, preferably 17 or less carbon atoms, such as a phenylmethylamino group; acyl groups having usually 2 or more and usually 10 or less, preferably 7 or less carbon atoms, such as an acetyl group and a benzoyl group; halogen atoms such as a fluorine atom and a chlorine atom; haloalkyl groups having usually 1 or more and usually 8 or less, preferably 4 or less carbon atoms, such as a trifluoromethyl group; alkylthio groups having usually 1 or more and usually 10 or less, preferably 6 or less carbon atoms, such as a methylthio group and an ethylthio group; arylthio groups having usually 4 or more, preferably 5 or more and usually 25 or less, preferably 14 or less carbon atoms, such as a phenylthio group, a naphthylthio group, and a pyridylthio group; silyl groups having usually 2 or more, preferably 3 or more and usually 33 or less, preferably 26 or less carbon atoms, such as a trimethylsilyl group and a triphenylsilyl group; siloxy groups having usually 2 or more, preferably 3 or more and usually 33 or less, preferably 26 or less carbon atoms, such as a trimethylsiloxy group and a triphenylsiloxy group; a cyano group; aromatic hydrocarbon groups having usually 6 or more and usually 30 or less, preferably 18 or less carbon atoms, such as a phenyl group and a naphthyl group; aromatic heterocyclic groups having usually 3 or more, preferably 4 or more and usually 28 or less, preferably 17 or less carbon atoms, such as a thienyl group and a pyridyl group.

Particularly, of the polymer compounds having a repeating unit represented by the formula (11), a polymer compound having a repeating unit represented by the following formula (14) is preferred since hole injection-transport properties become very high.

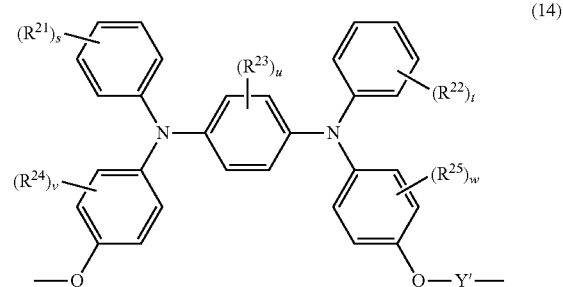

(14)

In the above formula (14), $R^{21}$ to $R^{25}$ each independently represents an arbitrary substituent. Specific examples of $R^{21}$ to $R^{25}$ are the same as the substituents described in the aforementioned [Group W of Substituents].

s and t each independently represents an integer of 0 or more and 5 or less.

u, v, and w each independently represents an integer of 0 or more and 4 or less.

As preferable examples of the aromatic tertiary amine polymer compound, polymer compounds containing repeating unit(s) represented by the following formula (15) and/or formula (16).

(15)

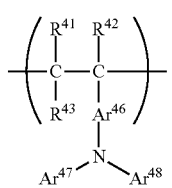

(16)

In the above formulae (15) and (16), $Ar^{45}$, $Ar^{47}$, and $Ar^{48}$ each independently represents a monovalent aromatic hydrocarbon group which may have a substituent or a monovalent aromatic heterocyclic group which may have a substituent. $Ar^{44}$ and $Ar^{46}$ each independently represents a divalent aromatic hydrocarbon group which may have a substituent or a divalent aromatic heterocyclic group which may have a substituent. $R^{41}$ to $R^{43}$ each independently represents a hydrogen atom or an arbitrary substituent.

Specific examples and preferable examples of $Ar^{45}$, $Ar^{47}$, $Ar^{48}$, $Ar^{44}$, and $Ar^{46}$ and examples of the substituent which they may have are the same as in the case of $Ar^{22}$, $Ar^{31}$, $Ar^{32}$, $Ar^{11}$, and $Ar^{14}$, respectively. Preferred as $R^{41}$ to $R^{43}$ are a hydrogen atom or substituents described in [Group W of Substituents] and further preferred is a hydrogen atom, an alkyl group, an alkoxy group, an amino group, an aromatic hydrocarbon group, or an aromatic heterocyclic group.

The following will mention preferable specific examples of the repeating units represented by the formulae (15) and (16) but the invention should not be construed as being limited thereto.

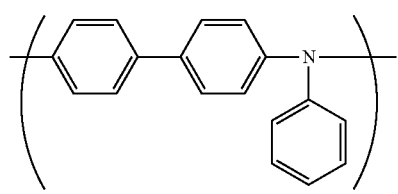

(P-31)

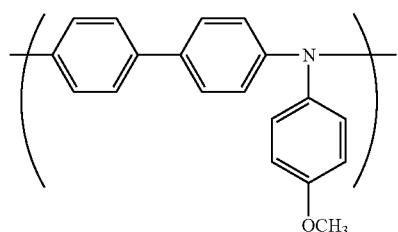

(P-32)

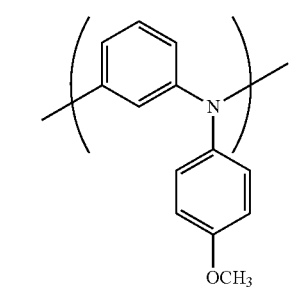

(P-33)

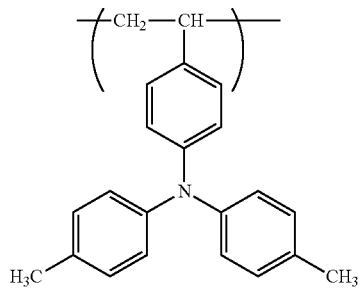

(P-34)

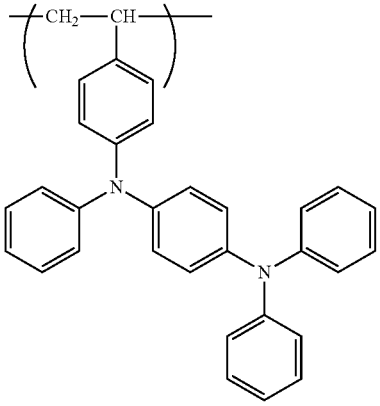

(P-35)

Besides, as the aromatic amine compound applicable as the hole-transporting compound of the invention, there may be mentioned conventionally known compounds which have been utilized as hole injection/transporting layer-forming materials in organic electroluminescent elements. Examples thereof include aromatic diamine compounds in which tertiary aromatic amine units are linked, such as 1,1-bis(4-di-p-tolylaminophenyl)cyclohexane (JP-A-59-194393); aromatic amines which contain two or more tertiary amines and in which two or more condensed aromatic rings are substituted on the nitrogen atom, represented by 4,4'-bis[N-(1-naphthyl)-N-phenylamino]biphenyl (JP-A-5-234681); aromatic triamines which are derivatives of triphenylbenzne and have a star-burst structure (U.S. Pat. No. 4,923,774); aromatic diamines such as N,N'-diphenyl-N,N'-bis(3-methylphenyl)biphenyl-4,4'-diamine (U.S. Pat. No. 4,764,625); α,α,α',α'-tetramethyl-α,α'-bis(4-di-p-tolylaminophenyl)-p-xylene (JP-A-3-269084); triphenylamine derivatives which are sterically asymmetrical as a whole molecule (JP-A-4-129271); compound in which a plurality of aromatic diamino groups are substituted on a pyrenyl group (JP-A-4-175395); aromatic diamines in which tertiary aromatic amine units are linked with an ethylene group (JP-A-4-264189); aromatic diamines having a styryl structure (JP-A-4-290851); ones in which aromatic tertiary amine units are linked with a thiophene group (JP-A-4-304466); star-burst type aromatic triamines (JP-A-4-308688); benzylphenyl compounds (JP-A-4-364153); ones in which tertiary amines are linked with a fluorene group (JP-A-5-25473); triamine compounds (JP-A-5-239455); bisdipyridylamino-biphenyl derivatives (JP-A-5-320634); N,N,N-triphenylamine derivatives (JP-A-6-1972); aromatic diamines having a phenoxazine structure (JP-A-7-138562); diaminophenylphenantri dine derivatives (JP-A-7-252474); hydrozone compounds (JP-A-2-311591); silazane compounds (U.S. Pat. No. 4,950,950); silanamine derivatives (JP-A-6-49079);

phosphamine derivatives (JP-A-6-25659); quinacridone compounds; and the like. These aromatic amine compounds may be used as a mixture of two or more thereof according to need.

Moreover, as other specific examples of the aromatic amine compound applicable as the hole-transporting compound of the invention, metal complexes of 8-hydroxyquinoline derivatives having a diarylamino group may be mentioned. In the above metal complexes, the central metal is selected from any of alkali metals, alkaline-earth metals, Sc, Y, V, Cr, Mn, Fe, Co, Ni, Cu, Zn, Cd, Al, Ga, In, Si, Ge, Sn, Sm, Eu, and Tb and 8-hydroxyquinoline that is a ligand has one or more diarylamino groups as substituent(s) but may have an arbitrary substituent other than the diarylamino group.

Preferable specific examples of phthalocyanine derivatives or porphyrin derivatives applicable as the hole-transporting compound of the invention include porphyrin, 5,10,15,20-tetraphenyl-21H,23H-porphyrin, 5,10,15,20-tetraphenyl-21H,23H-porphyrin cobalt (II), 5,10,15,20-tetraphenyl-21H,23H-porphyrin copper (II), 5,10,15,20-tetraphenyl-21H,23H-porphyrin zinc (II), 5,10,15,20-tetraphenyl-21H,23H-porphyrin vanadium (IV) oxide, 5,10,15,20-tetra(4-pyridyl)-21H,23H-porphyrin, 29H, 31H-phthalocyanine copper (II), phthalocyanine zinc (II), phthalocyanine titanium, phthalocyanine oxide magnesium, phthalocyanine lead, phthalocyanine copper (II), 4,4',4'',4'''-tetraaza-29H,31H-phthalocyanine, and the like.

As preferable specific examples of the oligothiophene derivatives applicable as the hole-transporting compound of the invention, α-sexithiophene and the like are mentioned.

Incidentally, the molecular weight of these hole-transporting compounds is, except the case of a polymer compounds having a specific repeating unit as described above, in the range of usually 5,000 or less, preferably 3,000 or less, more preferably 2,000 or less, still more preferably 1,700 or less, particularly preferably 1,400 or less and usually 200 or more, preferably 400 or more, more preferably 600 or more. When the molecular weight of the hole-transporting compound is too high, synthesis and purification are difficult and thus the case is not preferred, while when the molecular weight is too low, there is a concern that heat resistance may decrease and also the case is not preferred.

The composition (A) for a charge-transporting film of the invention may contain any one of the aforementioned hole-transporting compounds singly or may contain two or more thereof. In the case where two or more kinds of the hole-transporting compounds are contained, the combination is arbitrary but it is preferred to use one or more aromatic tertiary amine polymer compounds and one or more other hole-transporting compounds in combination. As the kind of the hole-transporting compound to be used in combination with the aforementioned polymer compound, the aromatic amine compound is preferred.

The content of the hole-transporting compound in the composition (A) for a charge-transporting film of the invention is controlled to a range that satisfies the ratio thereof to the aforementioned electron-accepting compound. In the case of using two or more compositions for a charge-transporting film in combination, the total content of them is controlled so as to be included in the above range.

[II-1-2, Method for Preparing Composition (A) for Charge-Transporting Film]

The composition (A) for a charge-transporting film of the invention is prepared by mixing at least the electron-accepting compound of the invention described in detail in the section of [I. Electron-Accepting Compound] and the hole-transporting compound according to the invention described in detail in the section of [II-1-1. Hole-Transporting Compound]. Any one of the aforementioned electron-accepting compounds may be contained alone or two or more thereof may be contained in any combination and in any proportion. The same shall apply to the hole-transporting compound.

The content of the electron-accepting compound in the composition (A) for a charge-transporting film of the invention is, as a value relative to the hole-transporting compound, usually 0.1% by mass or more, preferably 1% by mass or more and usually 100% by mass or less, preferably 40% by mass or less. When the content of the electron-accepting compound is the above lower limit or more, free carriers (cation radicals of the hole-transporting compound) can be sufficiently formed and the case is preferred. When the content is the above upper limit or less, a sufficient charge-transporting ability can be secured and the case is preferred. In the case where two or more electron-accepting compounds are used in combination, the total content of them is controlled so as to be included in the above range. The same shall apply to the hole-transporting compound.

[II-2. Composition (B) for Charge-Transporting Film]

The composition (B) for a charge-transporting film of the invention is a composition containing the charge-transporting ion compound composed of the cation radical of the aforementioned hole-transporting compound according to the invention and the counter anion of the aforementioned electron-accepting compound of the invention.

[II-2-1. Cation Radical of Charge-Transporting Compound]

The cation radical of the charge-transporting compound that is a cation of the charge-transporting ion compound of the invention is a chemical species obtained by removing one electron from an electrically neutral compound shown in the aforementioned [II-1-1. Hole-Transporting Compound]. However, in the case where the hole-transporting compound is a polymer compound, it is a chemical species containing a partial structure obtained by removing one electron from an electrically neutral partial structure in the polymer structure.

Particularly, it is preferred that the cation radical of the hole-transporting compound is an aromatic tertiary amine compound having a partial structure represented by the following formula (10) from the standpoints of having a proper oxidation/reduction potential and obtaining a stable charge-transporting ion compound.

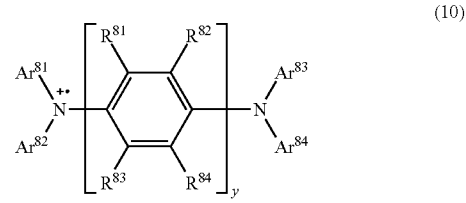

(10)

In the above formula (10), y represents an integer of 1 to 5, $Ar^{81}$ to $Ar^{84}$ each independently represents an aromatic hydrocarbon group which may have a substituent or an aromatic heterocyclic group which may have a substituent, and $R^{81}$ to $R^{84}$ each independently represents an arbitrary group.

Specific examples and preferable examples of $Ar^{81}$ to $Ar^{84}$ and examples of the substituent which they may have are the same as in the case of $S^1$ to $S^4$ in the aforementioned formula (11).

Specific examples and preferable examples of $R^{81}$ to $R^{84}$ are the same as $R^{41}$ to $R^{43}$ in the aforementioned formula (16).

The aromatic tertiary amine compound having the partial structure represented by the general formula (10) may be a low-molecular compound having only one partial structure represented by the general formula (10) or a plurality thereof.

Also, the aromatic tertiary amine compound having the partial structure represented by the general formula (10) may be a polymer compound having a plurality of the partial structures represented by the general formula (10).

In the case where the aromatic tertiary amine compound having the partial structure represented by the general formula (10) is a polymer compound, the amine compound may be bonded to a polymer structure at any one of $Ar^{81}$ and $Ar^{82}$, or at any one of $Ar^{83}$ and $Ar^{84}$, or may be linked to the main chain of the polymer compound at both of any one of $Ar^{81}$ and $Ar^{82}$ and any one of $Ar^{83}$ and $Ar^{84}$.

In the case where the aromatic tertiary amine compound having the partial structure represented by the general formula (10) is a polymer compound, preferred is a polymer compound in which the amine compound is linked to the main chain of the polymer compound at both of any one of $Ar^{81}$ or $Ar^{82}$ and any one of $Ar^{83}$ or $Ar^{84}$.

Moreover, the cation radical of the hole-transporting compound is preferably a chemical species having a structure obtained by removing one electron from the repeating unit of an aromatic tertiary amine polymer compound having a weight-average molecular weight of 1,000 or more and 1,000,000 or less in view of heat resistance and film-forming properties. The term of "removing one electron from the repeating unit of an aromatic tertiary amine polymer compound" means to remove one electron from a part or all of a plurality of repeating units contained in the aromatic tertiary amine polymer compound. The removal of one electron from a part of a plurality of repeating units contained in the aromatic tertiary amine polymer compound stabilizes the aromatic tertiary amine polymer compound and is preferred. As the aromatic tertiary amine polymer compound, those described in the aforementioned [II-1-1. Hole-Transporting Compound] are mentioned. Preferable examples thereof are also the same as the aforementioned description.

[II-2-2. Charge-Transporting Ion Compound]

The charge-transporting ion compound of the invention is a compound in which the cation radical of the aforementioned charge-transporting compound and the counter anion that is a part of the aforementioned electron-accepting compound of the invention are ionically bonded.

The charge-transporting ion compound of the invention can be obtained by mixing the electron-accepting compound of the invention and the hole-transporting compound of the invention and is easily dissolved in various solvents.

The molecular weight of the charge-transporting ion compound of the invention is, except the case where the cation radical is derived from a polymer compound, in the range of usually 1,000 or more, preferably 1,200 or more, further preferably 1,400 or more and usually 9,000 or less, preferably 5,000 or less, further preferably 4,000 or less.

[II-2-3. Method for Preparing Composition (B) for Charge-Transporting Film]

The charge-transporting ion compound of the invention is preferably prepared by dissolving the electron-accepting compound of the invention and the hole-transporting compound of the invention in a solvent, followed by mixing. In the solution, the hole-transporting compound is oxidized by the electron-accepting compound of the invention to form a cation radical, thus forming the charge-transporting ion compound of the invention which is an ion compound of the counter anion of the electron-accepting compound of the invention and the cation radical of the hole-transporting compound.

At this time, the hole-transporting compound of the invention is preferably an aromatic tertiary amine compound. This is because, by mixing in the solution, the probability of the presence of the electron-accepting compound of the invention in the vicinity of the amine structure that is an easily oxidizable site of the aromatic tertiary amine compound becomes high, the aromatic tertiary amine compound is oxidized by the electron-accepting compound of the invention to form a cation radical, and thus the ion compound of the counter anion of the electron-accepting compound of the invention and the cation radical of the aromatic tertiary amine compound is easily formed. At this time, it is preferred to heat the solution in view of acceleration of the above reaction.

Moreover, it is also preferred to heat a mixture of the electron-accepting compound of the invention and the hole-transporting compound of the invention for preparation. The mixture is preferably a film formed by applying a solution obtained by dissolving the mixture of the electron-accepting compound of the invention and the hole-transporting compound of the invention in a solvent. This is because, by heating the mixture, the electron-accepting compound of the invention and the hole-transporting compound of the invention diffuse each other in the mixture, the probability of presence of the electron-accepting compound of the invention in the vicinity of the amine structure that is an easily oxidizable site of the aromatic tertiary amine compound becomes high and thus the ion compound of the counter anion of the electron-accepting compound of the invention and the cation radical of the aromatic tertiary amine compound is easily formed.

The composition (B) for a charge-transporting film of the invention may contain one kind of the aforementioned charge-transporting ion compound of the invention alone or may contain two or more thereof. It is preferred to contain one kind alone or two kinds of the charge-transporting ion compounds, and it is more preferred to contain one kind alone thereof. This is because the variation in ionization potential of the charge-transporting ion compound is small and thus the hole-transport properties are excellent.

The composition containing one kind alone or two kinds of the charge-transporting ion compounds is a composition prepared using only two kinds or only three kinds of the electron-accepting compound(s) and the hole-transporting compound(s) in total and is a composition prepared using at least one electron-accepting compound of the invention and at least one hole-transporting compound.

The composition (B) for a charge-transporting film of the invention also preferably contains the hole-transporting compound explained in [II-1-1. Hole-Transporting Compound] other than the charge-transporting ion compound. The content of the hole-transporting compound in the composition (B) for a charge-transporting film of the invention is, as a value relative to the charge-transporting ion compound, preferably 10% by mass or more, further preferably 20% by mass or more, more preferably 30% by mass or more and preferably 10,000% by mass or less, further preferably 1,000% by mass or less.

Since the charge-transporting film formed from the composition (B) for a charge-transporting film of the invention exhibits high hole injection-transporting ability by transfer-ring the positive charge from the charge-transporting ion compound to the neighboring neutral hole-transporting compound, the ratio of the charge-transporting ion compound to the neutral hole-transporting compound is preferably about 1:100 to 100:1, further preferably about 1:20 to 20:1 as a mass ratio.

[II-3. Solvent Etc.]

The composition (A) for a charge-transporting film of the invention may contain the other ingredients, for example, solvents, various additives, and the like according to need, in addition to the aforementioned electron-accepting compound and hole-transporting compound. Particularly, in the case where the charge-transporting film is formed by a wet film formation method using the composition for a charge-transporting film of the invention, it is preferred to make the aforementioned electron-accepting compound and hole-transporting compound a dissolved state using a solvent.

The charge-transporting ion compound of the invention is formed by mixing the electron-accepting compound of the invention and the hole-transporting compound of the invention. That is, the charge-transporting ion compound is a compound derived from the electron-accepting compound and the hole-transporting compound. Therefore, the composition (B) for a charge-transporting film containing the charge-transporting ion compound of the invention may contain the other ingredients according to need similarly to the composition (A) for a charge-transporting film. Thus, in the case where the charge-transporting film is formed by a wet film formation method, it is preferred to make the charge-transporting ion compound of the invention a dissolved state using a solvent.

As the solvent contained in the composition (A) for a charge-transporting film of the invention, the kind is not particularly limited as long as it can dissolve both of the aforementioned electron-accepting compound and the aforementioned hole-transporting compound. Also, as the solvent contained in the composition (B) for a charge-transporting film of the invention, the kind is not particularly limited as long as it can dissolve the charge-transporting ion compound of the invention. Herein, the solvent that dissolves the aforementioned electron-accepting compound and the aforementioned hole-transporting compound is a solvent that dissolves the hole-transporting compound in an amount of usually 0.005% by mass or more, preferably 0.5% by mass or more, further preferably 1% by mass or more and is a solvent that dissolves the electron-accepting compound in an amount of usually 0.001% by mass or more, preferably 0.1% by mass or more, further preferably 0.2% by mass or more. Since the aforementioned electron-accepting compound to be used in the invention has high solubility, various solvents are applicable. Also, the solvent that dissolves the charge-transporting ion compound of the invention is a solvent that dissolves the charge-transporting ion compound in an amount of usually 0.001% by mass or more, preferably 0.1% by mass or more, further preferably 0.2% by mass or more.

Moreover, the solvent to be contained in the composition (A) for a charge-transporting film of the invention is preferably one which does not contain a deactivating substance that may deactivate the electron-accepting compound, the hole-transporting compound, and a free carrier (cation radical) generated from mixing them or one that generates the deactivating substance. Similarly, the solvent to be contained in the composition (B) for a charge-transporting film of the invention is preferably one which does not contain a deactivating substance that may deactivate the charge-transporting ion compound of the invention or one that generates the deactivating substance.

Since the electron-accepting compound, the hole-transporting compound, a free carrier (cation radical) generated from mixing them, and the charge-transporting ion compound of the invention are thermodynamically and electrochemically stable, it is possible to use various solvents. Examples of preferable solvents include ether-based solvents and ester-based solvents. Specifically, examples of the ether-based solvents include aliphatic ethers such as ethylene glycol dimethyl ether, ethylene glycol diethyl ether, and propylene glycol-1-monomethyl ether acetate (PGMEA); and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole; and the like. Examples of the ester-based solvents include aliphatic esters such as ethyl acetate, n-butyl acetate, ethyl lactate, and n-butyl lactate; aromatic esters such as phenyl acetate, phenyl propionate, methyl benzoate, ethyl benzoate, propyl benzoate, and n-butyl benzoate; and the like. One of these solvents may be used alone, or any desired two or more thereof may be used in combination in any desired proportion.

As usable solvent besides the aforementioned ether-based solvents and ester-based solvents, examples thereof include aromatic hydrocarbon-based solvents such as benzene, toluene, and xylene, amide-based solvents such as N,N-dimethylformamide and N,N-dimethylacetamide, dimethyl sulfoxide, and the like. One of these solvents may be used alone, or any desired two or more thereof may be used in combination in any desired proportion. Also, one or two or more of these solvents may be used in combination with one or two or more of the aforementioned ether-based solvents and ester-based solvents. Particularly, the aromatic hydrocarbon-based solvents such as benzene, toluene, and xylene have low ability of dissolving the electron-accepting compound and the free carrier (cation radical), it is preferred to use the solvents while mixing with the ether-based solvents and ester-based solvents.

In the case of using the solvent, the concentration of the solvent relative to the composition (A) or (B) for a charge-transporting film of the invention is in the range of usually 10% by mass or more, preferably 30% by mass or more, more preferably 50% by mass or more and usually 99.999% by mass or less, preferably 99.99% by mass or less, further preferably 99.9% by mass or less. Incidentally, in the case where two or more solvents are mixed and used, the concentration is controlled so that the total of these solvents satisfies the range.

In the case where the composition (A) or (B) for a charge-transporting film of the invention is used in the organic electroluminescent element, since the organic electroluminescent element is formed by superposing layers composed of a number of organic compounds, it is required that individual layers are all even layers. In the case where the layers are formed by a wet film formation method, when moisture is present in a solution for thin film formation (composition for a charge-transporting film), water mixes into a coated film and the homogeneity of the film is impaired, so that the water content in the solution is preferably as little as possible. Moreover, in general, since many materials which are considerably deteriorated by moisture, such as the cathode, the presence of water is not preferred also from the standpoint of element deterioration.

Specifically, the water content in the composition (A) or (B) for a charge-transporting film of the invention is preferably suppressed to usually 1% by mass or less, especially 0.1% by mass or less, further 0.05% by mass or less.

Examples of methods for obtaining a composition having a reduced water content include to use nitrogen gas sealing or a desiccant, to dehydrate the solvent beforehand, and to use a solvent in which water has low solubility. Of these, it is preferred to use a solvent in which water has low solubility, from the standpoint of avoiding the phenomenon in which the solution film absorbs atmospheric moisture to be whitened in the coating step.

In the case of using the composition in uses of film formation by a wet film formation method, the composition (A) or (B) for a charge-transporting film of the invention preferably contains a solvent in which water has low solubility at 25° C., specifically a solvent in which water has a solubility of 1% by mass or less, preferably 0.1% by mass or less, in a concentration of usually 10% by mass or more, especially 30% by mass or more, particularly 50% by mass or more relative to the whole composition.

Besides, as ingredients which the composition (A) or (B) for a charge-transporting film of the invention may contain, binder resins, applicability improvers, and the like may be mentioned. The kinds and contents of these ingredients may be appropriately selected depending on the uses of the composition for a charge-transporting film.

[II-4. Relationship Between Compositions (A) and (B) for Charge-Transporting Film]

The charge-transporting film formed of the composition (A) for a charge-transporting film of the invention is excellent in heat resistance and also has high hole injection/transporting ability. The reason why such excellent properties are obtained is explained below.

The composition (A) for a charge-transporting film of the invention contains the aforementioned electron-accepting compound and hole-transporting compound. The cation in the electron-accepting compound of the invention has a hypervalent central atom and, since the positive charge is widely delocalized, has high electron-accepting properties. Thereby, electron transfer from the hole-transporting compound to the electron-accepting compound is generated to form a charge-transporting ion compound composed of a cation radical of the hole-transporting compound and a counter anion. Since the cation radical of the hole-transporting compound becomes a charge carrier, the electric conductivity of the charge-transporting film can be enhanced. Namely, when the composition (A) for a charge-transporting film of the invention is prepared, it is considered that the charge-transporting ion compound composed of the cation radical of the hole-transporting compound and the counter anion of the electron-accepting compound of the invention is at least partly formed.

For example, in the case where electron transfer from a hole-transporting compound represented by the following formula (17) to an electron-accepting compound represented by the formula (1') is generated, a charge-transporting ion compound composed of a cation radical of the hole-transporting compound represented by the formula (18) and a counter anion is formed.

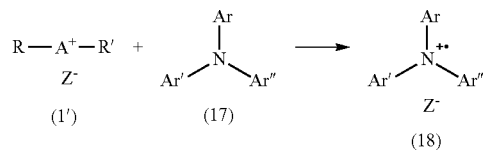

Moreover, the electron-accepting compound of the invention has a characteristic that it efficiently forms a charge-transporting ion compound composed of a cation radical of a hole-transporting compound and a counter anion without being easily sublimed or decomposed. Owing to such a characteristic, the electron-accepting compound of the invention and the charge-transporting ion compound composed of the cation radical of the hole-transporting compound and the counter anion exhibit excellent heat resistance and electrochemical durability. As a result, the heat resistance and electrochemical durability of the composition for a charge-transporting film are also improved.

Furthermore, the composition (B) for a charge-transporting film of the invention contains the charge-transporting ion compound excellent in heat resistance and electrochemical durability. As a result, the composition (B) for a charge-transporting film is excellent in heat resistance and electrochemical durability.

As above, since the charge-transporting film formed of the composition (A) or (B) for a charge-transporting film of the invention and the charge-transporting film containing the charge-transporting ion compound of the invention have both of excellent heat resistance and high hole injection-transporting ability, the film can be suitably used in various uses such as an organic electroluminescent element, an electrophotographic photoreceptor, a photoelectric conversion element, an organic solar cell, and an organic rectifying element. Of these, it is preferably used as a material of an organic electroluminescent element. Particularly, it is suitable to use it in uses of forming the charge-transporting layer of the organic electroluminescent element. Especially, by forming a layer, particularly a hole injection layer, present between the anode and the luminescent layer of the organic electroluminescent element, the electrical junction between the anode and the hole-transporting compound or the luminescent layer is improved and thus the operating voltage is lowered and, at the same time, stability at continuous operation is also improved.

In the case where the charge-transporting film formed of the composition (A) or (B) for a charge-transporting film of the invention is used in various uses, it is preferred to shape the film into a film shape. The method to be used for film formation is not particularly limited but, since the electron-accepting compound and the charge-transporting ion compound are excellent in the solubility in a solvent, they can be suitably used for thin film formation by a wet film formation method.

Particularly, in the case where the charge-transporting film is formed using the composition (A) or (B) for a charge-transporting film of the invention, it is possible to heat and dry it at high temperature at the time of film formation and thus the convenience of the manufacturing process and the element properties can be improved. Particularly, in the case where the hole injection layer of the organic electroluminescent element is formed by a wet film formation method, it becomes possible to perform heating and drying at high temperature that is useful as a method for reducing the water content in the coated film. Thus, there can be reduced the presence of moisture and residual solvent that become factors for remarkably deteriorating the organic electroluminescent element. Moreover, since the charge-transporting film formed of the composition (A) or (B) for a charge-transporting film of the invention has high heat resistance, the heat resistance of the manufactured organic electroluminescent element is also remarkably improved.

Further, since the electron-accepting compound of the invention has high heat resistance and high electron-accepting properties and also has appropriate sublimation properties, the compound can be also used for the thin film formation by a vacuum deposition method besides the above wet film formation method. Thus, the freedom in the design of the organic electroluminescent element and the like can be expanded.

[III. Use of Electron-Accepting Compound Having Crosslinkable Group]

In the case where the charge-transporting compound having a crosslinkable group is a polymer compound (hereinafter described as a "charge-transporting polymer compound") and the electron-accepting compound is a low-molecular compound and has a crosslinkable group, it is preferred that the crosslinking starting temperature of the crosslinkable group of the charge-transporting polymer compound is different from the crosslinking starting temperature of the crosslinkable group of the electron-accepting compound.

In the charge-transporting film formed of the composition (A) or (B) for a charge-transporting film of the invention, there is generated a site where a part of the hole-transporting compound and the electron-accepting compound are ionically bonded. The site where a part of the hole-transporting compound and the electron-accepting compound are ionically bonded has a bulky structure as compared with the other parts of the hole-transporting compound to which the electron-accepting compound is not ionically bonded. Therefore, it is considered that stress is prone to be generated in the hole-transporting compound between the site at which the electron-accepting compound is present and the site at which it is not present.

The stress is relieved by large thermal motion of the hole-transporting compound by heat at the time of heating but, when it is returned to ordinary temperature, it is considered that the stress remains in the hole-transporting compound at the neighborhood where the electron-accepting compound intervenes.

In the case where the crosslinkable group of the hole-transporting compound and the crosslinkable group of the electron-accepting compound are the same, it is considered that the residual stress resulting from these causes may become a factor of inviting charge localization to hinder an improvement of luminescent efficiency during applying current, or may become a factor of lowering the chemical stability of the hole-transporting compound to hinder lengthening of working life.

Here, there is considered a mixed system of a compound having a crosslinkable group whose crosslinking starting temperature is relatively low and a compound having a crosslinkable group whose crosslinking starting temperature is relatively high. In the case where the mixed system is crosslinked under a temperature at which the crosslinkable group whose crosslinking starting temperature is high is crosslinkable, in general, since the crosslinking reaction more easily occur at higher temperature, it is considered that the crosslinkable groups whose crosslinking starting temperature is relatively low are prone to react with each other even under a certain temperature.

Therefore, in the case where the crosslinking starting temperature of crosslinkable group of the electron-accepting compound is lower than the crosslinking starting temperature of crosslinkable group of the hole-transporting compound, it is considered that the crosslinking reaction between the electron-accepting compounds is first started. At this time, since the existence ratio of the electron-accepting compound in the film is smaller than that of the hole-transporting compound, it is considered that the probability that mutually crosslinkable electron-accepting compounds are present neighborhood is low and thus the domain where the electron-accepting compounds are crosslinked with each other becomes minute one. The existence ratio of the unreacted monomolecular electron-accepting compound then decreases and, at the time when the hole-transporting compound is crosslinked, it is considered that the proportion of crosslinking the hole-transporting compound with the electron-accepting compound decreases, and hence the stress is less prone to remain in the film.

Contrarily, in the case where the crosslinking starting temperature of crosslinkable group of the hole-transporting compound is lower than the crosslinking starting temperature of crosslinkable group of the electron-accepting compound, it is considered that the crosslinking reaction between the hole-transporting compounds is first started. At this time, by appropriate diffusion of the electron-accepting compound, it is considered that the stress caused by the thermal motion of the hole-transporting compound is relieved. Therefore, at the time when the hole-transporting compounds are crosslinked with each other, since they are not fixed with the electron-accepting compound, it is considered that the stress hardly remains in the film. Moreover, since the hole-transporting compounds are first crosslinked with each other while relieving the stress, the product is considered to be more stable than that in the case where the crosslinking starting temperature of crosslinkable group of the electron-accepting compound is lower than the crosslinking starting temperature of crosslinkable group of the hole-transporting compound.

As above, in the case where the crosslinking starting temperature is different between the crosslinkable group of the hole-transporting compound and the crosslinkable group of the electron-accepting compound, stress is less prone to remain in the film and thus it is considered that there are an effect of improving the luminescent efficiency and an effect of improving the working life of the organic electroluminescent element. The effects are considered to be higher in the case where the crosslinking starting temperature of crosslinkable group of the hole-transporting compound is lower than the crosslinking starting temperature of crosslinkable group of the electron-accepting compound.

Further, in the case where the hole-transporting compound is a polymer compound, the effects are considered to be remarkable. The reason is considered that, in a polymer compound, the thermal motion of the molecule by high temperature at the time of heating is large, the shape of the molecule fixed by crosslinking becomes complex, and residual stress when it returns to ordinary temperature is large. Therefore, it is considered that the aforementioned effects are high.

The crosslinking starting temperature is a temperature at which the crosslinkable groups mutually start bonding with an increase in temperature. A preferable range of the crosslinking starting temperature is usually 100° C. or higher and 400° C. or lower, from the standpoint of the stability of the compound, more preferably 130° C. or higher and 350° C. or lower, particularly preferably 140° C. or higher and 300° C. or lower, and most preferably 150° C. or higher and 280° C. or lower.

Figure 2:
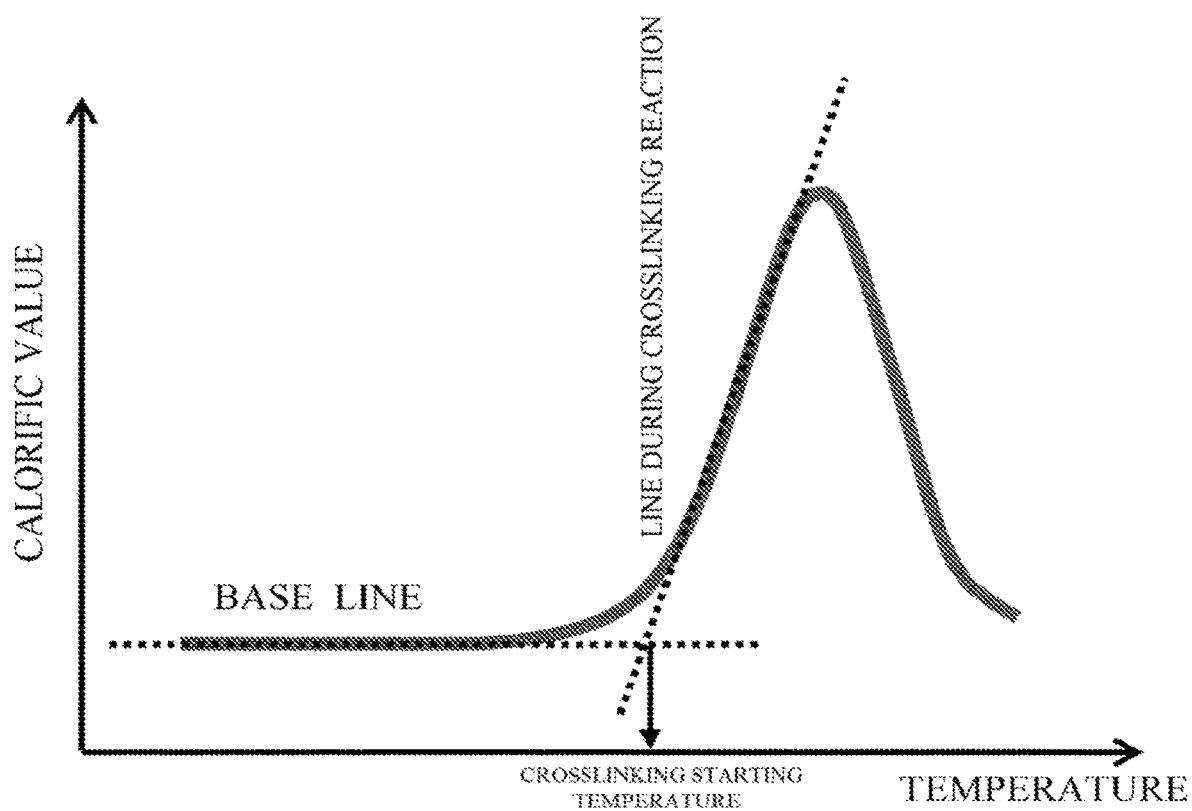
FIG. 2 is a graph illustrating a measurement method of crosslinking starting temperature of the crosslinkable group of the present invention.

The crosslinking starting temperature is measured by a DSC method. In the DSC method, there is obtained a chart in which temperature is taken on a horizontal axis, a calorific value is taken on a vertical axis, and the calorific value at the time of heating a sample at a constant rate is plotted. FIG. 2 shows a schematic view of the chart. In the chart, the region before heat generation is taken as a base line, the region where the calorific value increases at a constant rate is regarded as a line during a crosslinking reaction, and the temperature of the point at which these two lines cross when they are extrapolated is determined as the crosslinking starting temperature.

As the crosslinking starting temperature of the crosslinkable group in the invention, as mentioned later, the crosslinking starting temperature measured using a compound in which the crosslinkable group is disposed on a model compound is regarded as crosslinking starting temperature of the crosslinkable group.

The composition for a charge-transporting film of the invention, as mentioned later, is subjected to a heating treatment as mentioned later after thin film formation by the wet film formation method and drying. In the case where the composition for a charge-transporting film of the invention contains the electron-accepting compound having a crosslinkable group or the charge-transporting compound having a crosslinkable group, a crosslinking reaction occurs at the time of the heating treatment. In the case where the crosslinking starting temperature of the crosslinkable group of the hole-transporting polymer compound is different from the crosslinking starting temperature of the crosslinkable group of the electron-accepting compound, when higher crosslinking starting temperature is taken as TH(° C.), lower crosslinking starting temperature is taken as TL(° C.), and the temperature at the time of the above heating treatment is taken as TB(° C.), The relationship between TH and TL is preferably TH−TL≥10, further preferably TH−TL≥20.

Moreover, the relationship among TH, TL, and TB is preferably TL<TB, further preferably TL<TB≤TL+10, still more preferably TL<TB≤TH.

The reason is that, when TB is higher than TL, a compound having lower crosslinking temperature is more prone to cause the crosslinking reaction. Moreover, when TB is TL+10° C. or lower, the crosslinking reaction of the compound having higher crosslinking temperature is slower than the crosslinking reaction of the compound having lower crosslinking temperature, so that the aforementioned effect is easily obtained. Even when the temperature is equal to or lower than the crosslinking starting temperature, as shown in FIG. 2, since heat generation is observed in the DSC measurement, it is considered that a part of the crosslinkable groups are slowly crosslinked. This is because, even when the temperature of the system is equal to or lower than the activation energy of the crosslinking, a crosslinkable group in a state higher than the activation energy is present probabilistically in a small number. Therefore, even when TB is equal to or lower than TH, the crosslinkable group having higher crosslinking starting temperature also causes the crosslinking reaction but, since the reaction proceeds slowly, it is considered that the crosslinking reaction of the crosslinkable group having lower crosslinking starting temperature first proceeds and the aforementioned effect is prone to be obtained.

[IV. Organic Electroluminescent Element]

Figure 1B:
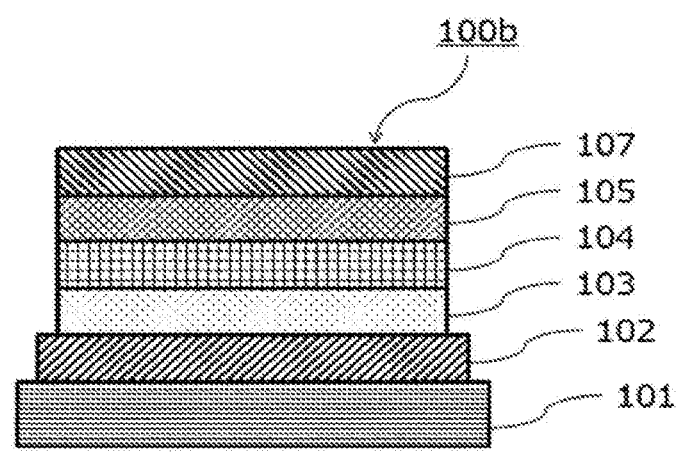
Figure 1C:
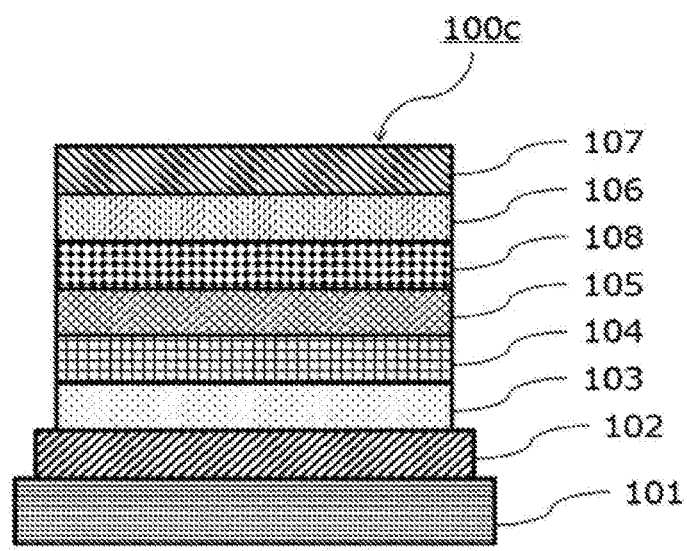

The following will explain the organic electroluminescent element of the invention with reference to FIG. 1A to FIG. 1C. Incidentally, FIG. 1A to FIG. 1C are all sectional views which diagrammatically show examples of the configuration of an organic electroluminescent element according to one embodiment of the invention.

The organic electroluminescent element 100a shown in FIG. 1A has a substrate 101 and, an anode 102, a hole injection layer 103, a luminescent layer 105, and a cathode 107 sequentially superposed on the substrate 101. The organic electroluminescent element 100a emits light by electric energy.

The substrate 101 is a support of the organic electroluminescent element 100a. As materials for forming the substrate 101, there may be mentioned a quartz plate, a glass plate, a metal plate, a metal foil, a plastic film, a plastic sheet, and the like. Of these, preferred are glass plates, transparent plastic sheets of polyesters, polymethacrylates, polycarbonates, polysulfones, and the like. Incidentally, in the case of using a plastic as the substrate 101, it is preferred to provide a dense silicon oxide film or the like on one surface or both surfaces of the substrate 101 to enhance gas barrier properties.

The anode 102 is disposed on the substrate 101 and plays a role of injecting holes into the hole injection layer 103. As materials of the anode 102, there may be mentioned a metal such as aluminum, gold, silver, nickel, palladium, or platinum; an electroconductive metal oxide such as an oxide of indium and/or tin; a metal halide such as copper iodide; carbon black; an electroconductive polymer such as poly(3-methylthiophene), polypyrrole, or polyaniline, and the like. As methods for forming the anode 102, there may be usually mentioned sputtering, vacuum deposition, or the like onto the substrate 101; a method of applying fine particles of a metal such as silver, fine particles of copper iodide or the like, carbon black, fine particles of an electroconductive metal oxide, fine particles of an electroconductive polymer, or the like dispersed in an appropriate binder resin solution, onto the substrate 101; a method of directly forming an electroconductive polymerization thin film on the substrate 101 by electrolytic polymerization; a method of applying an electroconductive polymer solution onto the substrate 101; and the like. It is preferred that the anode 102 has a visible light transmittance of usually 60% or higher, particularly 80% or higher. The thickness of the anode is usually about 1,000 nm or less, preferably about 500 nm or less and is usually 5 nm or larger, preferably 10 nm or larger.

The hole injection layer 103 is disposed on the anode 102.

The hole injection layer 103 is preferably a layer containing the electron-accepting compound described in the aforementioned [I. Electron-Accepting Compound] and the hole-transporting compound described in the aforementioned [II-1-1. Hole-Transporting Compound]. In this case, the content of the electron-accepting compound in the hole injection layer 103 is in the range of usually 0.1% by mass or more, preferably 1% by mass or more and usually 50% by mass or less, preferably 25% by mass or less. Incidentally, the range of the content of the electron-accepting compound defined herein is also the same in the case where the layer containing the electron-accepting compound is provided as a layer other than the hole injection layer in the organic electroluminescent element.

It is preferred to form the luminescent layer 105 as shown in FIG. 1A on the hole injection layer 103 using the electron-accepting compound having a crosslinkable group in the invention. Usually, when a luminescent layer is formed in contact with a layer containing an electron-accepting compound, the electron-accepting compound or the anion of the electron-accepting compound diffuses into the luminescent layer in an extremely minute amount, and excitons in the luminescent layer are quenched to decrease the luminescent efficiency. Therefore, for emitting light at a certain luminance, the voltage is heightened and hence there is a concern of a decrease in the working life.

However, in the hole injection layer using the electron-accepting compound having a crosslinkable group of the invention, since the electron-accepting compound is fixed by crosslinking, it is considered that it does not diffuse into the luminescent layer, the luminescent efficiency is improved, the operating voltage is not increased and rather decreased, and further the working life is improved.

Alternatively, the hole injection layer 103 is preferably a layer containing the charge-transporting ion compound described in the aforementioned [II-2-2. Charge-Transporting Ion Compound]. In this case, the content of the charge-transporting ion compound of the invention in the hole injection layer 103 is in the range of usually 0.1% by mass or more, preferably 1% by mass or more and usually 99% by mass or less, preferably 95% by mass or less. Incidentally, the range of the content of the charge-transporting ion compound defined herein is also the same in the case where the layer containing the charge-transporting ion compound is provided as a layer other than the hole injection layer in the organic electroluminescent element.

Here, the charge-transporting ion compound and the electron-accepting compound of the invention are, as mentioned above, excellent in heat resistance and has high electron-accepting properties and has appropriate sublimation ability, and also solubility in a solvent is high, so that the compound is applicable to the layer formation by a vacuum deposition method and also to the layer formation by a wet film formation method.

In the case of the layer formation by a vacuum deposition method, the electron-accepting compound and the hole-transporting compound are placed in separate crucibles placed in a vacuum vessel, and the vacuum vessel is evacuated to about $10^{-4}$ Pa by means of an appropriate vacuum pump. Thereafter, the respective crucibles are heated to vaporize the electron-accepting compound and the hole-transporting compound while independently controlling the rates of vaporization thereof to thereby form a hole injection layer 103 on the anode 102 of the substrate which has been placed so as to face the crucibles.

Alternatively, the charge-transporting ion compound is placed in a crucible disposed in a vacuum vessel, and the vacuum vessel is evacuated to about $10^{-4}$ Pa by means of an appropriate vacuum pump. Thereafter, the crucible is heated to vaporize the charge-transporting ion compound while controlling the rate of vaporization to thereby form a hole injection layer 103 on the anode 102 of the substrate which has been placed so as to face the crucible. Preferably, the hole-transporting compound is placed in another crucible than that of the charge-transporting ion compound and is vaporized while controlling the rate of vaporization to thereby form a hole injection layer 103 composed of the charge-transporting ion compound and the hole-transporting compound on the anode 102.

In the case of the layer formation by a wet film formation method, a coating solution, i.e., the composition (A) for a charge-transporting film is prepared from predetermined amounts of the electron-accepting compound and hole-transporting compound with optionally adding a binder resin or a applicability improver that do not become a trap of charge and is applied onto the anode 102 by a wet film formation method, such as a spin coating method or a dip coating method and dried to form a hole injection layer 103.

Alternatively, a coating solution, i.e., the composition (B) for a charge-transporting film is prepared from a predetermined amount of the charge-transporting ion compound with optionally adding a binder resin or a applicability improver that do not become a trap of charge and is applied onto the anode 102 by a wet film formation method, such as a spin coating method or a dip coating method and dried to form a hole injection layer 103.

The thickness of the thus formed hole injection layer 103 is in the range of usually 5 nm or more preferably 10 nm or more and usually 1,000 nm or less, preferably 500 nm or less.

The luminescent layer 105 is disposed on the hole-transporting layer 103 and is formed from a material which, between the electrodes placed in an electric field, efficiently recombines electrons injected from the cathode 107 and holes transported from the hole injection layer 103 and efficiently emits light by the recombination. As the material for forming the luminescent layer 105, a conventionally known material may be appropriately used but there may be mentioned low-molecular light-emitting materials, e.g., a metal complex such as an aluminum complex of 8-hydroxyquinoline, a metal complex of 10-hydroxybenzo[h]quinoline, a bisstyrylbenzene derivative, a bisstyrylarylene derivative, a metal complex of (2-hydroxyphenyl)benzothiazole, and a silol derivative; systems in which a light-emitting material and an electron transfer material are mixed into a polymer compound such as poly(p-phenylenevinylene), poly[2-methoxy-5-(2-ethylhexyloxy)-1,4-phenylenevinylene], poly(3-alkylthiophene), and polyvinylcarbazole; and the like.

Furthermore, for example, by using a metal complex such as an aluminum complex of 8-hydroxyquinoline as a host material and doping a condensed polycyclic aromatic ring such as a naphthacene derivative such as rubrene, a quinacridone derivative, or perylene to the host material in an amount of usually 0.1% by mass or more and 10% by mass or less, the luminescent properties, particularly operation stability of the organic electroluminescent element can be remarkably improved.

These materials are applied on the hole injection layer 103 by a vacuum deposition method or a wet film formation method to form a thin film on the hole injection layer 103. The thickness of the thus formed luminescent layer 105 is usually 10 nm or more, preferably 30 nm or more and usually 200 nm or less, preferably 100 nm or less.

The cathode 107 plays a role of injecting electrons into the luminescent layer 105. The material used as the cathode 107 is preferably a metal having a low work function, and use is made of an appropriate metal such as, for example, tin, magnesium, indium, calcium, aluminum, or silver or an alloy thereof. Specific examples thereof include alloy electrodes having a low work function, such as magnesium-silver alloys, magnesium-indium alloys, and aluminum-lithium alloys. The thickness of the cathode 107 is usually the same range as that of the anode 102. To further superpose thereon a layer of a metal having a high work function and stable to the air for the purpose of protecting the cathode 107 constituted of a metal having a low work function is effective for enhancing the stability of the element. For this purpose, use is made of a metal such as aluminum, silver, copper, nickel, chromium, gold, or platinum. Further, the efficiency of the organic electroluminescent element can be improved by interposing an ultrathin insulating film (thickness of 0.1 to 5 nm) of LiF, $MgF_2$, $Li_2O$, or the like into the interface between the cathode 107 and the luminescent layer 105, for use as a cathode.

In the organic electroluminescent element 100b shown in FIG. 1B, the hole-transporting layer 104 is provided between the hole injection layer 103 and the luminescent layer 105, and the other layers have the same configurations as in the organic electroluminescent element 100a shown in FIG. 1A. As the material of the hole-transporting layer 104, it is necessary to be a material exhibiting high hole injection efficiency from the hole injection layer 103 and capable of efficiently transporting the injected holes. For the purpose, it is required that the material should have a proper ionization potential, high hole mobility, and excellent stability and be less prone to generate, during production or use, impurities which function as traps. Furthermore, since the hole-transporting layer 104 is in direct contact with the luminescent layer 105, it is desired that the material does not contain a substance that quenches emitted light.

As the material to be used for forming the hole-transporting layer 104, there are mentioned the same ones as the compounds exemplified as the hole-transporting compounds to be contained in the composition for a charge-transporting film and the organic electroluminescent element of the invention. The hole-transporting layer 104 is formed by superposing the hole-transporting compound on the hole injection layer 103 by a wet film formation method or a vacuum deposition method. The thickness of the hole-transporting layer 104 thus formed is in the range of usually 10 nm or more, preferably 30 nm or more, and is usually 300 nm or less, preferably 100 nm or less.

In the organic electroluminescent element 100c shown in FIG. 1C, the hole-blocking layer 108 and the electron-transporting layer 106 are provided between the luminescent layer 105 and the cathode 107, and the other layers have the same configurations as in the organic electroluminescent element 100b shown in FIG. 1B.

The hole-blocking layer 108 is disposed between the luminescent layer 105 and the electron-transporting layer 106 to be mentioned later. The hole-blocking layer 108 has a function of inhibiting the holes, which transfer from the anode 102, from reaching the cathode 107 and a function of efficiently transporting the electrons injected from the cathode 107 to the luminescent layer 105. The physical properties required of the material constituting the hole-blocking layer 108 include: to have a high electron mobility and a low hole mobility; to have a large energy gap (difference between HOMO and LUMO); and to have a high excited triplet energy level (T1). Examples of materials for the hole-blocking layer 108 which satisfy such requirements include metal complexes such as mixed-ligand complexes, e.g., bis(2-methyl-8-quinolinolato)(phenolato)aluminum and bis(2-methyl-8-quinolinolato)(triphenylsilanolato)aluminum, and dinuclear metal complexes, e.g., bis(2-methyl-8-quinolato)aluminum-μ-oxobis(2-methyl-8-quinolilato) aluminum, styryl compounds such as distyrylbiphenyl derivatives, triazole derivatives such as 3-(4-biphenylyl)-4-phenyl-5-(4-tert-butylphenyl)-1,2,4-triazole, and phenanthroline derivatives such as bathocuproine. Furthermore, the compound having at least one pyridine ring substituted at the 2-, 4-, and 6-positions is also preferred as a material of the hole-blocking layer 108. The thickness of the hole-blocking layer 108 is arbitrary unless it remarkably impairs the advantages of the invention, but is usually 0.3 nm or more, preferably 0.5 nm or more, and is usually 100 nm or less, preferably 50 nm or less.

For a compound to be used in the electron-transporting layer 106, easy electron injection from the cathode 107 and further large electron-transporting ability are required. Examples of such electron-transportable materials include an aluminum complex of 8-hydroxyquinoline, oxadiazole derivatives or systems in which they are dispersed in a resin such as polymethyl methacrylate (PMMA), phenanthroline derivatives, 2-t-butyl-9,10-N,N'-dicyanoanthraquinone-diimine, n-type hydrogenated amorphous silicon carbide, n-type zinc sulfide, n-type zinc selenide, and the like. The thickness of the electron-transporting layer 106 is usually 5 nm or more, preferably 10 nm or more. It is usually 200 nm or less, preferably 100 nm or less.

Incidentally, the organic electroluminescent elements 100a to 100c shown in FIG. 1A to FIG. 1C are not limited to those shown in the figures. For example, it is also possible to have structures reverse to those shown in FIG. 1A to FIG. 1C, that is, to superpose the cathode 107, the luminescent layer 105, the hole injection layer 103, and the anode 102 in this order on the substrate 101. Moreover, it is also possible to dispose another optional layer between individual layers shown in FIG. 1A to FIG. 1C or to dispose any two or more of the layers in an integrated manner, unless it departs from the purpose of the invention. Furthermore, it is also possible to dispose the organic electroluminescent element between two substrates, at least one of which is highly transparent.

Incidentally, it is not necessary that the layer containing the charge-transporting ion compound of the invention is the hole injection layer 103 that is in contact with the anode 102 and may be any layer disposed between the anode 102 and the cathode 107. However, it is preferably a layer between the anode 102 and the luminescent layer 105, i.e., the hole injection layer 103 or the hole-transporting layer 104, further preferably the hole injection layer 103.

The method for manufacturing the organic electroluminescent elements 100a to 100c having a thin layer formed by a wet film formation method using the composition for a charge-transporting film of the invention will be explained in further detail. The organic electroluminescent elements 100a to 100c are manufactured by forming the anode 102 by sputtering, vacuum deposition, or the like on the substrate 101, forming at least one layer of the hole injection layer 103 and the hole-transporting layer 104 as an upper layer of the formed anode 102 by a wet film formation method using the composition for a charge-transporting film of the invention, forming the luminescent layer 105 as an upper layer of the formed hole injection layer 103 and/or hole-transporting layer 104 by a vacuum deposition method or a wet film formation method, forming the hole-blocking layer 108 and/or the electron-transporting layer 106 as an upper layer of the formed luminescent layer 105 by a vacuum deposition method or a wet film formation method, and forming the cathode 107 on the formed electron-transporting layer 106.

In the case where at least one layer of the hole injection layer 103 and the hole-transporting layer 104 is formed by a wet film formation method, usually, a coating solution, i.e., the composition for a charge-transporting film is prepared from predetermined amounts of the electron-accepting compound and the hole-transporting compound with optionally adding an additive such as a binder resin or a applicability improver that do not become a trap of charge, followed by dissolution, and is applied onto the anode 102 by a wet film formation method, such as a spin coating method or a dip coating method and dried to form at least one layer of the hole injection layer 103 and the hole-transporting layer 104.

The content of the binder resin is, from the standpoint of hole mobility, preferably usually 50% by mass or less, more preferably 30% by mass or less relative to these layers, and a state of containing substantially no binder resin is most preferred.

Moreover, the thin film formed using the composition (A) or (B) for a charge-transporting film of the invention can be transformed into a thermally stable thin film structure through activation of migration of the molecules contained in the resulting film by subjecting it to a heating step after the drying step. Thereby, the surface flatness of the film is improved and also the amount of water contained in the thin film, the water being a cause of element deterioration, is reduced, so that it is preferred.

Specifically, after the thin film formation by the wet film formation method and the drying step, in order to obtain the surface flattening effect and the dehydration effect by the heating treatment sufficiently, it is preferred to perform the treatment at a temperature of usually 60° C. or higher, especially 90° C. or higher, further 120° C. or higher, particularly 150° C. or higher and usually 350° C. or lower. However, in the case where the hole-transporting compound is contained in the composition and crystallinity of the hole-transporting compound is high, since there is a concern that crystallization may proceed by heating to decrease the surface flatness of the film, it is preferred to perform heating at a temperature lower than the glass transition temperature Tg of the hole-transporting compound, preferably at a temperature 10° C. or more lower than the temperature. On the other hand, in the case where amorphousness of the hole-transporting compound contained in the composition is high, the migration of the molecules of the hole-transporting compound is considered to be more activated and, in order to further improve the surface flatness of the film, it is preferred to perform the treatment at a temperature equal to or higher than the glass transition temperature Tg of the hole-transporting compound.

Incidentally, in the invention, the high crystallinity of the hole-transporting compound means that crystallization temperature Tc is observed in the range of the glass transition temperature Tg or higher and 350° C. or lower in DSC measurement or clear glass transition temperature Tg is not observed in the range of 350° C. or lower in the DSC measurement. On the other hand, the high amorphousness of the hole-transporting compound means that the crystallization temperature Tc is not observed in the range of the glass transition temperature Tg or higher and 350° C. or lower in the DSC measurement.

The heating time is in the range of usually 1 minute or more, preferably 5 minutes or more, more preferably 10 minutes or more and usually 8 hours or less, preferably 3 hours or less, more preferably 90 minutes or less.

As above, since the layer formed by a wet film formation method using the composition (A) or (B) for a charge-transporting film of the invention has smooth surface, a problem of short circuit at the time of element production resulting from surface roughness of the anode 102 such as ITO can be solved.

As the charge-transporting compound to be used in the charge-transporting film containing the electron-accepting compound and the charge-transporting compound, those exemplified as the aforementioned hole-transporting compound can be used and preferable ones are also the same as described above. Moreover, optionally, one other than the electron-accepting compound and the charge-transporting compound may be contained. The charge-transporting film has low resistivity and is preferably used in an organic electroluminescent element but can be used in other various uses such as an electrophotographic photoreceptor, a photoelectric conversion element, an organic solar cell, and an organic rectifying element.

Usually, the charge-transporting film is preferably formed by a wet film formation method using the composition for a charge-transporting film containing the electron-accepting compound and the charge-transporting compound. The charge-transporting compound contained in the composition is the same as described above. Moreover, in the case of the formation by the wet film formation method, the composition usually contains a solvent and the solvents are the same as those exemplified as solvents to be used in the composition for a charge-transporting film containing the aforementioned charge-transporting ion compound. Incidentally, the composition may contain one other than the electron-accepting compound, the charge-transporting compound, and the solvent.

EXAMPLES

The present invention will be explained below in more detail with reference to Examples. The following Examples are shown for detailed explanation of the invention and the invention should not be construed as being limited to the following Examples unless it departs from the purpose thereof.

Synthetic Example 1 Synthesis of (B-1)

Cumyltolyliodonium chloride (26 g) was added to a methylene chloride (900 ml) solution of lithium tetrakis (nonafluorobiphenyl)boron (89.5 g) and the whole was reacted at room temperature for 5 hours. The methylene chloride layer was washed with purified water several times and, after treated with active carbon, was concentrated under reduced pressure. The residue was recrystalized to obtain an objective substance (B-1) (31 g).

The structure of the synthesized compound was identified by MS analysis and NMR. The measurement conditions for the MS analysis are as follows.

Measurement conditions for MS analysis: ionization method: ESI (+/−)

Cation: $C_{16}H_{18}I^+$ (337.0)

Anion: $C_{48}BF_{36}^-$ (1271.0)

Synthetic Example 2 Synthesis of (B-18)

A mixed solution of 3-bicyclo[4.2.0]octa-1,3,5-trieneboronic acid (30.3 g), 1,4-dibromo-2,3,5,6-tetrafluorobenzene (125.9 g), 1,2-dimethoxyethane (1 L), and a 2.0M aqueous tripotassium phosphate solution (0.26 L) was deaerated with argon. Thereafter, tetrakistriphenylphosphine palladium(0) (7.3 g) was added thereto and the whole was heated and stirred at an inner temperature of 73° C. for 7.5 hours.

After cooling to room temperature, purified water (0.25 L) was added and extraction was performed with toluene (1.8 L). After the organic layer was washed sequentially with purified water (0.5 L) and saturated aqueous sodium chloride solution (0.5 L), the layer was dried with anhydrous magnesium sulfate and filtrated and the filtrate was concentrated. The residue was purified by silica gel column chromatography to obtain 3-(4-bromo-2,3,5,6-tetrafluorophenyl) bicyclo[4.2.0]octa-1,3,5-triene (45.5 g).

Under an argon stream, a dry diethyl ether (760 mL) solution of 3-(4-bromo-2,3,5,6-tetrafluorophenyl)bicyclo [4.2.0]octa-1,3,5-triene (44.4 g) was cooled to an inner temperature of −74° C. and a 1.65M n-butyllithium-n-hexane solution (82.1 mL) was added dropwise over a period of 50 minutes, followed by stirring for 1 hour and 10 minutes. Then, a 1M boron trichloride-heptane solution (26.8 mL) was added dropwise over a period of 18 minutes. After the mixture was stirred and warmed to an inner temperature of 10° C. over a period of 2 hours and 20 minutes, it was stirred at room temperature for 15 hours. After purified water (80 mL) was added dropwise and the whole was stirred for a while, oil and water were separated from each other and the aqueous layer was extracted with diethyl ether (100 mL). The organic layers were combined and concentrated under reduced pressure. The residue was subjected to silica gel column chromatography to obtain lithium tetrakis(4-(bicyclo[4.2.0]octa-1,3,5-trien-3-yl)-2,3,5,6-tetrafluorophenyl)borate (17.7 g).

Under an argon stream, cumyltolyliodonium chloride (6.40 g) was charged portionwise at an inner temperature of 14° C. to a methanol (230 mL) solution of lithium tetrakis(4-(bicyclo[4.2.0]octa-1,3,5-trien-3-yl)-2,3,5,6-tetrafluorophenyl)borate (17.6 g) over a period of 6 minutes. After stirring at an inner temperature of 17° C. for 2 hours, methanol was distilled off under reduced pressure. The residue was again dissolved in dichloromethane (150 mL) and, after inorganic salts were filtrated off, the filtrate was concentrated. The residue was subjected to silica gel column chromatography to obtain an objective substance (B-18) (19.77 g). The structure of the synthesized compound was identified by NMR.

Synthetic Example 3 Synthesis of (B-20)

Under an argon stream, 4-isopropyl-4'-methyldiphenyliodonium chloride (4.24 g, 1.00 eq.) was slowly charged portionwise at an inner temperature of 8° C. under stirring into a methanol (330 mL) solution of lithium tetrakis(4'-(1,2-dihydrocyclobuta[a]naphthalen-4-yl)-2,2',3,3',5,5',6,6'-octafluoro-1,1'-biphenyl-4-yl)borate (25.6 g) and dichloromethane (80 mL). After stirring at an inner temperature of 8 to 9° C. for 2 hours, methanol was distilled off under reduced pressure. The residue was again dissolved in dichloromethane (150 mL) and, after inorganic salts were filtrated off, the filtrate was concentrated.

The residue was purified by silica gel column chromatography (hexane/dichloromethane=1/2 to 1/4) to obtain an objective substance (B-20) (20.9 g, yield 85.6%). The structure of the synthesized compound was identified by NMR.

Synthetic Example 4 Synthesis of (B-23)

Under an argon atmosphere, 4-isopropyl-4'-methyldiphenyliodonium chloride (79.5 mg, 1.00 eq.) was slowly charged under ice-cooling under stirring into a dichloromethane (1 mL) and methanol (12 mL) solution of lithium tetrakis(2,2',3,3',5,5',6,6'-octafluoro-3"-5"-bis(trifluoromethyl)[1,1':4',1"]terphenyl-4-yl)borate (530 mg, 0.2132 mmol). After stirring at room temperature for 2 hours, methanol was distilled off under reduced pressure. The residue was again dissolved in dichloromethane (5 mL) and, after inorganic salts were filtrated off, the filtrate was concentrated. The residue was purified by silica gel column chromatography (hexane/dichloromethane=1/2 to 1/4) to obtain an objective substance (B-23) (395 mg, yield 77.6%). The structure of the synthesized compound was identified by NMR.

Synthetic Example 5 Synthesis of (B-24)

Under an argon atmosphere, 4-isopropyl-4'-methyldiphenyliodonium chloride (7.40 g, 1.00 eq.) was slowly charged under ice-cooling under stirring into a solution of lithium tetrakis(2,3,5,6-tetrafluoro-4-(trifluoromethyl)phenyl)borate (17.6 g), dichloromethane (90 mL), and methanol (350 mL). After stirring at room temperature for 4 hours, methanol was distilled off under reduced pressure. The residue was again dissolved in dichloromethane and, after inorganic salts were filtrated off, the filtrate was concentrated. The residue was purified by silica gel column chromatography (hexane/dichloromethane=1/1, dichloromethane, acetonitrile) several times, and the residue was suspended and washed with n-pentane to obtain an objective substance (B-24) (15.9 g, yield 65%).

The structure of the synthesized compound was identified by MS analysis and NMR. The measurement conditions for the MS analysis are as follows.

Measurement conditions for MS analysis: ionization method: ESI (+/−)

Cation: $C_{16}H_{18}I^+$ (337.0)

Anion: $C_{28}BF_{28}^-$ (879.0)

Synthetic Example 6 Synthesis of (B-28)

Under an argon atmosphere, a 2.0M aqueous tripotassium phosphate solution (40.6 mL, 2.50 equiv.) was added at room temperature to a solution of 2-(1,2-dihydrocyclobuta[a]naphthalene-4-yl)-4,4,5,5-tetramethyl-1,3,2-dioxaborane (9.10 g, 32.48 mmol), 4,4'-dibromooctafluoro-1,1'-biphenyl (29.80 g, 2.0 eq.), and 1,2-dimethoxyethane (162 mL), and argon substitution was performed at 40° C. Thereafter, tetrakistriphenylphosphine palladium (2.40 g, 6.4 mol %) was added thereto and the whole was heated and stirred at an inner temperature of 72 to 74° C. for 9 hours.

After cooling to room temperature, toluene (500 mL) and purified water (150 mL) were poured thereto, after stirring for a while, oil and water were separated from each other, and the aqueous layer was extracted with toluene (500 mL). Two organic layers were combined and, after washed with purified water (200 mL) and brine (200 mL) sequentially, the washed one was dried with anhydrous magnesium sulfate and filtrated, and then the filtrate was concentrated.

The residue was purified by silica gel column chromatography (hexane) to obtain 4'-bromo-2,2',3,3',5,5',6,6'-octafluoro-4-(1,2-dihydrocyclobuta[a]naphthalen-4-yl) [1,1']-biphenyl (10.11 g, yield 58.8%).

Under an argon atmosphere, after a solution of 4-bromo-2,3,5,6-tetrafluorobenzotrifluoride (1.00 g, 3.37 mmol, 3.18 eq.) and dry diethyl ether (10 mL) was cooled to an inner temperature of −74° C., a 1.6M n-butyllithium-n-hexane solution (2.0 mL, 3.20 equiv.) was added dropwise at an inner temperature of −74 to −68° C., followed by further stirring for 1 hour. Then, a 1M boron trifluoride-heptane solution (1.1 mL, 1.06 mmol) was added dropwise at an inner temperature of −72 to −69° C. to obtain a solution of tris[2,3,5,6-tetrafluoro-4-(trifluoromethyl)phenyl]borane.

Under an argon atmosphere, after a dry diethyl ether (11 mL) solution of 4'-bromo-2,2',3,3',5,5',6,6'-octafluoro-4-(1,2-dihydrocyclobuta[a]naphthalen-4-yl)[1,1']-biphenyl (561 mg, 1.06 mmol) was cooled to an inner temperature of −75° C., a 1.6M n-butyllithium-n-hexane solution (700 uL, 1.06 equiv.) was added dropwise at an inner temperature of −75 to −68° C., followed by further stirring for 1 hour. The resulting lithio compound solution was added dropwise to the previously prepared solution of tris[2,3,5,6-tetrafluoro-4-(trifluoromethyl)phenyl]borane at an inner temperature of −77 to −66° C. After the reaction solution was stirred at room temperature overnight, it was quenched with purified water (5 mL), oil and water were separated from each other, and the aqueous layer was extracted with diethyl ether. Two ether layers were combined and concentrated under reduced pressure. The residue was purified through column by silica gel column chromatography (eluted with ethyl acetate/hexane=1/1 to 1/0 and then methanol/ethyl acetate=1/49) to obtain lithium [4'-(1,2-dihydrocyclobuta[a]naphthalene-4-yl)-2,2',3,3',5,5',6,6'-octafluoro-1,1'-biphenyl-4-yl]-tris[2,3,5,6-tetrafluoro-4-(trifluoromethyl)phenyl]borate (0.77 g, 41.4%).

Under an argon atmosphere, 4-isopropyl-4'-methyldiphenyliodonium chloride (307 mg, 1.00 eq.) was slowly charged under ice-cooling under stirring into a dichloromethane (4 mL) and methanol (15 mL) solution of lithium [4'-(1,2-dihydrocyclobuta[a]naphthalene-4-yl)-2,2',3,3',5,5',6,6'-octafluoro-1,1'-biphenyl-4-yl]-tris[2,3,5,6-tetrafluoro-4-(trifluoromethyl)phenyl]borate (1.350 g, 0.8245 mmol). After stirring at room temperature for 2 hours, methanol was distilled off under reduced pressure. The residue was again dissolved in dichloromethane (9 mL) and, after inorganic salts were filtrated off, the filtrate was concentrated. The residue was purified by silica gel column chromatography (ethyl acetate/hexane=1/1 to 1/0, methanol/ethyl acetate=1/49, acetonitrile) several times to obtain an objective substance (B-28) (630 mg, yield 52.7%).

The structure of the synthesized compound was identified by MS analysis and NMR. The measurement conditions for the MS analysis are as follows.

Measurement conditions for MS analysis: ionization method: ESI (+/−)

Cation: $C_{16}H_{18}I^+$ (337.0)
Anion: $C_{45}BF_{29}^-$ (1111.0)

Synthetic Example 7 Synthesis of (B-19)

Under an argon atmosphere, the compound 7 (3.00 g), dichloromethane (11 mL), and methanol (45 mL) were mixed, and 4-isopropyl-4'-methyldiphenyliodonium chloride (635 mg, 1.00 equiv.) was slowly charged under ice-cooling under stirring into the solution. After stirring at room temperature for 2 hours, methanol was distilled off under reduced pressure. The residue was again dissolved in dichloromethane (15 mL) and, after inorganic salts were filtrated off, the filtrate was concentrated. The residue was purified by silica gel column chromatography (ethyl acetate/hexane=1/3 to 1/0, methanol/ethyl acetate=1/49, acetonitrile) several times to obtain an objective substance (B-19) (1.722 g, yield 58.6%). The structure of the synthesized compound was identified by MS analysis and NMR. The measurement conditions for the MS analysis are as follows.

Measurement conditions for MS analysis: ionization method: ESI (+/−)

Cation: $C_{16}H_{18}I^+$ (337.0)
Anion: $C_{63}H_{21}BF_{29}^-$ (1339.0)

Example 1

An organic electroluminescent element having the same layer configuration as that of the organic electroluminescent element 100c shown in FIG. 1C was produced by the following method.

One obtained by depositing a transparent conductive film of indium-tin oxide (ITO) on a glass substrate in a thickness of 130 nm (sputtering-coated product; manufactured by Sanyo Vacuum Industries Co., Ltd.) was subjected to patterning into stripes having a width of 2 mm using an ordinary technique of photolithography and etching with hydrochloric acid, thus forming an anode. The substrate which had undergone the ITO patterning was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and finally subjected to ultraviolet/ozone cleaning.

First, 100 parts by mass of a charge-transporting polymer compound having the following structural formula (HI-1) and an electron-accepting compound having the structure (B-1) in an amount so as to be 0.2 mol/kg relative to the charge-transporting polymer compound were dissolved in ethyl benzoate to prepare 5,000 parts by mass of a solution.

The solution was applied on the above substrate by spin coating in the air and dried in a clean oven at 230° C. for 60 minutes in the air to form an even thin film having a thickness of 36 nm, which was taken as a hole injection layer.

Then, 100 parts by mass of a charge-transporting polymer compound having the following structural formula (HT-1) was dissolved in cyclohexylbenzene to prepare a 2.5 wt % solution.

The solution was applied in a nitrogen glove box by spin coating on the substrate on which the above hole injection layer had been applied to form a film, and then dried on a hot plate in the nitrogen glove box at 230° C. for 60 minutes to form an evens thin film having a thickness of 40 nm, which was taken as a hole-transporting layer.

(HI-1)

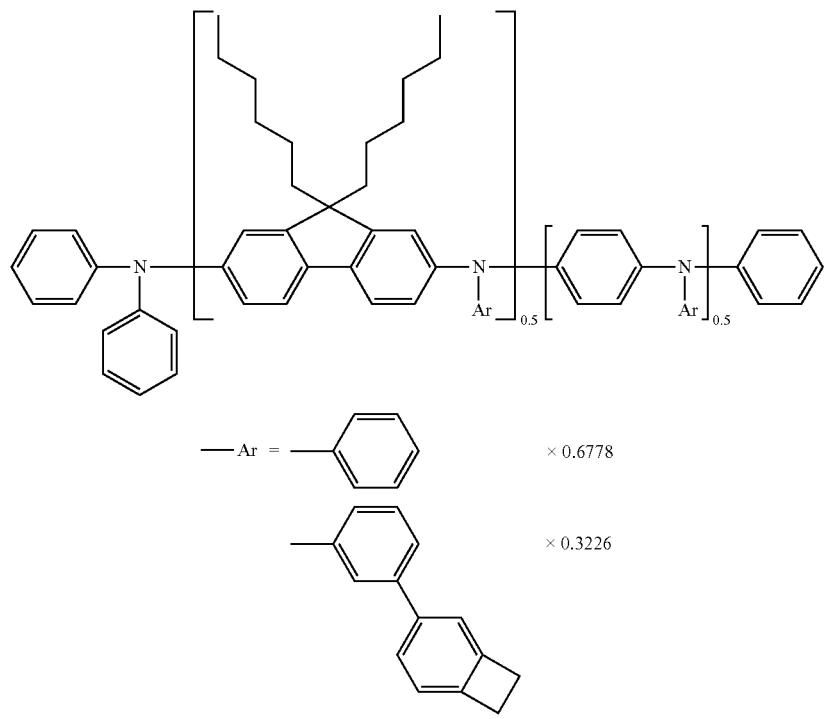

(HT-1)

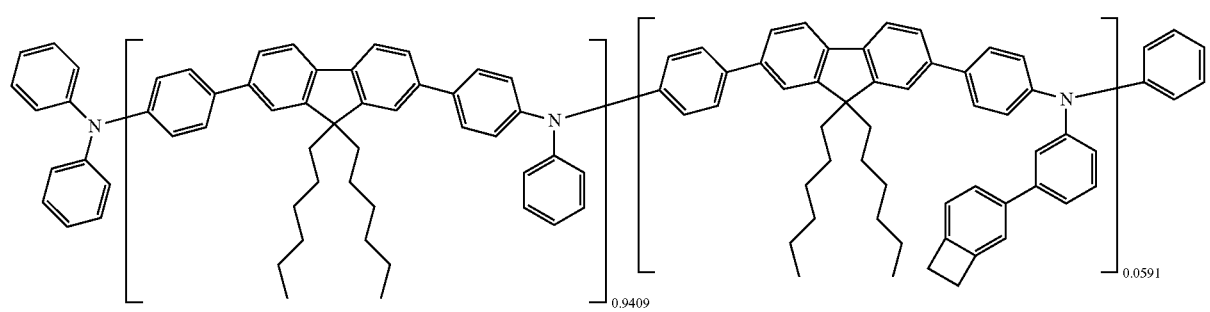

Subsequently, as materials of a luminescent layer, 45 parts by mass of the following structural formula (H-1), 55 parts by weight of the following structural formula (H-2), and 20 parts by mass of the following structural formula (D-1) were weighed and dissolved in cyclohexylbenzene to prepare a 6 wt % solution.

The solution was applied in a nitrogen glove box by spin coating on the substrate on which the above hole-transporting layer had been applied to form a film, and then dried on a hot plate in the nitrogen glove box at 130° C. for 20 minutes to form an evens thin film having a thickness of 56 nm, which was taken as a luminescent layer.

(H-1)

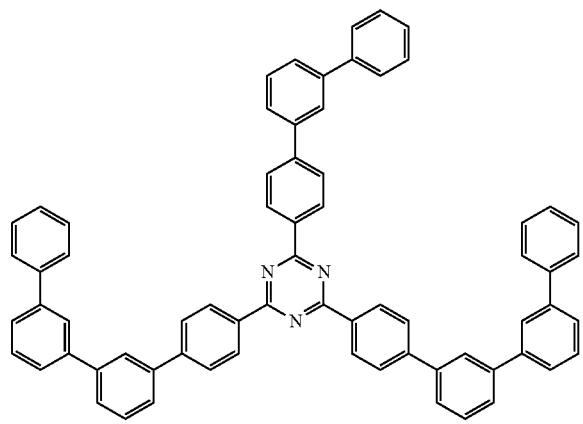

(H-2)

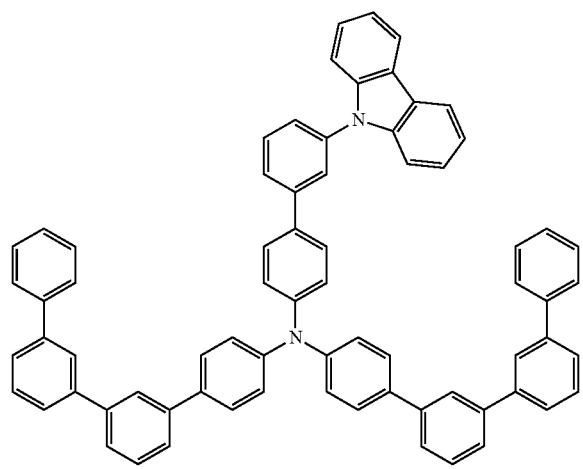

(D-1)

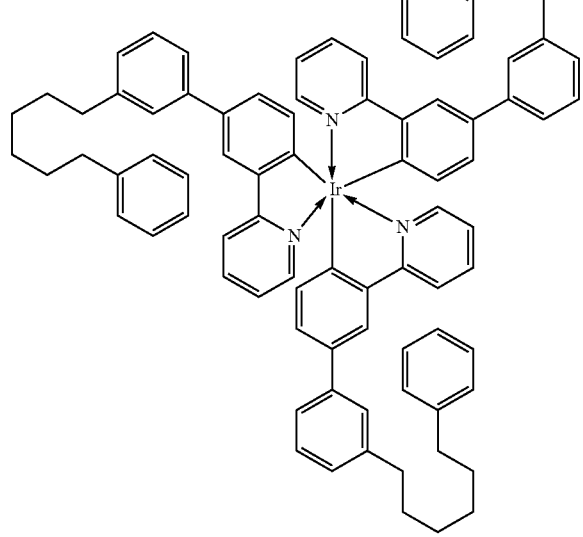

The substrate on which up to the luminescent layer had been formed was placed in a vacuum deposition apparatus and the inside of the apparatus was evacuated until at least $2.0 \times 10^{-4}$ Pa was achieved.

Then, a compound represented by the following structural formula (HB-1) was deposited to form a film on the luminescent layer by a vacuum deposition method at a rate of 1 Å/sec, thus forming a hole-blocking layer having a thickness of 10 nm.

Subsequently, as a material of an electron-transporting layer, 8-hydroxyquinoline complex of aluminum represented by the following structural formula (E-1) was heated in a crucible to perform deposition.

The deposition rate was 1 Å/sec and a film having a thickness of 10 nm was deposited on the hole-blocking layer to form an electron-transporting layer.

(HB-1)

(E-1)

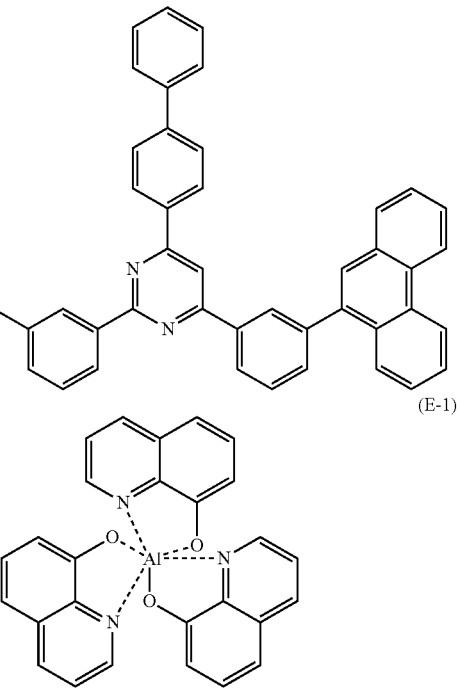

Here, the substrate on which up to the electron-transporting layer had been formed was once taken out from the vacuum deposition apparatus into the air. A shadow mask in the form of stripes with a width of 2 mm was brought, as a mask for cathode deposition, into close contact with the substrate so that these stripes were perpendicular to the ITO stripes of the anode. Then, it was placed in another vacuum deposition apparatus, which was evacuated until the degree of vacuum within the apparatus became at least $4.0 \times 10^{-4}$ Pa. Subsequently, as a cathode, first, using a molybdenum boat, lithium fluoride (LiF) was deposited at a deposition rate of 0.15 Å/sec on the electron-transporting layer in a thickness of 0.5 nm. Further, aluminum was heated in the same manner by means of a molybdenum boat to form an aluminum layer having a thickness of 80 nm at a deposition rate of 1 to 8.6 Å/sec, thus forming a cathode. As above, an organic electroluminescent element which had a light-emitting area portion with a size of 2 mm×2 mm was obtained.

Comparative Example 1

An organic electroluminescent element was produced in the same manner as in Example 1 except that the electron-accepting compound of the hole injection layer was changed from (B-1) to the following (AC-1).

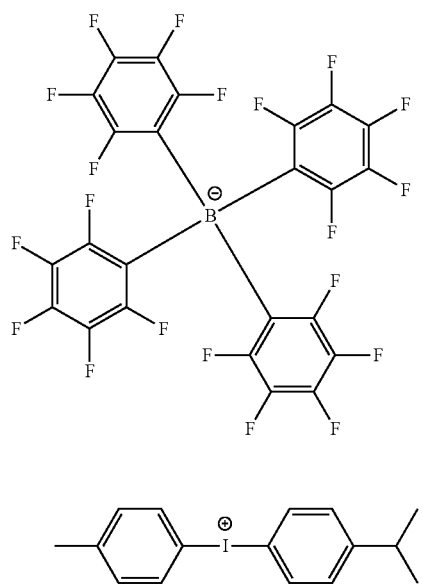

(AC-1)

The voltage (V), current efficiency (cd/A), and power efficiency (lm/W) when the obtained organic electroluminescent elements of Example 1 and Comparative Example 1 were made emit light at a luminance of 1,000 cd/m² were measured, and the voltage (V) was described as a relative value (V) obtained by subtracting the value of Comparative Example 1, the current efficiency and power efficiency were described as relative values where the values of Comparative Example 1 were taken as 100, in the following Table 1. As shown in the results of Table 1, as compared with the organic electroluminescent element produced with (AC-1), it was found that operation at lower voltage became possible and the efficiency was further improved in the organic electroluminescent element in which the electron-accepting compound (B-1) of the invention was used as a material of the hole injection layer.

TABLE 1

| | Relative voltage | Relative current efficiency | Relative power efficiency |
| --- | --- | --- | --- |
| Example 1 | −0.2 | 102 | 106 |
| Comparative Example 1 | 0.0 | 100 | 100 |

Example 2

An organic electroluminescent element having the same layer configuration as that of the organic electroluminescent element 100c shown in FIG. 1C was produced by the following method.

One obtained by depositing a transparent conductive film of indium-tin oxide (ITO) on a glass substrate in a thickness of 70 nm (sputtering-coated product; manufactured by Sanyo Vacuum Industries Co., Ltd.) was subjected to patterning into stripes having a width of 2 mm using an ordinary technique of photolithography and etching with hydrochloric acid, thus forming an anode. The substrate which had undergone the ITO patterning was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and finally subjected to ultraviolet/ozone cleaning.

First, 100 parts by mass of a charge-transporting polymer compound having the following structural formula (HI-2) and 20 parts by mass of an electron-accepting compound having the structure (B-23) were dissolved in butyl benzoate to prepare a 2.0 wt % solution.

The solution was applied on the above substrate by spin coating in the air and dried in a clean oven at 230° C. for 60 minutes in the air to form an even thin film having a thickness of 30 nm, which was taken as a hole injection layer.

Then, 100 parts by mass of a charge-transporting polymer compound having the following structural formula (HT-1) was dissolved in cyclohexylbenzene to prepare a 1.5 wt % solution.

The solution was applied in a nitrogen glove box by spin coating on the substrate on which the above hole injection layer had been applied to form a film, and then dried on a hot plate in the nitrogen glove box at 230° C. for 60 minutes to form an even thin film having a thickness of 20 nm, which was taken as a hole-transporting layer.

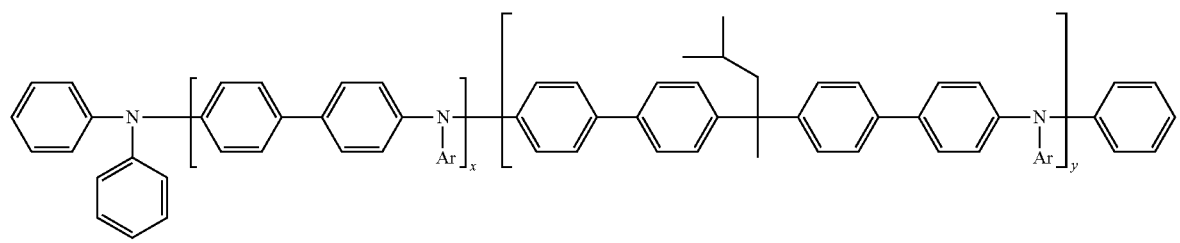

(HI-2)

x:y = 95:5  Ar =

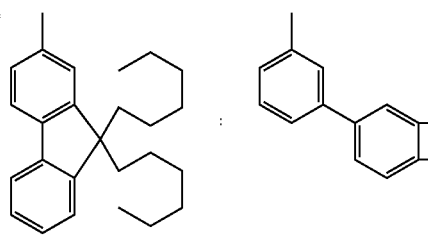  : 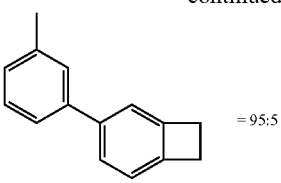 = 95:5

Subsequently, as materials of a luminescent layer, 22.5 parts by mass of the following structural formula (H-3), 22.5 parts by weight of the following structural formula (H-4), 55 parts by mass of the following structural formula (H-5), and 30 parts by mass of the following structural formula (D-2) were weighed and dissolved in cyclohexylbenzene to prepare a 5.0 wt % solution.

The solution was applied in a nitrogen glove box by spin coating on the substrate on which the above hole-transporting layer had been applied to form a film, and then dried on a hot plate in the nitrogen glove box at 120° C. for 20 minutes to form an even thin film having a thickness of 60 nm, which was taken as a luminescent layer.

(H-3)

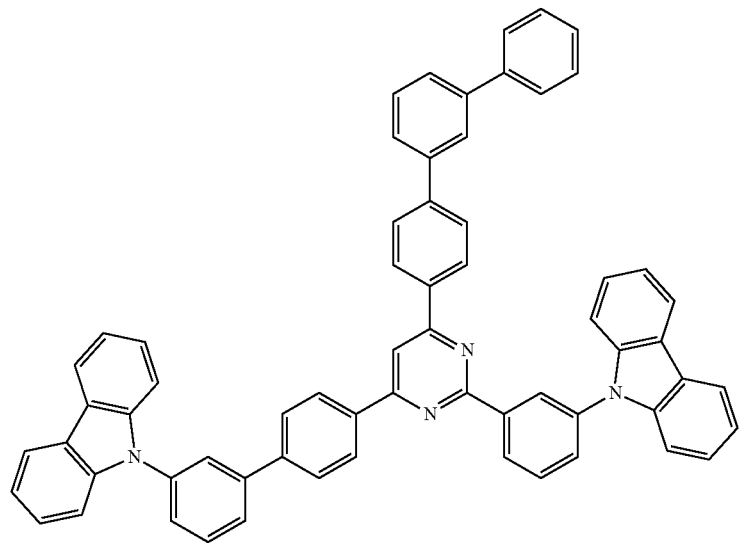

(H-4)

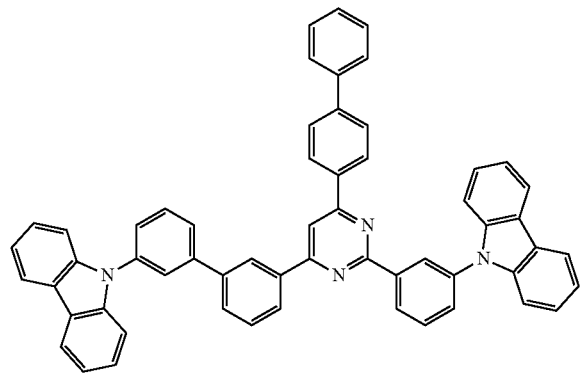

(H-5)

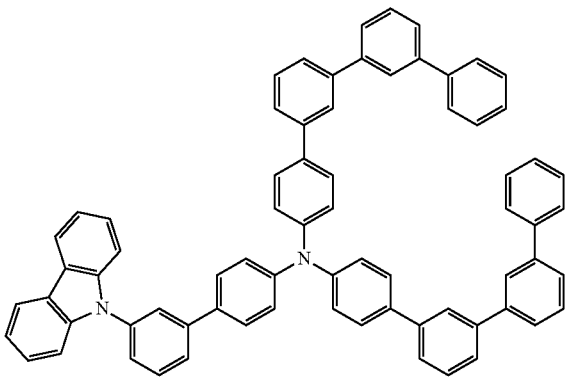

-continued

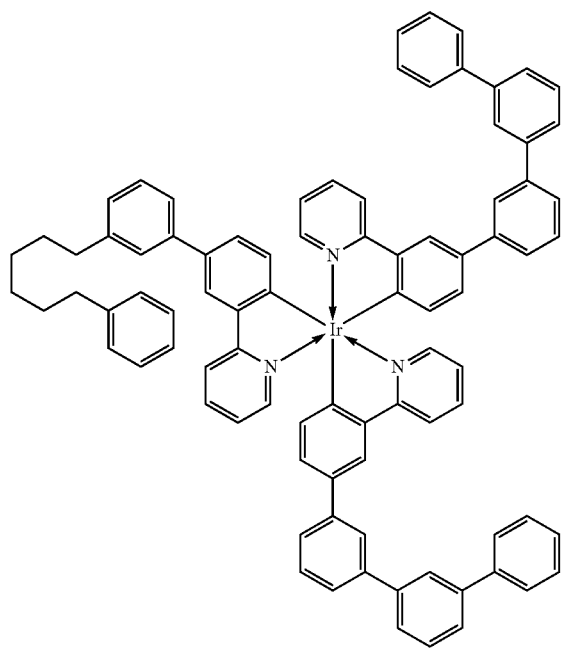

(D-2)

The substrate on which up to the luminescent layer had been formed was placed in a vacuum deposition apparatus and the inside of the apparatus was evacuated until at least $2.0×10^{-4}$ Pa was achieved.

Then, a compound represented by the following structural formula (H-4) was deposited to form a film on the luminescent layer by a vacuum deposition method at a rate of 1 Å/sec, thus forming a hole-blocking layer having a thickness of 5 nm.

Subsequently, as a material of an electron-transporting layer, the compound represented by the following structural formula (E-2) was deposited to form a film on the hole-blocking layer by a vacuum deposition method at a rate of 1 Å/sec, thus forming an electron-transporting layer having a thickness of 5 nm.

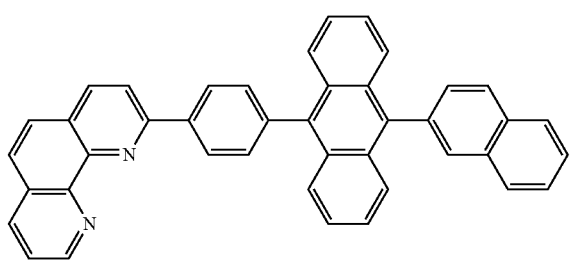

(E-2)

Here, a cathode was formed in the same manner as in Example 1 on the substrate on which up to the electron-transporting layer had been formed, thus obtaining an organic electroluminescent element which had a light-emitting area portion with a size of 2 mm×2 mm

Example 3

An organic electroluminescent element was produced in the same manner as in Example 2 except that the electron-accepting compound of the hole injection layer was changed from (B-23) to (B-24).

Comparative Example 2

An organic electroluminescent element was produced in the same manner as in Example 2 except that the electron-accepting compound of the hole injection layer was changed from (B-23) to (AC-1).

The current efficiency (cd/A) when the obtained organic electroluminescent elements of Examples 2 and 3 and Comparative Example 2 were made emit light at a luminance of 2,500 cd/m² were measured, and the period (h) required for the luminance to decrease to a value of 97% of the initial luminance at the time of operation at a constant current of 15 mA/cm² was measured as working life. With regard to the current efficiency and the working life, relative values where the values of Comparative Example 2 were taken as 100 were described as relative current efficiency and relative working life, respectively, in the following Table 2. As shown in the results of Table 2, as compared with the organic electroluminescent element of Comparative Example 2, it was found that the current efficiency and the working life were both improved in the organic electroluminescent elements in which the electron-accepting compounds of the invention were used as materials of the hole injection layer.

TABLE 2

| | Electron-accepting compound | Relative current efficiency | Relative working life |
|---|---|---|---|
| Example 2 | B-23 | 116 | 512 |
| Example 3 | B-24 | 113 | 460 |

TABLE 2-continued

|  | Electron-accepting compound | Relative current efficiency | Relative working life |
|---|---|---|---|
| Comparative Example 2 | AC-1 | 100 | 100 |

Example 4

An organic electroluminescent element was produced in the same manner as in Example 3 except that the electron-accepting compound of the hole injection layer was changed from (B-24) to (B-19), the materials of the luminescent layer were changed from (H-3), (H-4), (H-5), and (D-2) to the following structural formulae (H-6) and (D-3), and the thickness of the luminescent layer was changed from 60 nm to 30 nm. Incidentally, as for the luminescent layer, 100 parts by mass of (H-6) and 10 parts by mass of (D-3) were weighed and dissolved in cyclohexylbenzene to prepare a 3.0 wt % solution, which was then applied.

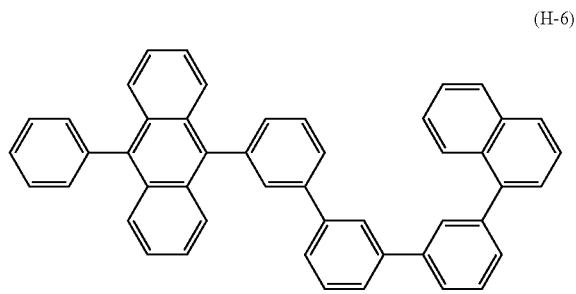

(H-6)

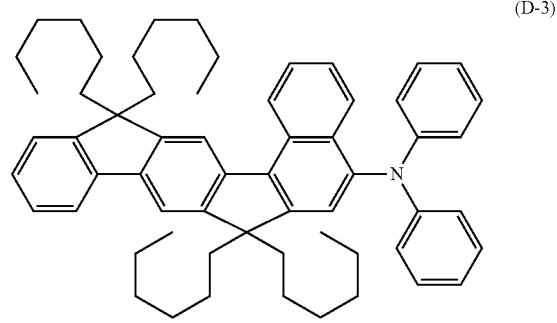

(D-3)

Comparative Example 3

An organic electroluminescent element was produced in the same manner as in Example 4 except that the electron-accepting compound of the hole injection layer was changed from (B-19) to (AC-1).

The voltage (V) and current efficiency (cd/A) when the obtained organic electroluminescent elements of Example 4 and Comparative Example 3 were made emit light at 10 mA/cm$^2$ were measured, and the period (h) required for the luminance to decrease to a value of 95% of the initial luminance at the time of operation at a constant current of 15 mA/cm$^2$ was measured as working life. With regard to the voltage, the voltage (V) obtained by subtracting the value of Comparative Example 3 was described as relative voltage (V) and, with regard to the current efficiency and the working life, relative values where the values of Comparative Example 3 were taken as 100 were described as relative current efficiency and relative working life, respectively, in the following Table 3. As shown in the results of Table 3, as compared with the organic electroluminescent element of Comparative Example 3, it was found that operation at lower voltage became possible and further the current efficiency and the working life were both improved in the organic electroluminescent element in which the electron-accepting compound of the invention was used as a material of the hole injection layer.

TABLE 3

|  | Electron-accepting compound | Relative voltage (V) | Relative current efficiency | Relative working life |
|---|---|---|---|---|
| Example 4 | B-19 | −0.4 | 130 | 200 |
| Comparative Example 3 | AC-1 | 0.0 | 100 | 100 |

Example 5

An organic electroluminescent element was produced in the same manner as in Example 4 except that the electron-transporting polymer compound of the hole-transporting layer was changed from (HT-1) to (HT-2), the solution concentration of the luminescent layer was changed to 5.0 wt %, and the thickness thereof was changed from 30 nm to 60 nm.

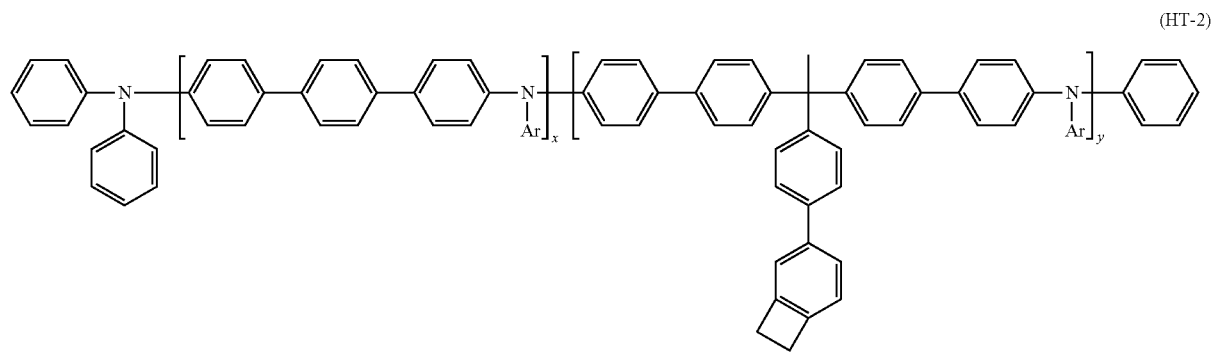

(HT-2)

x:y = 0.921:0.079  Ar: 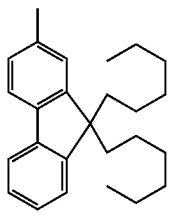

Comparative Example 4

An organic electroluminescent element was produced in the same manner as in Example 5 except that the electron-accepting compound of the hole injection layer was changed from (B-19) to (AC-1).

The voltage (V) and current efficiency (cd/A) when the obtained organic electroluminescent elements of Example 5 and Comparative Example 4 were made emit light at 10 mA/cm$^2$ were measured, and the period (h) required for the luminance to decrease to a value of 70% of the initial luminance at the time of operation at a constant current of 20 mA/cm$^2$ was measured as working life. With regard to the voltage, the voltage (V) obtained by subtracting the value of Comparative Example 4 was described as relative voltage (V) and, with regard to the current efficiency and the working life, relative values where the values of Comparative Example 4 were taken as 100 were described as relative current efficiency and relative working life, respectively, in the following Table 4. As shown in the results of Table 4, as compared with the organic electroluminescent element of Comparative Example 4, it was found that operation at lower voltage became possible and further the current efficiency and the working life were both improved in the organic electroluminescent element in which the electron-accepting compound of the invention was used.

TABLE 4

| | Electron-accepting compound | Relative voltage (V) | Relative current efficiency | Relative working life |
|---|---|---|---|---|
| Example 5 | B-19 | −0.4 | 293 | 351 |
| Comparative Example 4 | AC-1 | 0.0 | 100 | 100 |

Example 6

An organic electroluminescent element was produced in the same manner as in Example 4 except that the electron-accepting compound of the hole injection layer was changed from (B-19) to (B-18).

Example 7

An organic electroluminescent element was produced in the same manner as in Example 6 except that the electron-accepting compound of the hole injection layer was changed from (B-18) to (B-20) and the solution concentration was changed to 3.0 wt %.

Comparative Example 5

An organic electroluminescent element was produced in the same manner as in Example 6 except that the electron-accepting compound of the hole injection layer was changed from (B-18) to (AC-1).

The current efficiency (cd/A) when the obtained organic electroluminescent elements of Examples 6 and 7 and Comparative Example 5 were made emit light at 1,000 cd/m$^2$ were measured, and the period (h) required for the luminance to decrease to a value of 70% of the initial luminance at the time of operation at a constant current of 20 mA/cm$^2$ was measured as working life. With regard to the current efficiency and the working life, relative values where the values of Comparative Example 5 were taken as 100 were described as relative current efficiency and relative working life, respectively, in the following Table 5. As shown in the results of Table 5, as compared with the organic electroluminescent element of Comparative Example 5, it was found that the current efficiency and the working life were both improved in the organic electroluminescent elements in which the electron-accepting compounds of the invention were used.

TABLE 5

| | Electron-accepting compound | Relative current efficiency | Relative working life |
|---|---|---|---|
| Example 6 | B-18 | 199 | 107 |
| Example 7 | B-20 | 193 | 138 |
| Comparative Example 5 | AC-1 | 100 | 100 |

Example 8

An organic electroluminescent element was produced in the same manner as in Example 2 except that the electron-accepting compound of the hole injection layer was changed from (B-23) to (B-1) and the material of the hole-transporting layer was changed from (HT-1) to (HT-2).

Comparative Example 6

An organic electroluminescent element was produced in the same manner as in Example 8 except that the electron-accepting compound of the hole injection layer was changed from (B-1) to (AC-1).

The current efficiency (cd/A) when the obtained organic electroluminescent element of Example 8 and Comparative Example 6 were made emit light at 2,500 cd/m$^2$ were measured, and the period (h) required for the luminance to decrease to a value of 95% of the initial luminance at the time of operation at a constant current of 15 mA/cm$^2$ was measured as working life. With regard to the current efficiency and the working life, relative values where the values of Comparative Example 6 were taken as 100 were described as relative current efficiency and relative working life, respectively, in the following Table 6. As shown in the results of Table 6, as compared with the organic electroluminescent element of Comparative Example 6, it was found that the current efficiency and the working life were both improved in the organic electroluminescent element in which the electron-accepting compounds of the invention was used.

TABLE 6

| | Electron-accepting compound | Relative current efficiency | Relative working life |
|---|---|---|---|
| Example 8 | B-1 | 103 | 176 |
| Comparative Example 6 | AC-1 | 100 | 100 |

Example 9

An organic electroluminescent element having the same layer configuration as that of the organic electroluminescent element 100c shown in FIG. 1C was produced by the following method.

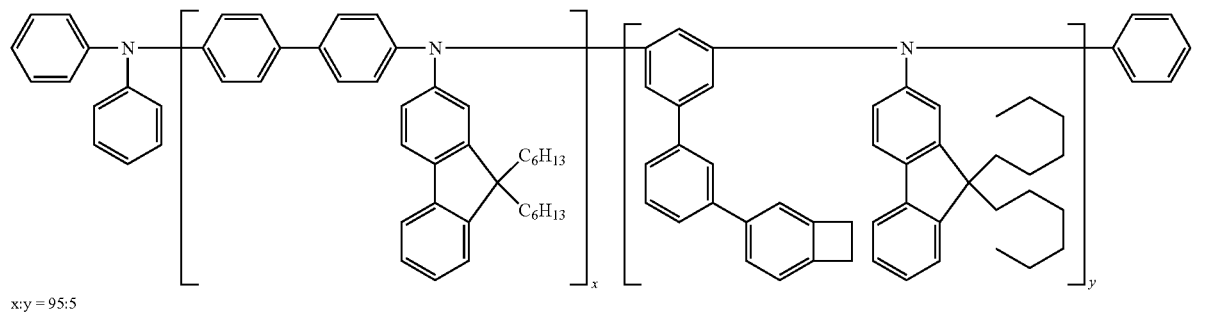

(HI-4)

x:y = 95:5

First, 100 parts by mass of a charge-transporting polymer compound having the following structural formula (HI-3) and 20 parts by mass of an electron-accepting compound having the structure (B-18) were blended and dissolved in butyl benzoate to prepare a 2.0 wt % solution.

The solution was applied on the substrate prepared in the same manner as in Example 2 by spin coating in the air and dried in a clean oven at 220° C. for 30 minutes in the air to form an even thin film having a thickness of 30 nm, which was taken as a hole injection layer.

Then, a hole-transporting layer was formed in the same manner as in Example 5.

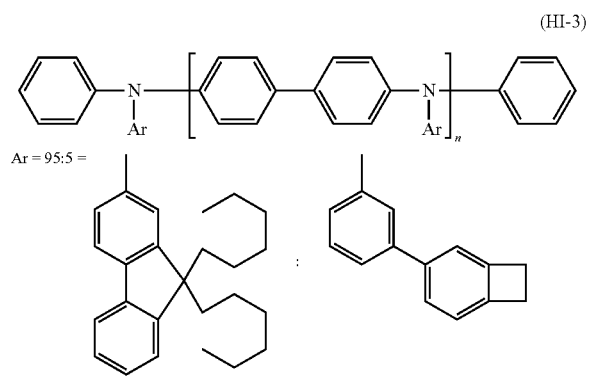

(HI-3)

Ar = 95:5 =

Subsequently, a luminescent layer was formed in the same manner as in Example 5 except that the solution concentration was changed to 3.0 wt %.

Further, a hole-blocking layer, an electron-transporting layer, and a cathode were formed in the same manner as in Example 2 to obtain an organic electroluminescent element which had a light-emitting area portion with a size of 2 mm×2 mm.

Example 10

An organic electroluminescent element was produced in the same manner as in Example 9 except that the electron-accepting compound of the hole injection layer was changed from (B-18) to (B-20) and the charge-transporting polymer compound was changed from (HI-3) to the following structural formula (HI-4).

Example 11

An organic electroluminescent element was produced in the same manner as in Example 9 except that the electron-accepting compound of the hole injection layer was changed from (B-18) to (B-20).

Example 12

An organic electroluminescent element was produced in the same manner as in Example 9 except that the charge-transporting polymer compound of the hole injection layer was changed from (HI-3) to (HI-4).

The current efficiency (cd/A) when the obtained organic electroluminescent elements of Examples 9 to 12 were made emit light at 1,000 $cd/m^2$ were measured, and the period (h) required for the luminance to decrease a value of 70% of the initial luminance at the time of operation at a constant current of 20 $mA/cm^2$ was measured as working life. With regard to the current efficiency and the working life, relative values where the values of Example 12 were taken as 100 were described as relative current efficiency and relative working life, respectively, in the following Table 7.

Reference Example

As model compounds having a crosslinkable group of the formula (7) or (8), the following compounds (MC-1) and (MC-2) were synthesized as described in WO2015/133437.

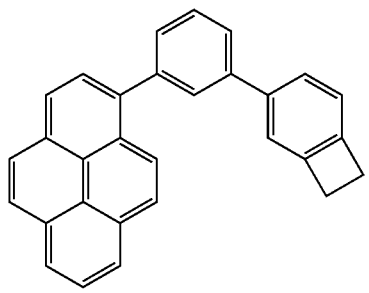

(MC-1)

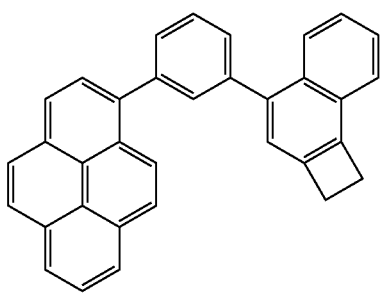

(MC-2)

These compounds were subjected to differential scanning calorimetry (DSC) of the compound 1 using DSC-50 manufactured by Shimadzu Corporation to determine crosslinking starting temperature. As a result, the crosslinking starting temperature of the crosslinkable group possessed by the compound (MC-1) was 202° C. and the crosslinking starting temperature of the crosslinkable group possessed by the compound (MC-2) was 225° C.

The charge-transporting polymer compounds and electron-accepting compounds of the hole injection layers of Examples 9 to 12 all have a crosslinkable group, which is a crosslinkable group represented by the above formula (7) or a crosslinkable group represented by the above formula (8). The crosslinking starting temperature of the crosslinkable group represented by the above formula (7) was 225° C. and the crosslinking starting temperature of the crosslinkable group represented by the above formula (8) was 202° C. Table 7 also showed crosslinkable groups which the charge-transporting polymer compounds and electron-accepting compounds of the hole injection layers of Examples 9 to 12 had. From the results shown in Table 7, as compared with Examples 11 and 12 where the crosslinkable groups possessed by the charge-transporting polymer compounds and electron-accepting compounds of the hole injection layers are the same, that is, the crosslinking starting temperature is the same, it is found that Examples 9 and 10 where the crosslinkable groups possessed by the charge-transporting polymer compounds and electron-accepting compounds of the hole injection layers are different from each other and the crosslinking starting temperature is different show good current efficiency and working life. Furthermore, it is found that Example 9 where the crosslinking starting temperature of the crosslinkable group of the electron-accepting compound is higher than the crosslinking starting temperature of the crosslinkable group of the charge-transporting polymer compound shows good properties as compared with Example 10 having a reverse relation thereof.

TABLE 7

|  | Crosslinkable group of charge-transporting high polymer compound | Crosslinkable group of electron-accepting compound | Relative current efficiency | Relative working life |
| --- | --- | --- | --- | --- |
| Example 9 | Formula (8) | Formula (7) | 213 | 181 |
| Example 10 | Formula (7) | Formula (8) | 149 | 172 |
| Example 11 | Formula (8) | Formula (8) | 89 | 109 |
| Example 12 | Formula (7) | Formula (7) | 100 | 100 |

Example 13

An organic electroluminescent element having the same layer configuration as that of the organic electroluminescent element 100c shown in FIG. 1C was produced by the following method.

First, a hole injection layer was formed in the same manner as in Example 7 on a substrate which had undergone the ITO patterning prepared in the same manner as in Example 1.

Then, a charge-transporting polymer compound having the following structural formula (HT-3) was dissolved in cyclohexylbenzene to prepare a 1.5 wt % solution.

The solution was applied by spin coating in the air on the above substrate, on which the hole injection layer had been applied to form a film, and dried in a clean oven at 230° C. for 60 minutes in the air to form an even thin film having a thickness of 20 nm, which was taken as a hole-transporting layer.

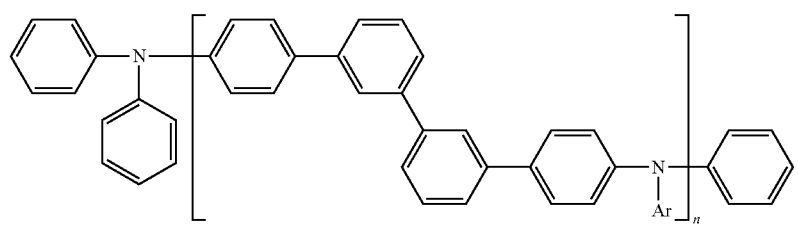

(HT-3)

Ar = 94:6 =

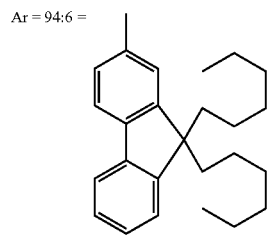 : 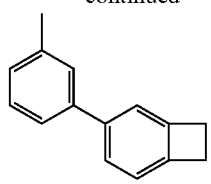

Subsequently, a luminescent layer was formed in the same manner as in Example 2.

Further, a hole-blocking layer, an electron-transporting layer, and a cathode were formed in the same manner as in Example 2 to obtain an organic electroluminescent element which had a light-emitting area portion with a size of 2 mm×2 mm.

Example 14

An organic electroluminescent element was produced in the same manner as in Example 13 except that the hole-transporting layer was not formed and the luminescent layer was directly formed on the hole injection layer.

Example 15

An organic electroluminescent element was produced in the same manner as in Example 13 except that the electron-accepting compound of the hole injection layer was changed from (B-20) to (B-19).

Example 16

An organic electroluminescent element was produced in the same manner as in Example 15 except that the hole-transporting layer was not formed and the luminescent layer was directly formed on the hole injection layer.

The voltage (V) when the organic electroluminescent elements obtained in Examples 13 and 14 were made emit light at a luminance of 1,000 cd/m$^2$ was measured, and the period (h) required for the luminance to decrease to a value of 75% of the initial luminance at the time of operation at a constant current of 15 mA/cm$^2$ was measured as working life. With regard to the voltage, the voltage (V) obtained by subtracting the value of Example 13 was described as relative voltage (V) and with regard to the working life, a relative value where the value of Example 13 was taken as 100 was described as relative working life, in the following Table 8. With regard to Examples 15 and 16, the relative voltage and relative working life were calculated in the same manner as in Examples 13 and 14, respectively, and were described in Table 8. As shown in the results of Table 8, in the case where the electron-accepting compound of the invention was used, it was found that operation at lower voltage became possible and the working life was improved in the case where the hole-transporting layer was not disposed as compared with the case where the hole-transporting layer was disposed.

TABLE 8

| | Electron-accepting compound | Presence of hole-transporting layer | Relative voltage (V) | Relative working life |
|---|---|---|---|---|
| Example 13 | B-20 | present | 0.0 | 100 |
| Example 14 | B-20 | absent | −0.7 | 112 |
| Example 15 | B-19 | present | 0.0 | 100 |
| Example 16 | B-19 | absent | −0.6 | 213 |

INDUSTRIAL APPLICABILITY

Since the composition for a charge-transporting film of the present invention contains an electron-accepting compound having high heat resistance and thermally stable free carriers generated by electron transfer to the electron-accepting compound, the composition has high heat resistance and also excellent in charge-transporting properties (hole injection-transport properties). Accordingly, it can suitably used in various uses such as an organic electroluminescent element, an electrophotographic photoreceptor, a photoelectric conversion element, an organic solar cell, and an organic rectifying element.

Moreover, the organic electroluminescent element of the invention contains the aforementioned charge-transporting ion compound in a layer present between the anode and the cathode or the luminescent layer. Thereby, excellent heat resistance is exhibited and also operation at lower voltage becomes possible. Accordingly, there are considered applications to flat panel displays (e.g., displays for OA computers, and wall-mounting TVs), light sources which take advantage of the feature of a surface light emitter (e.g., the light sources of copiers and the backlights of liquid-crystal displays or instruments), display boards, and marker lamps, and particularly, a technical value thereof is high as a display element for vehicles for which high heat resistance is required.

While the invention has been described in detail and with reference to specific embodiments thereof, it will be apparent to one skilled in the art that various changes and modifications can be made therein without departing from the spirit and scope thereof. The present application is based on Japanese Patent Application No. 2016-060764 filed on Mar. 24, 2016, and the contents are incorporated herein by reference.

DESCRIPTION OF REFERENCE NUMERALS AND SIGNS 100a, 100b, 100c Organic electroluminescent element
101 Substrate
102 Anode
103 Hole injection layer
104 Hole-transporting layer 105 Luminescent layer
106 Electron-transporting layer
107 Cathode
108 Hole-blocking layer

The invention claimed is:
1. An electron-accepting compound having a structure of the following formula (1):

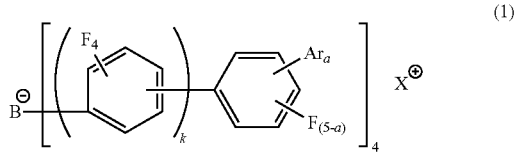

wherein
Ar is each independently a substituted or unsubstituted aromatic ring group or a fluorine-substituted alkyl group, wherein at least one Ar is represented by the following formula (3):

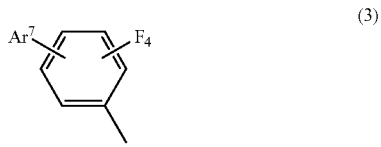

wherein $Ar^7$ is a substituent and $F_4$ represents a substitution with four fluorine atoms,
$F_4$ represents a substitution with four fluorine atoms,
$F_{(5-a)}$ represents a substitution with (5-a) fluorine atom(s),
k each independently represents an integer of 0 to 5,
a each independently represents an integer of 0 to 5,
k+a is 1 to 10, and
$X^+$ represents a counter cation having a structure of the following formula (2):

wherein $Ar^5$ and $Ar^6$ are each independently an aromatic ring group which may have a substituent,
wherein $X^+$ does not represent octyloxy diphenyl iodonium.
2. The electron-accepting compound according to claim 1, wherein k is 0, a is 1.
3. The electron-accepting compound according to claim 1, wherein $Ar^7$ is represented by the following formula (4)

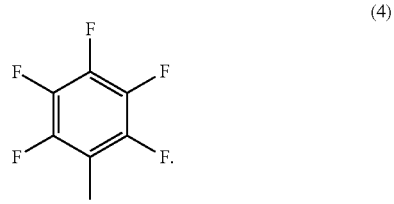

4. The electron-accepting compound according to claim 1, wherein the formula (2) is represented by the following formula (5):

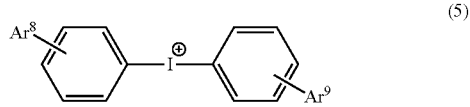

wherein $Ar^8$ and $Ar^9$ represent a substituent.
5. The electron-accepting compound according to claim 1, wherein at least one Ar has a crosslinkable group.
6. A composition suitable for a charge-transporting film, comprising the electron-accepting compound according to claim 1 and a hole-transporting compound.
7. The composition according to claim 6, wherein the hole-transporting compound is an aromatic tertiary amine compound.
8. The composition according to claim 6, which further comprises a solvent.
9. The composition according to claim 8, wherein the solvent contains at least one solvent selected from the group consisting of an ether-based solvent and an ester-based solvent.
10. The composition according to claim 6, which is used for a hole injection layer of an organic electroluminescent element.
11. An organic electroluminescent element comprising a hole injection layer and a luminescent layer between an anode and a cathode and emitting light by electric energy, wherein the hole injection layer is a layer formed by applying and drying the composition for a charge-transporting film according to claim 6 to form a film.
12. A display using the organic electroluminescent element according to claim 11.
13. A lighting device using the organic electroluminescent element according to claim 11.
14. A light-emitting device using the organic electroluminescent element according to claim 11.
15. A method for manufacturing an organic electroluminescent element comprising a hole injection layer and a luminescent layer between an anode and a cathode and that emits light by electric energy, the method comprising applying the composition of claim 8 to a substrate and drying the composition to form the hole injection layer.
16. An electron-accepting compound having a crosslinkable group, comprising the compound of claim 1.
17. The electron-accepting compound according to claim 16, wherein k is 0, a is 1.
18. The electron-accepting compound according to claim 16, wherein $Ar^7$ is represented by the following formula (4)

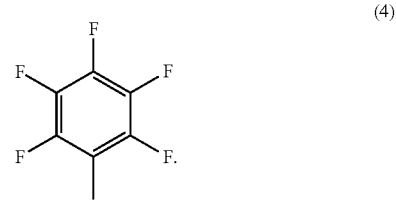

19. The electron-accepting compound according to claim 16, wherein the formula (2) is represented by the following formula (5):

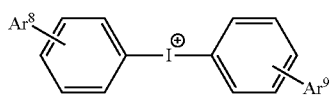
(5)

wherein Ar⁸ and Ar⁹ represent a substituent.

20. The electron-accepting compound according to claim 16, wherein at least one Ar of the formula (1) has a crosslinkable group selected from the crosslinking groups represented by the following formulae (Z-1) to (Z-7):

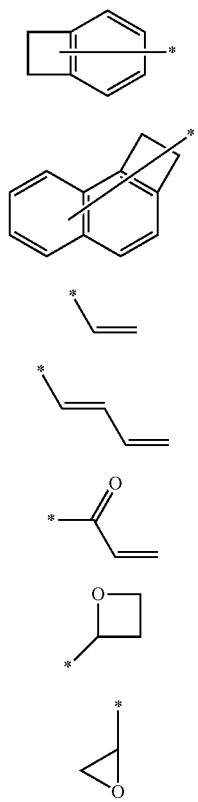

wherein * represents a bonding point and wherein the formulae (Z-1) to (Z-7) optionally further comprises a cyclic/non-cyclic aliphatic group-derived groups having 30 or less carbon atoms, an aryl groups having 30 or less carbon atoms, an alkyloxy group having 30 or less carbon atoms, or an aralkyl group having 30 or less carbon atoms.

21. The electron-accepting compound according to claim 16, wherein at least one Ar of the formula (1) has a crosslinkable group selected from the crosslinking groups represented by the following formulae (7) and (8):

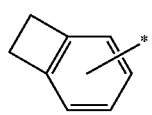
(7)

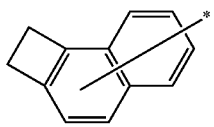
(8)

wherein * represents a bonding point and wherein the formulae (7) and (8) optionally further comprise a substituent selected from the group consisting of a hydrogen atom, a halogen atom, a cyano group, an aromatic ring group having 1 to 5 aromatic rings, a hydrocarbon ring group, an alkyl group, an alkenyl group, an alkynyl group, an aralkyl group, an alkyloxy group, an aryloxy group, an alkylthio group, an arylthio group, an alkyl ketone group, and an aryl ketone group and adjacent substituents may be combined to form a ring, and the aromatic ring group having 1 to 5 aromatic rings, the hydrocarbon ring group, the alkyl group, the alkenyl group, the alkynyl group, the aralkyl group, the alkyloxy group, the aryloxy group, the alkylthio group, the arylthio group, the alkyl ketone group, or the aryl ketone group optionally further comprise a substituent selected from the group consisting of a halogen atom, an alkyl group, and an aryl group.

22. A composition for a charge-transporting film, comprising the electron-accepting compound according to claim 16 and a hole-transporting compound.

23. The composition for a charge-transporting film according to claim 22, wherein the hole-transporting compound is an aromatic tertiary amine compound.

24. The composition for charge-transporting according to claim 22, wherein the hole-transporting compound has a crosslinkable group.

25. The composition for a charge-transporting film according to claim 22, which further comprises a solvent.

26. The composition for a charge-transporting film according to claim 25, wherein the solvent contains at least one solvent selected from the group consisting of an ether-based solvent and an ester-based solvent.

27. A method for forming a charge-transporting film, the method comprising applying a composition comprising the compound according to claim 25 to a substrate and drying the composition to form the charge-transporting film.

28. The method according to claim 27, wherein the composition further comprises a charge-transporting compound, the charge-transporting compound is a charge-transporting polymer compound and has a crosslinkable group.

29. The method according to claim 28, wherein a crosslinking starting temperature of the crosslinkable group of the hole-transporting polymer compound is different from a crosslinking starting temperature of the crosslinkable group of the electron-accepting compound, where the higher crosslinking starting temperature is TH(° C.), the lower crosslinking starting temperature is TL(° C.), and a temperature at the time of the heating is TB(° C.) such that the following relationships are satisfied: TH-TL≥10 and TL<TB.

30. A method for manufacturing an organic electroluminescent element comprising a hole injection layer and a luminescent layer between an anode and a cathode and that emits light by electric energy, the method comprising applying a composition comprising the compound according to claim 25 to a substrate and drying the composition to form the hole injection layer.

31. An organic electroluminescent element comprising a hole injection layer and a luminescent layer between an anode and a cathode and emitting light by electric energy, wherein the hole injection layer is a layer formed by applying and drying a composition comprising the compound according to claim 25 to form a film.

32. The composition for a charge-transporting film according to claim 22, which is used for a hole injection layer of an organic electroluminescent element.

33. A charge-transporting ion compound comprising a counter anion and a cation radical of a charge-transporting compound, wherein the counter anion is represented by the following formula (6):

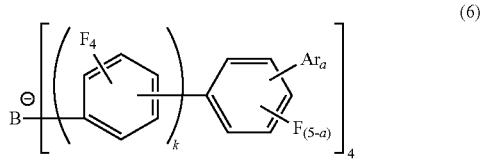

(6)

wherein
Ar is each independently a substituted or unsubstituted aromatic ring group or a fluorine-substituted alkyl group,
$F_4$ represents a substitution with four fluorine atoms,
$F_{(5-a)}$ represents a substitution with (5-a) fluorine atom(s),
k each independently represents an integer of 0 to 5,
a each independently represents an integer of 0 to 5,
k+a is 1 to 10,
wherein the cation radical of the hole-transporting compound is a cation radical of an aromatic tertiary amine compound.

34. The charge-transporting ion compound according to claim 33, wherein k is 0, a is 1, and Ar is each independently a substituted or unsubstituted aromatic ring group.

35. The charge-transporting ion compound according to claim 33, wherein Ar is a substituted aromatic ring group that has four or more fluorine atoms.

36. The charge-transporting ion compound according to claim 33, wherein at least one Ar is represented by the following formula (3):

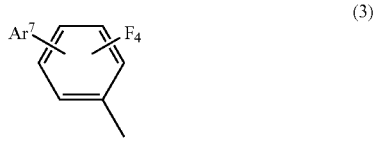

(3)

wherein $Ar^7$ is a substituent and $F_4$ represents a substitution with four fluorine atoms.

37. The charge-transporting ion compound according to claim 36, wherein $Ar^7$ is represented by the following formula (4):

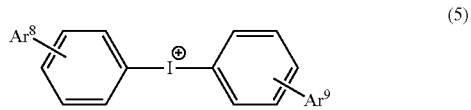

(5)

38. The charge-transporting ion compound according to claim 33, wherein at least one Ar has a crosslinkable group.

39. The charge-transporting ion compound according to claim 33, wherein the hole transporting compound is a polymer compound.

40. The charge-transporting ion compound according to claim 33, wherein the cation radical of the hole-transporting compound is an aromatic tertiary amine compound having a partial structure represented by the following formula (10):

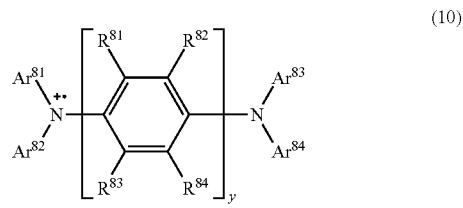

(10)

wherein
y represents an integer of 1 to 5,
$Ar^{81}$ to $Ar^{84}$ each independently represents a substituted or unsubstituted aromatic hydrocarbon group or a substituted or unsubstituted aromatic heterocyclic group, and $R^{81}$ to $R^{84}$ each represent a substituent.

41. A composition suitable for a charge-transporting film, comprising the charge-transporting ion compound according to claim 33 and a solvent.

42. The composition according to claim 41, wherein the solvent contains at least one solvent selected from the group consisting of an ether-based solvent and an ester-based solvent.

43. The composition according to claim 42, which further comprises an aromatic hydrocarbon-based solvent.

44. A method for preparing the charge-transporting ion compound according to claim 33, the method comprising
dissolving an electron-accepting compound having a structure of the following formula (1) and the hole-transporting compound in a solvent, followed by mixing:
wherein

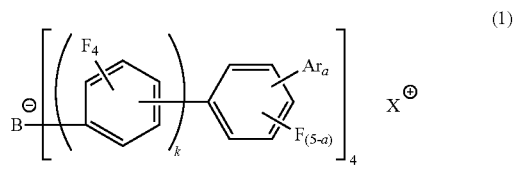

(1)

Ar is each independently a substituted or unsubstituted aromatic ring group or a fluorine-substituted alkyl group,
$F_4$ represents a substitution with four fluorine atoms,
$F_{(5-a)}$ represents a substitution with (5-a) fluorine atom(s),
k each independently represents an integer of 0 to 5,
a each independently represents an integer of 0 to 5,
k+a is 1 to 10, and
X+ represents a counter cation having a structure of the following formula (2):

(2)

wherein $Ar^5$ and $Ar^6$ are each independently a substituted or unsubstituted aromatic ring group.

45. The method according to claim 44, further comprising heating a solution in which the electron-accepting compound and the hole-transporting compound are dissolved in a solvent.

46. A method for preparing the charge-transporting ion compound according to claim 33, comprising
heating a mixture of an electron-accepting compound having a structure of the following formula (1) and the hole-transporting compound:

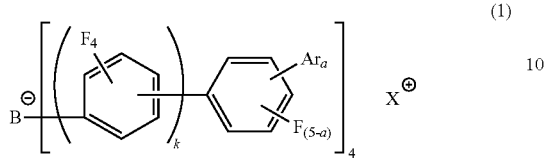

wherein
Ar is each independently a substituted or unsubstituted aromatic ring group or a fluorine-substituted alkyl group,
$F_4$ represents a substitution with four fluorine atoms,
$F_{(5-a)}$ represents a substitution with (5-a) fluorine atom(s),
k each independently represents an integer of 0 to 5,
a each independently represents an integer of 0 to 5,
k+a is 1 to 10, and
$X^+$ represents a counter cation having a structure of the following formula (2):

wherein $Ar^5$ and $Ar^6$ are each independently a substituted or unsubstituted aromatic ring group.

47. The method according to claim 46, wherein the mixture is a film formed by applying a solution obtained by dissolving the mixture of the electron-accepting compound and the hole-transporting compound in a solvent.

48. A charge-transporting film, comprising the charge-transporting ion compound according to claim 33.

49. An organic electroluminescent element comprising a hole injection layer and a luminescent layer between an anode and a cathode and emitting light by electric energy, wherein the hole injection layer contains the charge-transporting ion compound according to claim 33.

50. A display device, comprising the organic electroluminescent element according to claim 49.

51. A lighting device, comprising the organic electroluminescent element according to claim 49.

52. A light-emitting device, comprising the organic electroluminescent element according to claim 49.

53. A method for forming a charge-transporting film, the method comprising heating the composition according to claim 33, forming a film and drying the film.

54. A method for manufacturing an organic electroluminescent element comprising a hole injection layer and a luminescent layer between an anode and a cathode and emitting light by electric energy, the method comprising applying a composition comprising the composition according to claim 33 to a substrate as a wet film and drying the wet film to form the hole injection layer.

55. The composition according to claim 33, wherein at least one Ar of the formula has a crosslinkable group selected from the crosslinking groups represented by the following formulae (Z-1) to (Z-7):

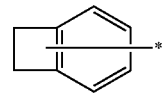

Z-1

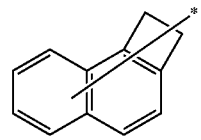

Z-2

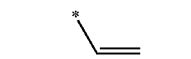

Z-3

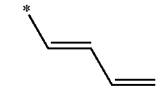

Z-4

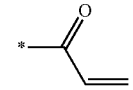

Z-5

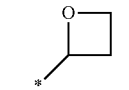

Z-6

Z-7 wherein * represents a bonding point and wherein the formulae (Z-1) to (Z-7) optionally further comprises a cyclic/non-cyclic aliphatic group-derived groups having 30 or less carbon atoms, an aryl groups having 30 or less carbon atoms, an alkyloxy group having 30 or less carbon atoms, or an aralkyl group having 30 or less carbon atoms.

56. The composition according to claim 33, wherein at least one Ar has a crosslinkable group selected from the crosslinking groups represented by the following formulae (7) and (8):

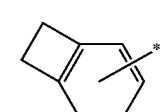

(7)

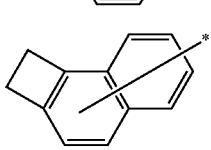

(8)

wherein * represents a bonding point and wherein the formulae (7) and (8) optionally further comprise a substituent selected from the group consisting of a hydrogen atom, a halogen atom, a cyano group, an aromatic ring group having 1 to 5 aromatic rings, a hydrocarbon ring group, an alkyl group, an alkenyl group, an alkynyl group, an aralkyl group, an alkyloxy group, an aryloxy group, an alkylthio group, an arylthio group, an alkyl ketone group, and an aryl ketone group and adjacent substituents may be combined to form a ring, and the aromatic ring group having 1 to 5 aromatic rings, the hydrocarbon ring group, the alkyl group, the alkenyl group, the alkynyl group, the aralkyl group, the alkyloxy group, the aryloxy group, the alkylthio group, the arylthio group, the alkyl ketone group, or the aryl ketone group optionally further comprise a substituent selected from the group consisting of a halogen atom, an alkyl group, and an aryl group.

* * * * *